(12) United States Patent
Araya et al.

(10) Patent No.: US 10,839,917 B2
(45) Date of Patent: Nov. 17, 2020

(54) MEMORY DEVICE

(71) Applicant: Toshiba Memory Corporation, Minato-ku (JP)

(72) Inventors: Tomoko Araya, Fujisawa (JP); Mitsuaki Honma, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 56 days.

(21) Appl. No.: 16/352,094

(22) Filed: Mar. 13, 2019

(65) Prior Publication Data

US 2019/0214096 A1 Jul. 11, 2019

Related U.S. Application Data

(63) Continuation of application No. PCT/JP2016/078045, filed on Sep. 23, 2016.

(51) Int. Cl.
*G11C 16/26* (2006.01)
*G11C 16/04* (2006.01)
*G11C 29/52* (2006.01)
*G06F 11/10* (2006.01)
*G11C 11/56* (2006.01)
(Continued)

(52) U.S. Cl.
CPC .......... *G11C 16/26* (2013.01); *G06F 11/1048* (2013.01); *G06F 11/1068* (2013.01); *G11C 11/5642* (2013.01); *G11C 16/02* (2013.01); *G11C 16/0483* (2013.01); *G11C 16/06* (2013.01); *G11C 29/52* (2013.01)

(58) Field of Classification Search
None
See application file for complete search history.

(56) References Cited

U.S. PATENT DOCUMENTS 7,894,269 B2 2/2011 Li
9,543,031 B2 * 1/2017 Kim .................. G11C 16/28
(Continued)

FOREIGN PATENT DOCUMENTS

JP 2007-184040 7/2007
JP 2010-192049 9/2010
(Continued)

OTHER PUBLICATIONS

International Search Report dated Oct. 18, 2016 in PCT/JP2016/078045, filed on Sep. 23, 2016 (with English Translation).
(Continued)

*Primary Examiner* — Phung M Chung
(74) *Attorney, Agent, or Firm* — Oblon, McClelland, Maier & Neustadt, L.L.P.

(57) ABSTRACT

According to one embodiment, a memory device, includes a first memory cell, and a second memory cell adjacent to the first memory cell; and a sequencer configured to, when data is read from the first memory cell: perform a first read operation on the second memory cell; perform a second read operation on the first memory cell; perform a third read operation on the first memory cell by applying a voltage different from that applied in the second read operation to a gate of the second memory cell; and generate first data stored in the first memory cell and second data for correcting the first data, based on results of the first to third read operations.

16 Claims, 57 Drawing Sheets

(51) Int. Cl.
  *G11C 16/02*  (2006.01)
  *G11C 16/06*  (2006.01)

(56) References Cited

U.S. PATENT DOCUMENTS

| | | | |
|---|---|---|---|
| 10,503,585 B2 * | 12/2019 | Takagiwa | H01L 27/11582 |
| 2007/0159881 A1 | 7/2007 | Sato et al. | |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2010/0208519 A1 | 8/2010 | Shiga et al. | |
| 2010/0214838 A1 | 8/2010 | Hishida et al. | |
| 2011/0231738 A1 | 9/2011 | Horisaki | |
| 2011/0284946 A1 | 11/2011 | Kiyotoshi | |
| 2011/0305089 A1 | 12/2011 | Abe et al. | |
| 2012/0069663 A1 | 3/2012 | Itagaki et al. | |
| 2012/0166913 A1 | 6/2012 | Alrod et al. | |
| 2012/0307557 A1 | 12/2012 | Itagaki | |
| 2013/0080858 A1 | 3/2013 | Lee et al. | |

FOREIGN PATENT DOCUMENTS

| | | |
|---|---|---|
| JP | 2010-539630 | 12/2010 |
| JP | 2011-197957 | 10/2011 |
| JP | 2013-73669 | 4/2013 |

OTHER PUBLICATIONS

Written Opinion dated Oct. 18, 2016 in PCT/JP2016/078045, filed on Sep. 23, 2016.

\* cited by examiner

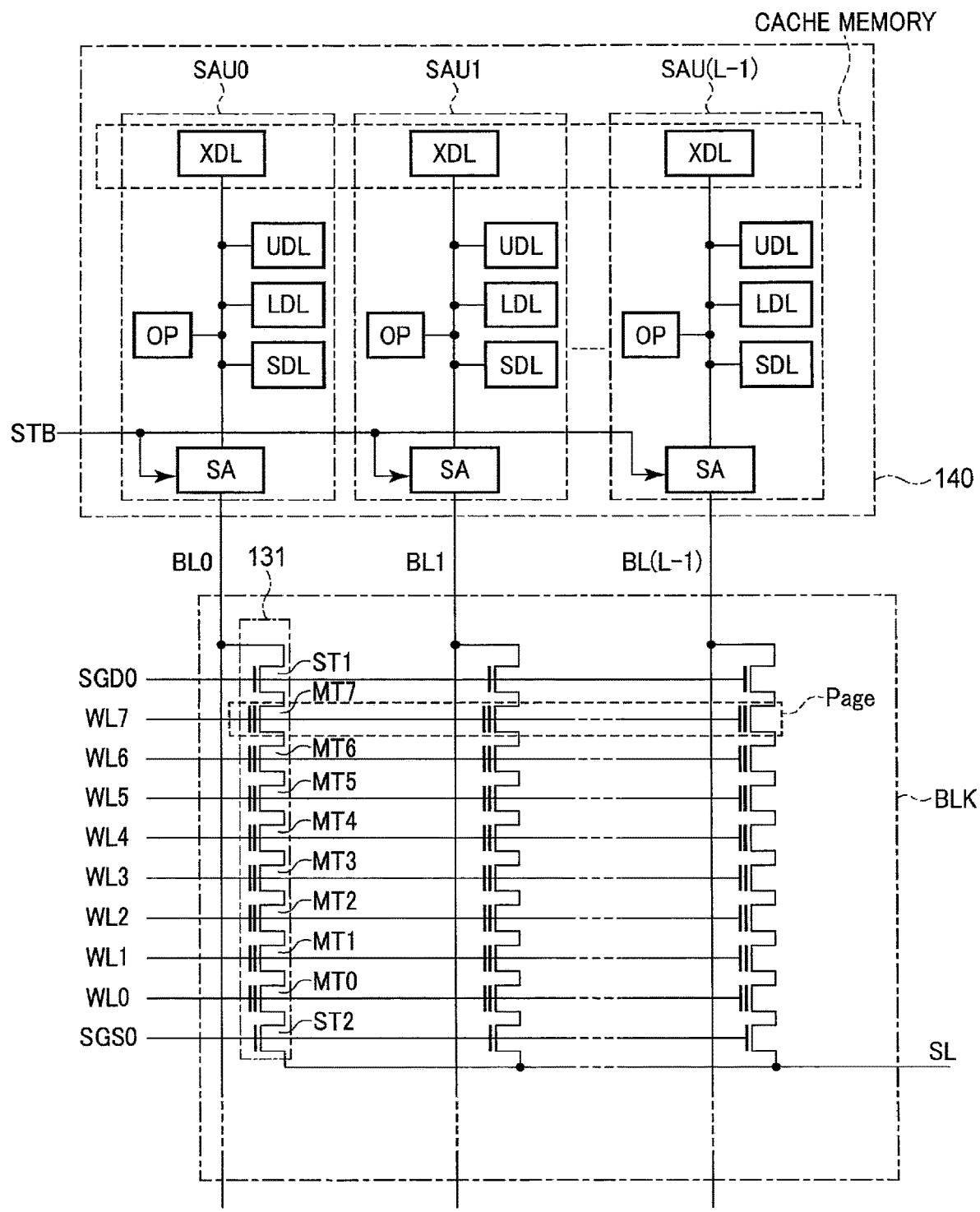
F I G. 3

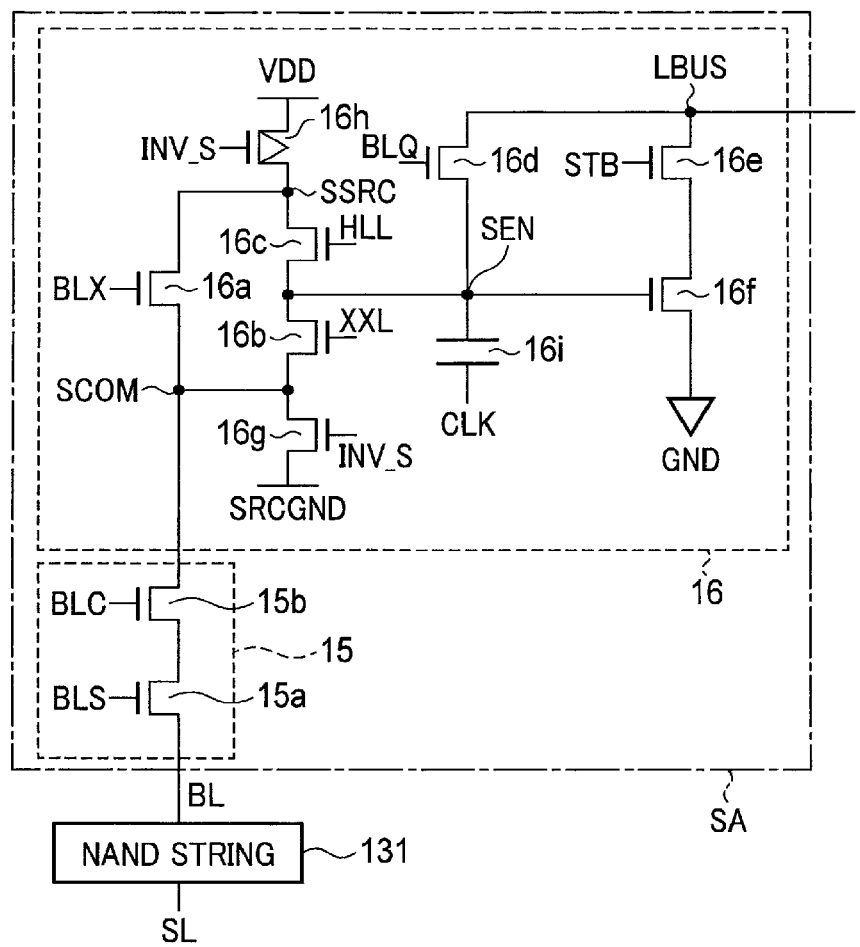
F I G. 4
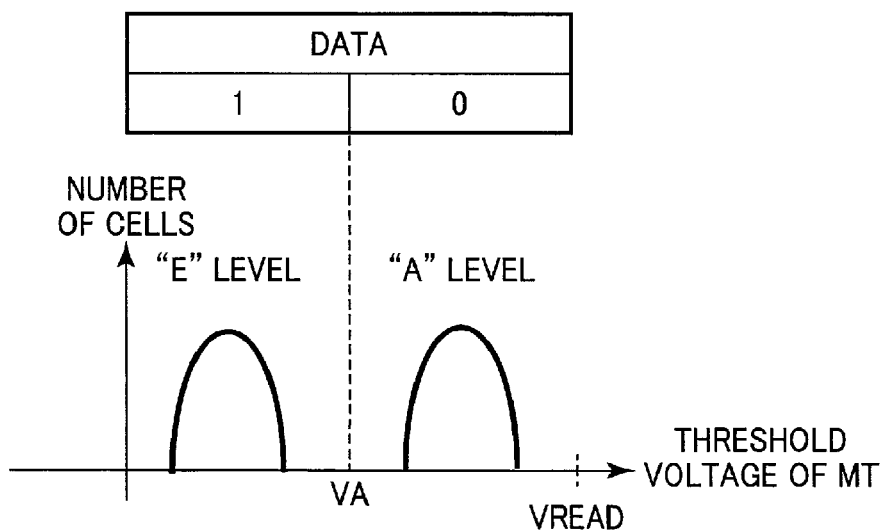
F I G. 5

SECOND READ OPERATION
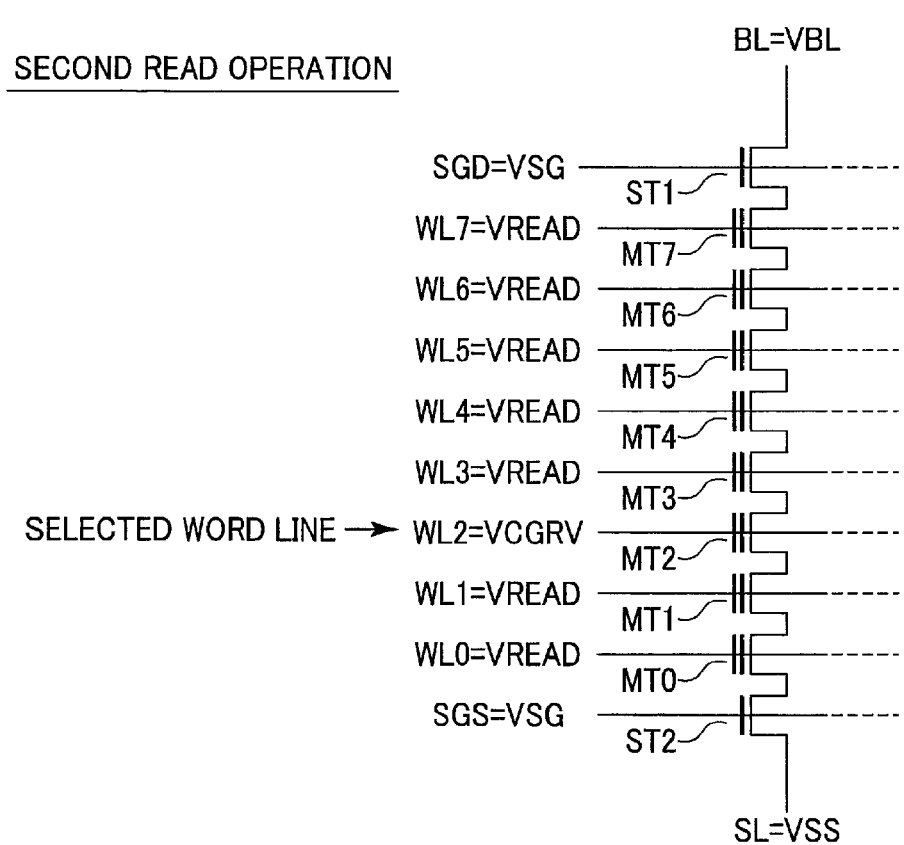
F I G. 11
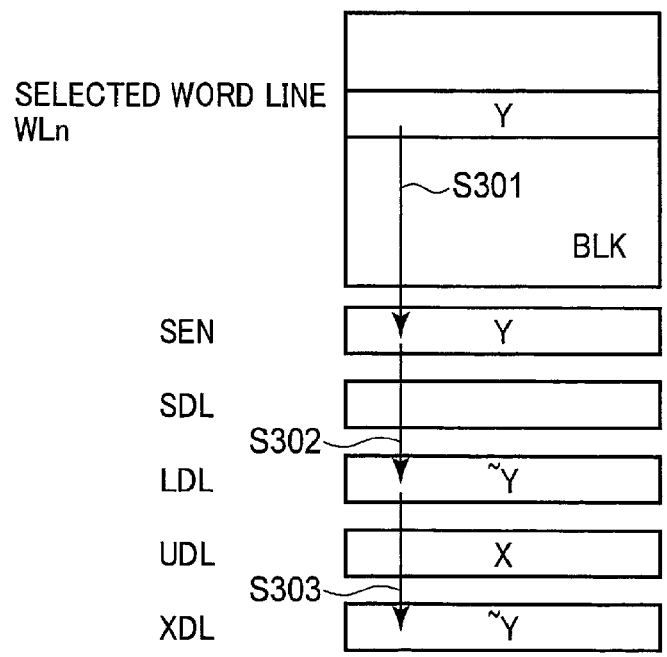
F I G. 12

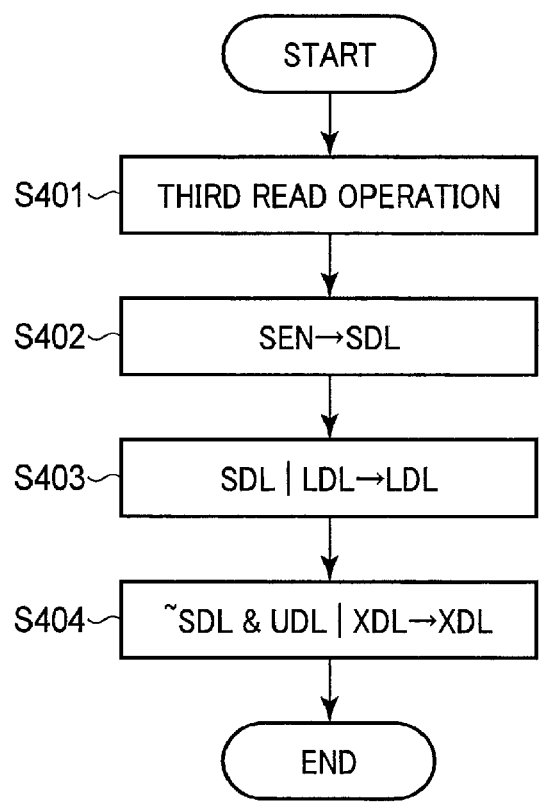
F I G. 13

THIRD READ OPERATION

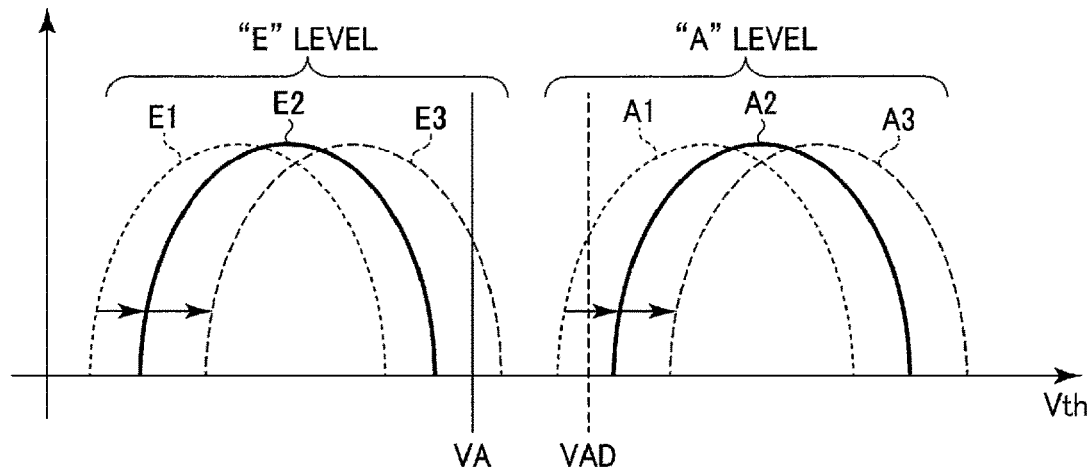
F I G. 18
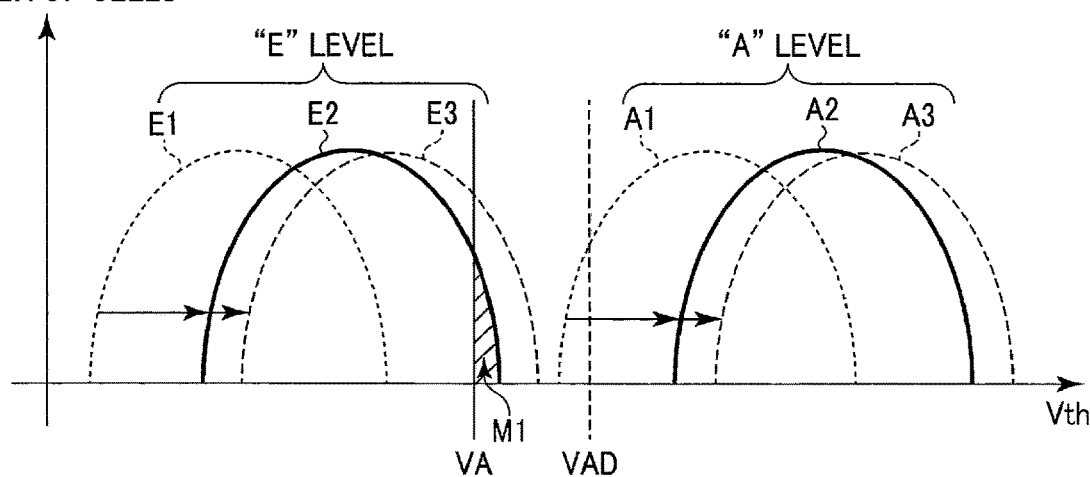
F I G. 19

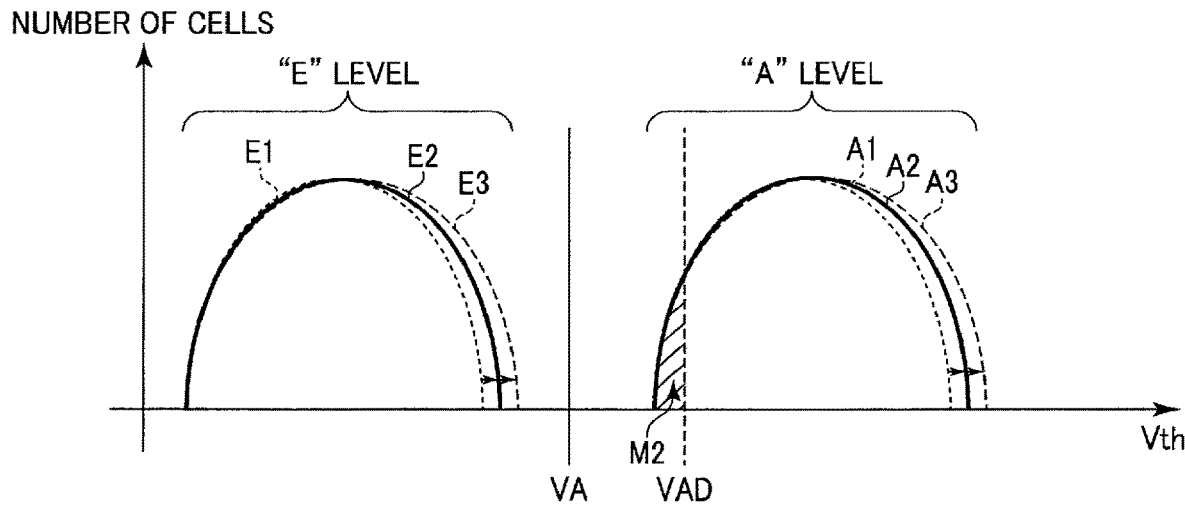
F I G. 20
~SEN→LDL(S302)
| UDL(MTn+1) | E(MTn) | | | | A(MTn) | | | |
|---|---|---|---|---|---|---|---|---|
| | 0(E) | | 1(A) | | 0(E) | | 1(A) | |
| Effect | SMALL | LARGE | SMALL | LARGE | SMALL | LARGE | SMALL | LARGE |
| XDL | − | − | − | − | − | − | − | − |
| LDL | 1 | 0 | 1 | 0 | 0 | 0 | 0 | 0 |
| SDL | 0 | 1 | 0 | 1 | 1 | 1 | 1 | 1 |
| SEN | 0 | 1 | 0 | 1 | 1 | 1 | 1 | 1 |
F I G. 21

LDL→XDL(S303)

| UDL(MTn+1) | E(MTn) | | | | A(MTn) | | | |
|---|---|---|---|---|---|---|---|---|
| | 0(E) | | 1(A) | | 0(E) | | 1(A) | |
| Effect | SMALL | LARGE | SMALL | LARGE | SMALL | LARGE | SMALL | LARGE |
| XDL | 1 | 0 | 1 | 0 | 0 | 0 | 0 | 0 |
| LDL | 1 | (0) | 1 | (0) | 0 | 0 | 0 | 0 |
| SDL | 0 | 1 | 0 | 1 | 1 | 1 | 1 | 1 |
| SEN | 0 | 1 | 0 | 1 | 1 | 1 | 1 | 1 |

F I G. 22

SEN→SDL(S402)

| UDL(MTn+1) | E(MTn) | | | | A(MTn) | | | |
|---|---|---|---|---|---|---|---|---|
| | 0(E) | | 1(A) | | 0(E) | | 1(A) | |
| Effect | SMALL | LARGE | SMALL | LARGE | SMALL | LARGE | SMALL | LARGE |
| XDL | 1 | 0 | 1 | 0 | 0 | 0 | 0 | 0 |
| LDL | 1 | (0) | 1 | (0) | 0 | 0 | 0 | 0 |
| SDL | 0 | 0 | 0 | 0 | (0) | 1 | (0) | 1 |
| SEN | 0 | 0 | 0 | 0 | (0) | 1 | (0) | 1 |

F I G. 23

SDL | LDL→LDL(S403)

| UDL(MTn+1) | E(MTn) | | | | A(MTn) | | | |
|---|---|---|---|---|---|---|---|---|
| | 0(E) | | 1(A) | | 0(E) | | 1(A) | |
| Effect | SMALL | LARGE | SMALL | LARGE | SMALL | LARGE | SMALL | LARGE |
| XDL | 1 | 0 | 1 | 0 | 0 | 0 | 0 | 0 |
| LDL | 1 | (0) | 1 | (0) | (0) | 1 | (0) | 1 |
| SDL | 0 | 0 | 0 | 0 | 0 | 1 | 0 | 1 |
| SEN | 0 | 0 | 0 | 0 | 0 | 1 | 0 | 1 |

M1    M1   M2    M2

F I G. 24

~SDL & UDL | XDL→XDL(S404)

| UDL(MTn+1) | E(MTn) | | | | A(MTn) | | | |
|---|---|---|---|---|---|---|---|---|
| | 0(E) | | 1(A) | | 0(E) | | 1(A) | |
| Effect | SMALL | LARGE | SMALL | LARGE | SMALL | LARGE | SMALL | LARGE |
| XDL | 1 | 0 | 1 | 1 | 0 | 0 | 1 | 0 |
| LDL | 1 | (0) | 1 | (0) | (0) | 1 | (0) | 1 |
| SDL | 0 | 0 | 0 | 0 | 0 | 1 | 0 | 1 |
| SEN | 0 | 0 | 0 | 0 | 0 | 1 | 0 | 1 |

M1    M1   M2    M2

F I G. 25

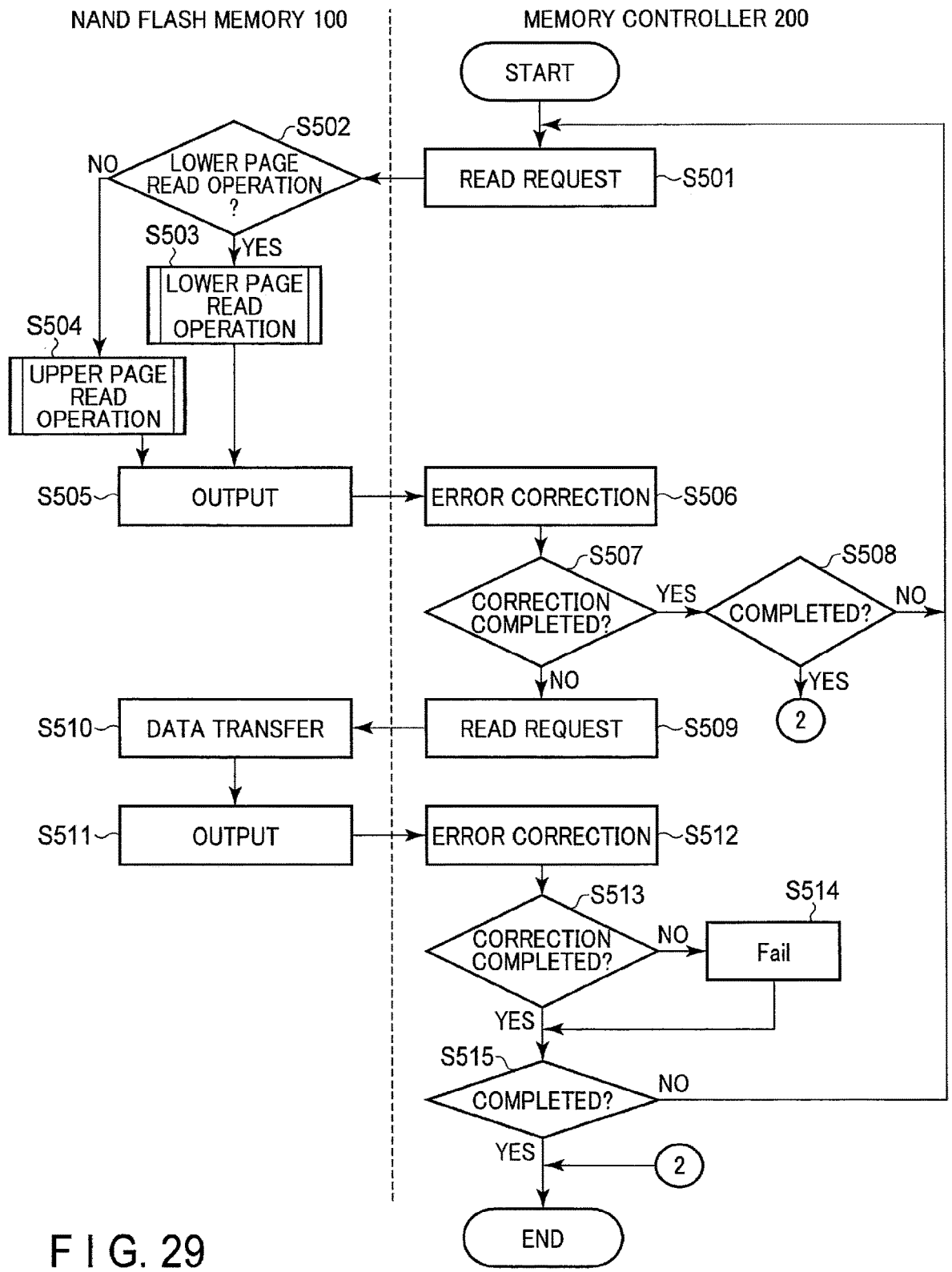
F I G. 29

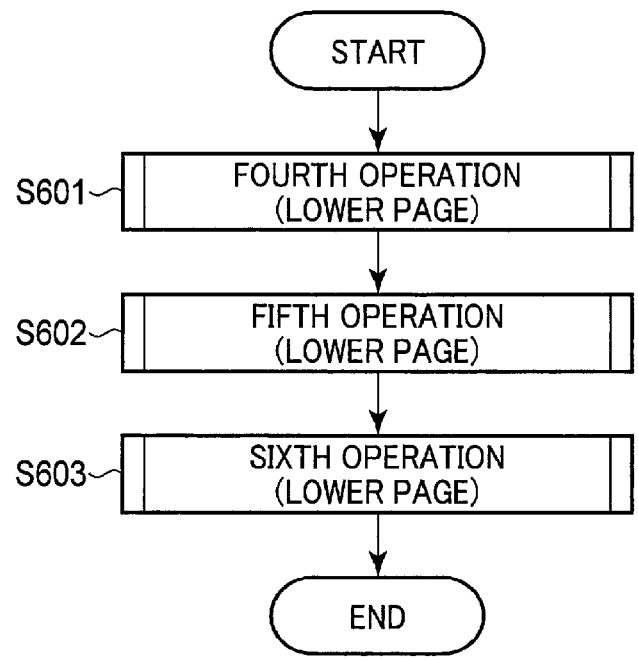
F I G. 30
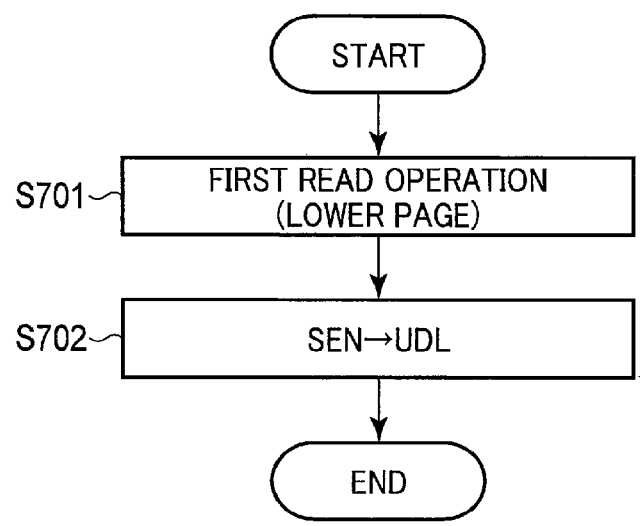
F I G. 31

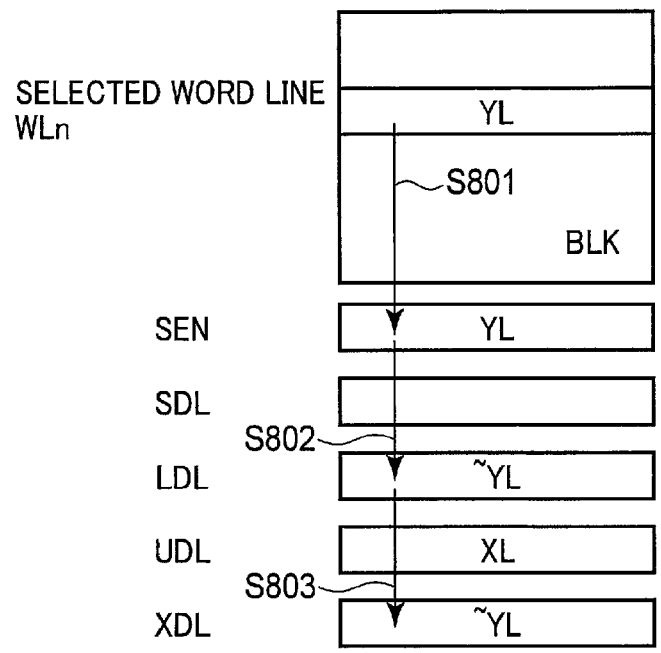
F I G. 34
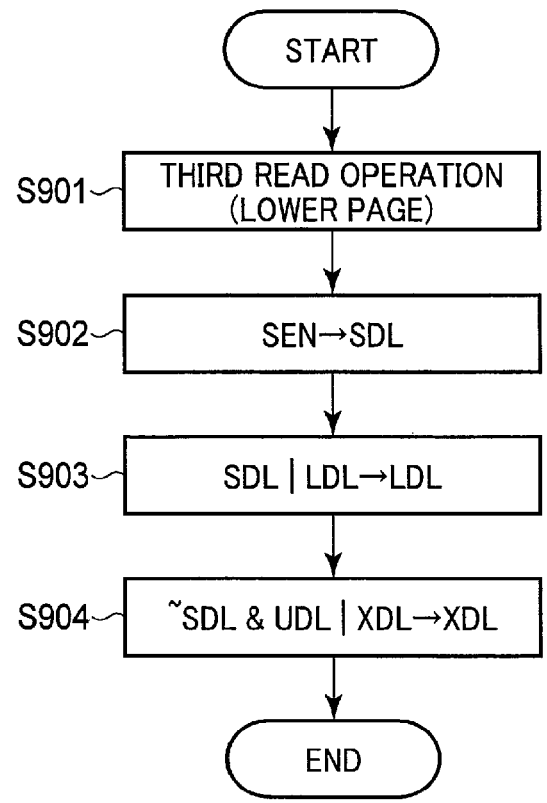
F I G. 35

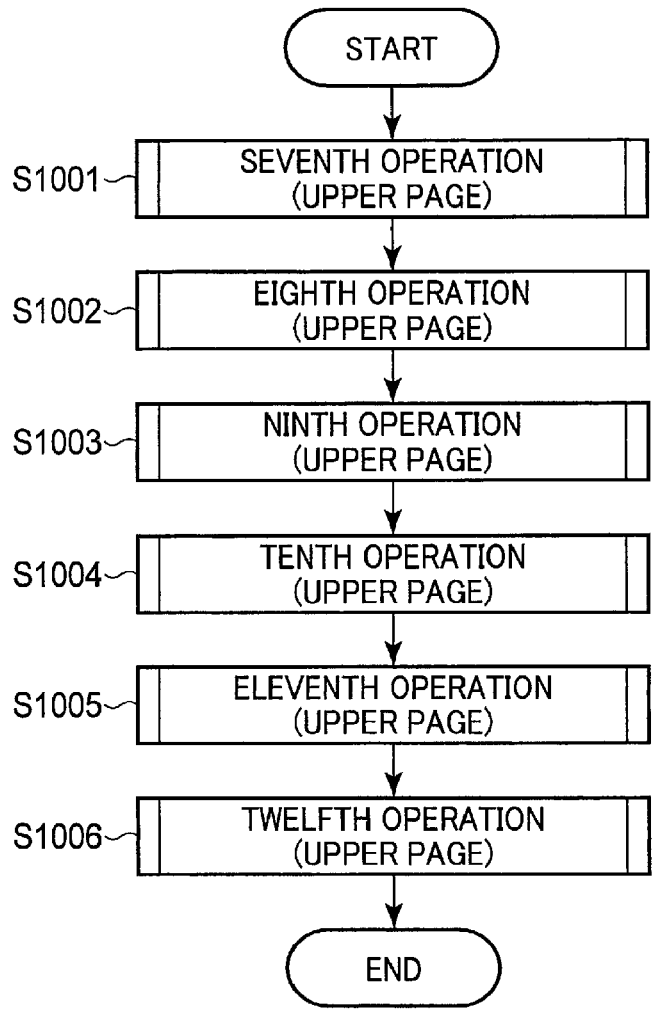
F I G. 39
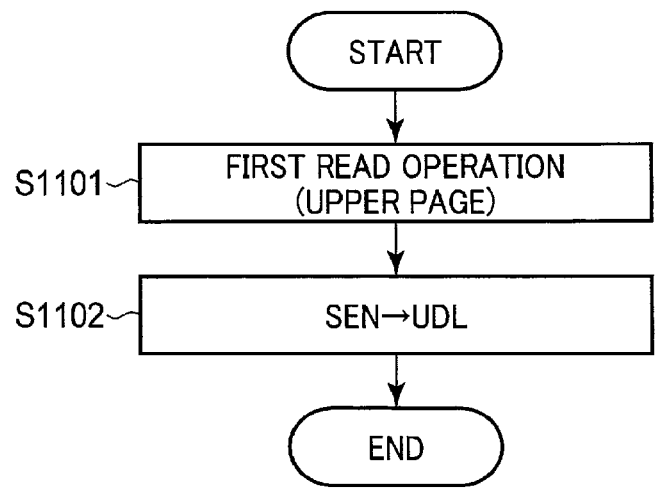
F I G. 40

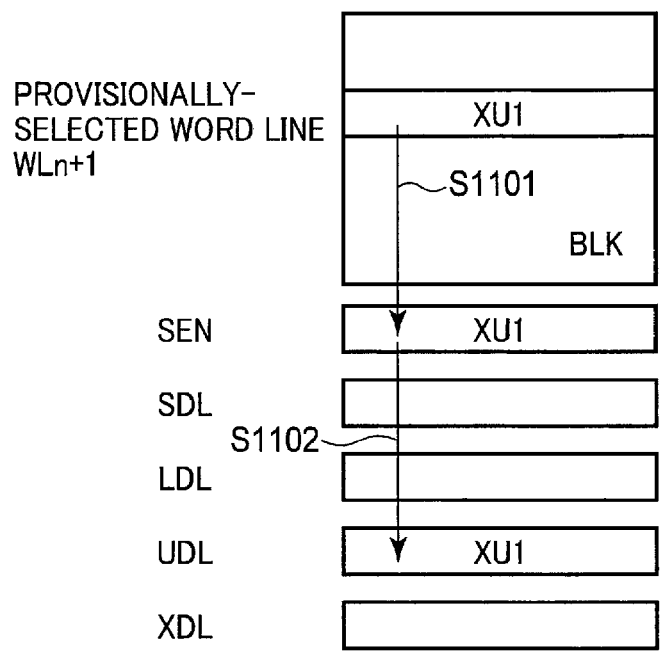
F I G. 41
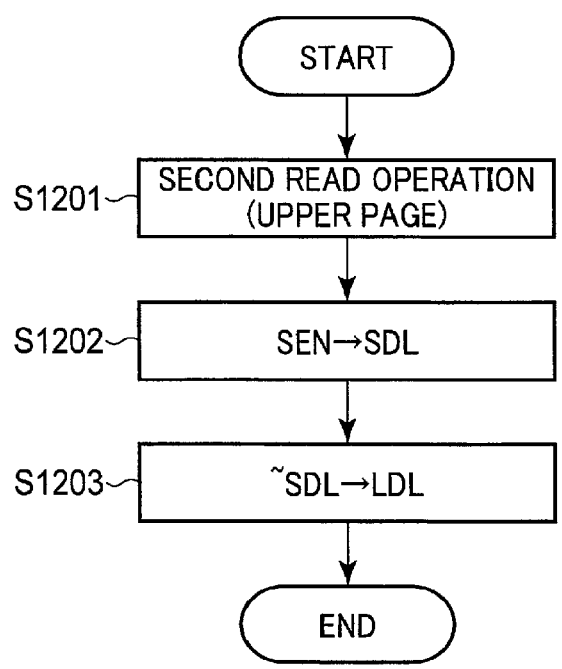
F I G. 42

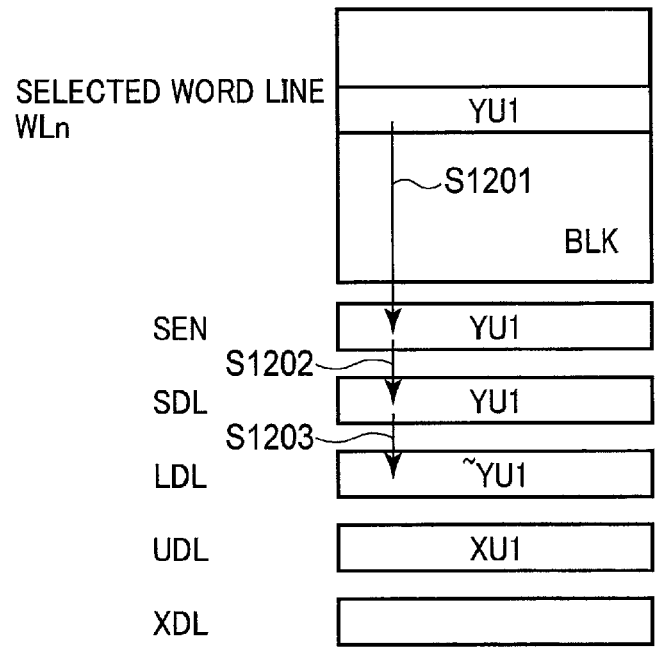
F I G. 43
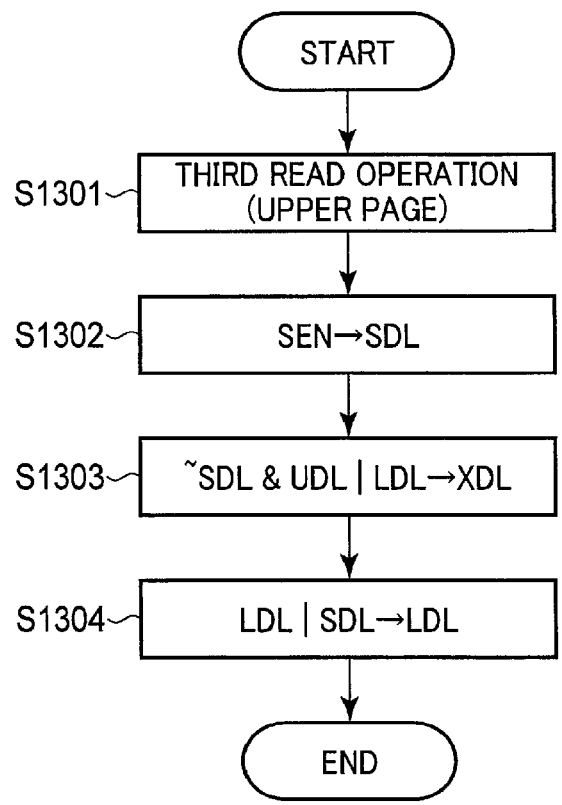
F I G. 44

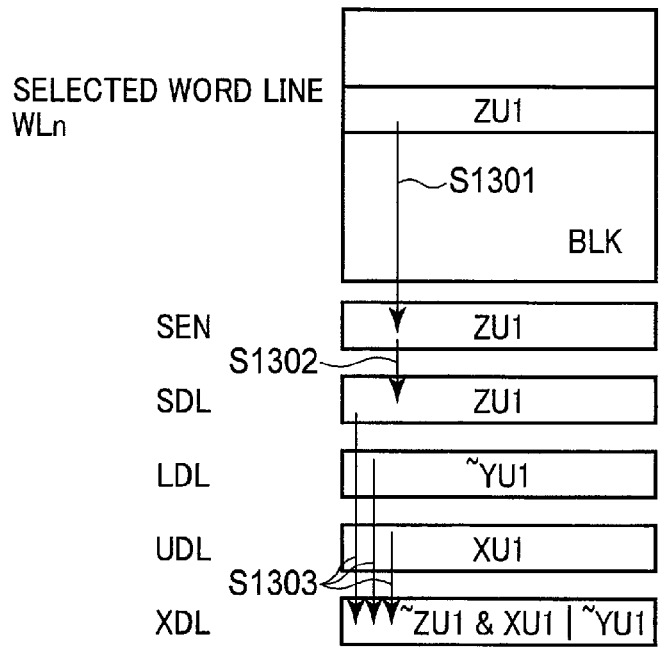
F I G. 45
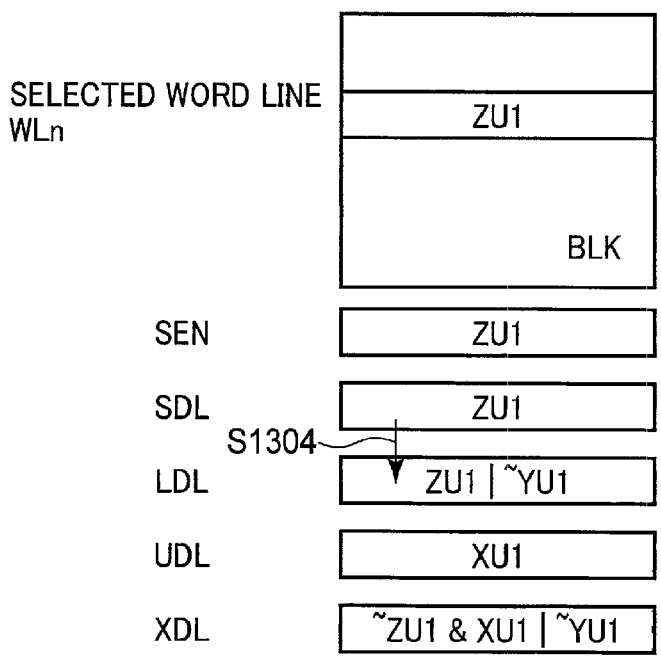
F I G. 46

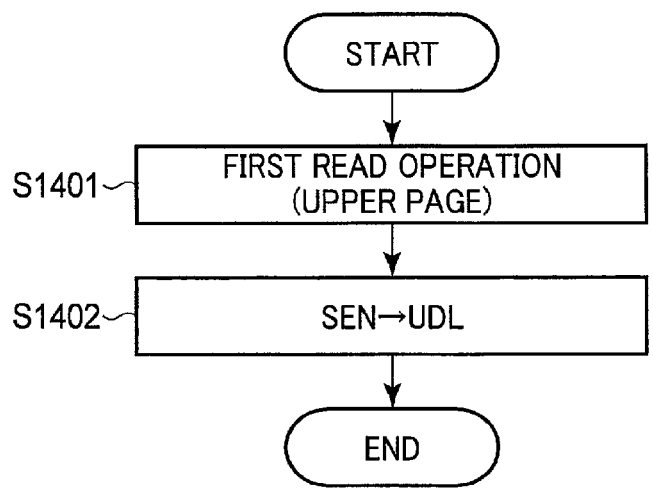
F I G. 47
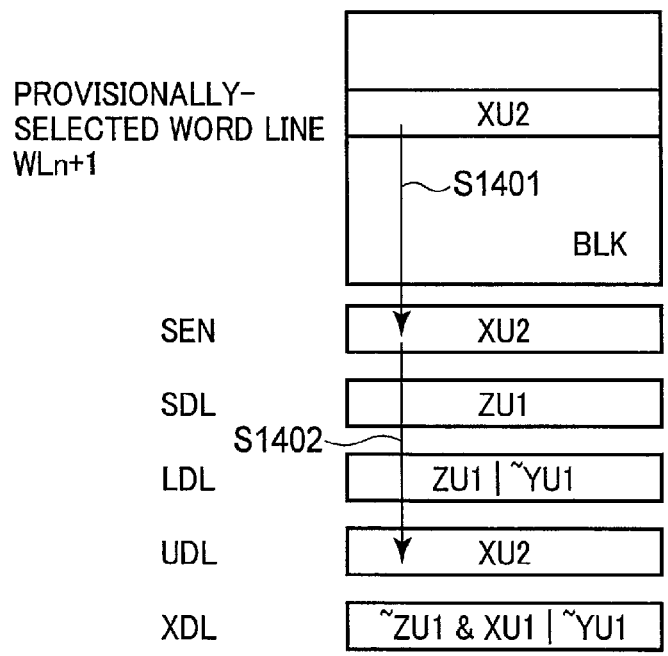
F I G. 48

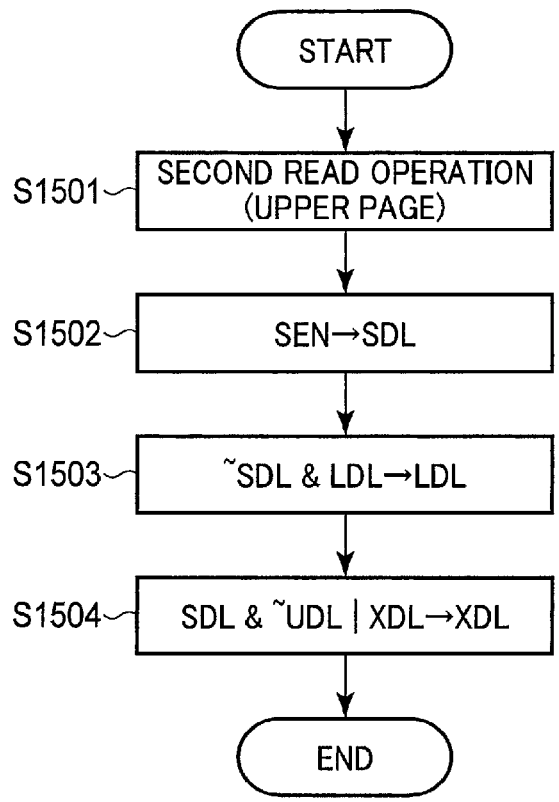
F I G. 49
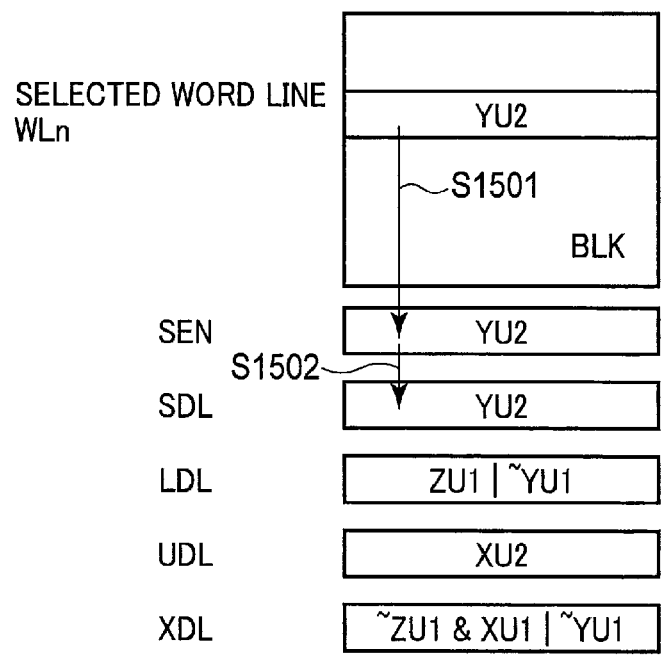
F I G. 50

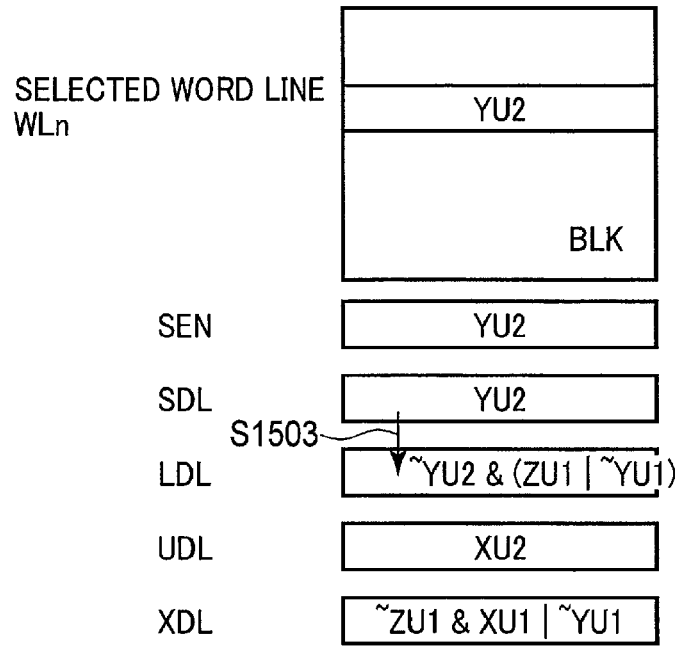
F I G. 51
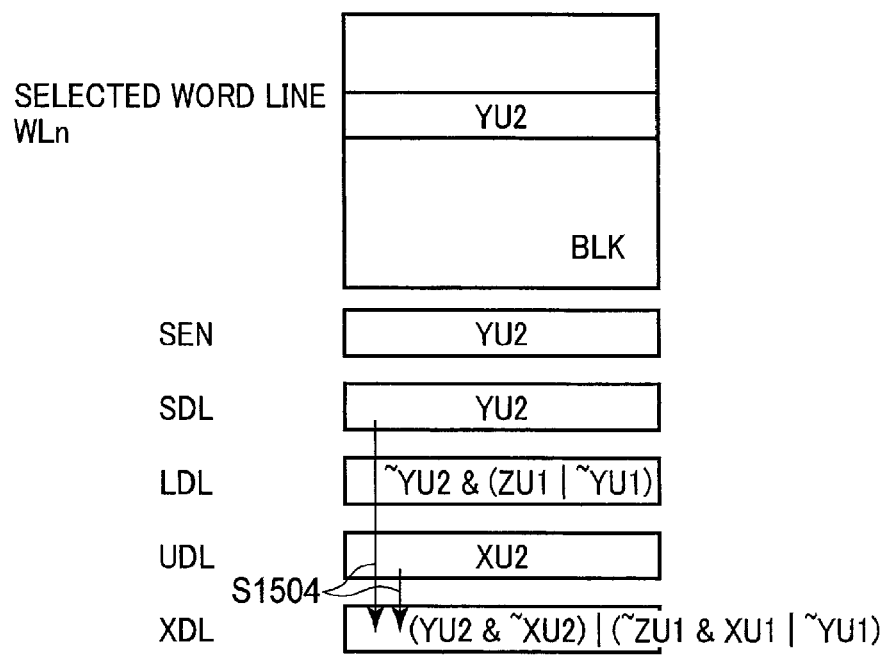
F I G. 52

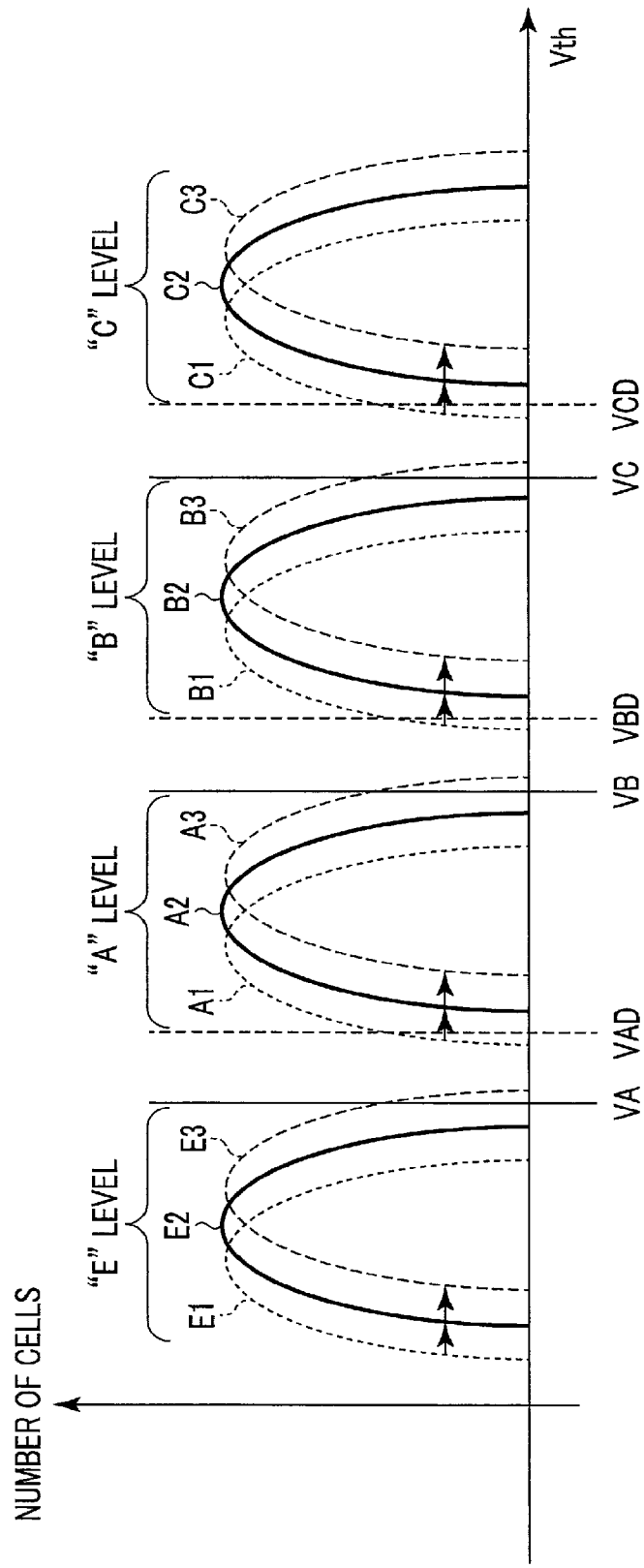
F I G. 57

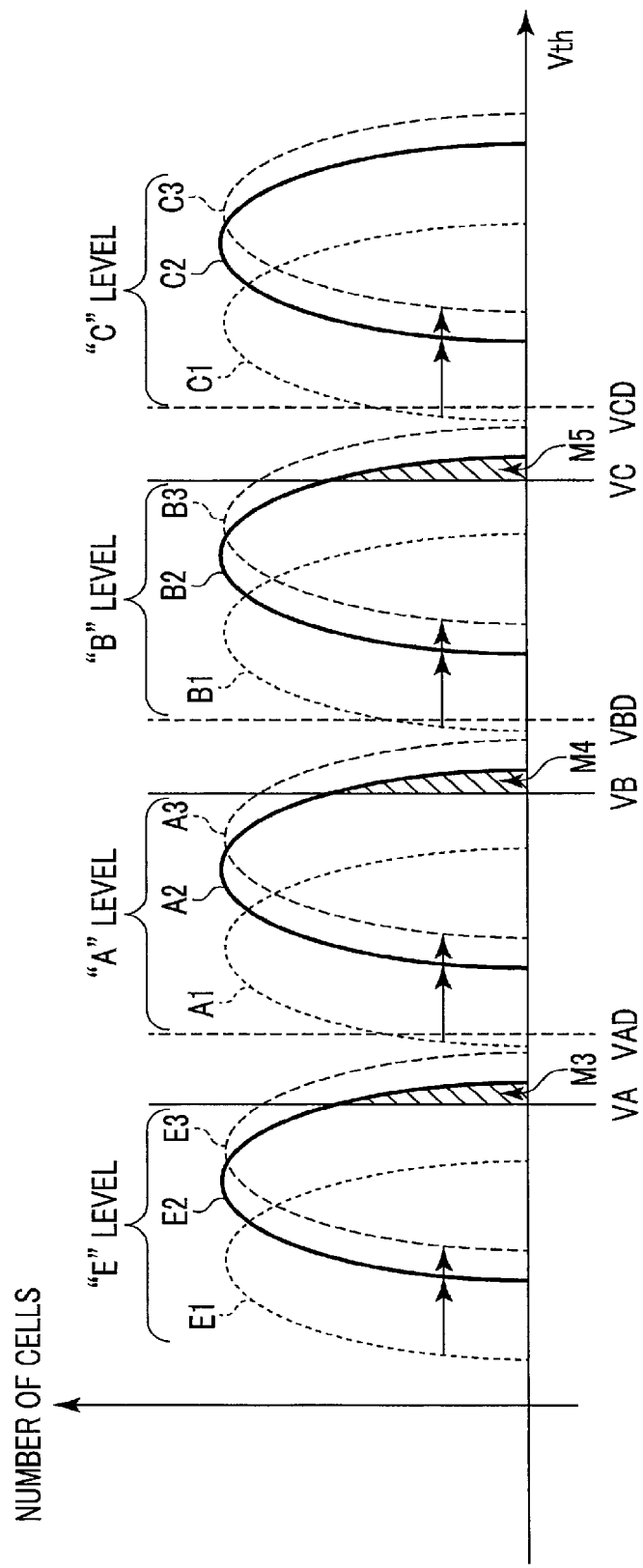
F I G. 58

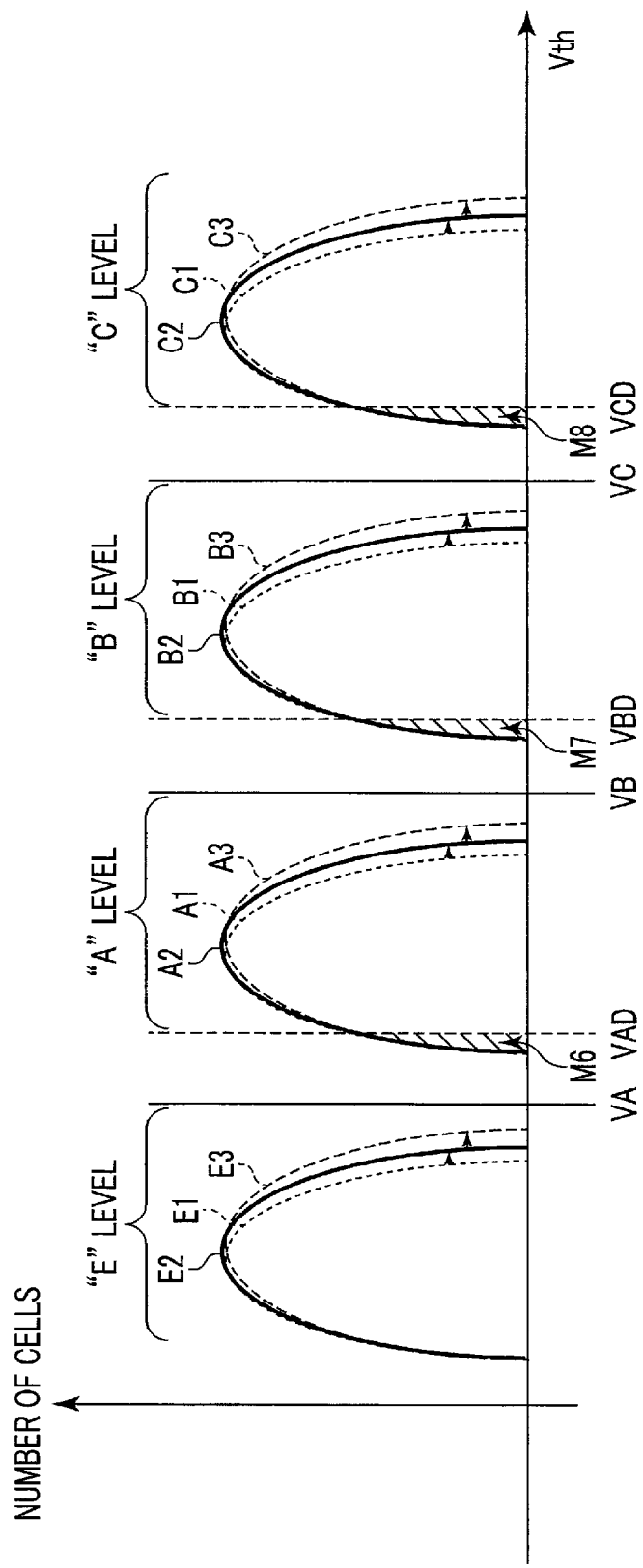
F I G. 59

~SEN→LDL(S802)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/A) | | 1(B/C) | | 0(E/A) | | 1(B/C) | | 0(E/A) | | 1(B/C) | | 0(E/A) | | 1(B/C) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | - | - | - | - | - | - | - | - | - | - | - | - | - | - | - | - |
| LDL | 1 | 1 | 1 | 1 | 1 | 0 | 0 | 0 | 0 | 0 | 0 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 0 | 0 | 1 | 1 | 1 | 1 | 1 | 1 | 1 | 1 | 1 | 1 |

F I G. 60

LDL→XDL(S803)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/A) | | 1(B/C) | | 0(E/A) | | 1(B/C) | | 0(E/A) | | 1(B/C) | | 0(E/A) | | 1(B/C) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | 1 | 1 | 1 | 1 | 1 | 1 | 0 | 0 | 0 | 0 | 0 | 0 | 0 | 0 | 0 | 0 |
| LDL | 1 | 1 | 1 | 1 | 1 | 1 | 0 | 0 | 0 | 0 | 0 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 0 | 0 | 1 | 1 | 1 | 1 | 1 | 1 | 1 | 1 | 1 | 1 |

SDL | LDL→LDL(S903)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/A) | | 1(B/C) | | 0(E/A) | | 1(B/C) | | 0(E/A) | | 1(B/C) | | 0(E/A) | | 1(B/C) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | 1 | 1 | 1 | 1 | 0 | 1 | 1 | 0 | 0 | 0 | 0 | 0 | 0 | 0 | 0 | 0 |
| LDL | 1 | 1 | 1 | 1 | (0) | 1 | 1 | (0) | (0) | 1 | 1 | (0) | (0) | 1 | 1 | 1 |
| SDL | 0 | 0 | 0 | 0 | 0 | 0 | 0 | 0 | 0 | 1 | 1 | 1 | 1 | 1 | 1 | 1 |
| SEN | 0 | 0 | 0 | 0 | 0 | 0 | 0 | 0 | 0 | 1 | 1 | 1 | 1 | 1 | 1 | 1 |

F I G. 63

| UDL(MTn+1) | ~SDL & UDL \| XDL→XDL(S904) | | | | | | | | | | | | | | | |
|---|---|---|---|---|---|---|---|---|---|---|---|---|---|---|---|---|
| | E(MTn) | | | | A(MTn) | | | | B(MTn) | | | | C(MTn) | | | |
| | 0(E/A) | | 1(B/C) | | 0(E/A) | | 1(B/C) | | 0(E/A) | | 1(B/C) | | 0(E/A) | | 1(B/C) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | 1 | 1 | 1 | 1 | 1 | 0 | 1 | 1 | 0 | 0 | 1 | 1 | 0 | 0 | 0 | 0 |
| LDL | 1 | 1 | 1 | 1 | 1 | (0) | 1 | (0) | (0) | (0) | (0) | 1 | 1 | 1 | 1 | 1 |
| SDL | 0 | 0 | 0 | 0 | 0 | 0 | 0 | 0 | 0 | 0 | 0 | 1 | 1 | 1 | 1 | 1 |
| SEN | 0 | 0 | 0 | 0 | 0 | 0 | 0 | 0 | 0 | 0 | 0 | 1 | 1 | 1 | 1 | 1 |

F I G. 64

SEN→SDL(S1202)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/C) | | 1(A/B) | | 0(E/C) | | 1(A/B) | | 0(E/C) | | 1(A/B) | | 0(E/C) | | 1(A/B) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | – | – | – | – | – | – | – | – | – | – | – | – | – | – | – | – |
| LDL | – | – | – | – | – | – | – | – | – | – | – | – | – | – | – | – |
| SDL | 0 | 0 | 1 | 1 | – | – | 1 | 1 | – | – | 1 | 1 | – | – | 1 | 1 |
| SEN | 0 | 0 | 1 | 1 | – | – | 1 | 1 | – | – | 1 | 1 | – | – | 1 | 1 |

SEN→SDL(S1303)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/C) | | 1(A/B) | | 0(E/C) | | 1(A/B) | | 0(E/C) | | 1(A/B) | | 0(E/C) | | 1(A/B) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | - | - | - | - | - | - | - | - | - | - | - | - | - | - | - | - |
| LDL | 1 | 0 | 1 | 0 | 0 | 0 | 0 | 0 | 0 | 0 | 0 | 0 | 0 | 0 | 0 | 0 |
| SDL | 0 | 0 | 0 | 0 | 1 | 0 | 1 | 0 | 1 | 0 | 1 | 0 | 1 | 0 | 1 | 0 |
| SEN | 0 | 0 | 0 | 0 | 1 | 0 | 1 | 0 | 1 | 1 | 1 | 1 | 1 | 1 | 1 | 1 |

F I G. 68

~SDL & UDL | LDL→XDL(S1303)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/C) | | 1(A/B) | | 0(E/C) | | 1(A/B) | | 0(E/C) | | 1(A/B) | | 0(E/C) | | 1(A/B) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | 1 | 0 | 1 | 1 | 0 | 0 | 1 | 0 | 0 | 0 | 0 | 0 | 0 | 0 | 0 | 0 |
| LDL | 1 | 0 | 1 | 0 | 0 | 0 | 0 | 0 | 0 | 0 | 0 | 0 | 0 | 0 | 0 | 0 |
| SDL | 0 | 0 | 0 | 0 | 1 | 1 | 0 | 1 | 1 | 1 | 1 | 1 | 1 | 1 | 1 | 1 |
| SEN | 0 | 0 | 0 | 0 | 1 | 1 | 0 | 1 | 1 | 1 | 1 | 1 | 1 | 1 | 1 | 1 |

FIG. 69

LDL | SDL→LDL(S1304)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/C) | | 1(A/B) | | 0(E/C) | | 1(A/B) | | 0(E/C) | | 1(A/B) | | 0(E/C) | | 1(A/B) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | 1 | 0 | 0 | 1 | 0 | 1 | 0 | 1 | 0 | 1 | 0 | 1 | 0 | 1 | 0 | 1 |
| LDL | 1 | 0 | 1 | 1 | 1 | 0 | 1 | 0 | 1 | 1 | 1 | 1 | 1 | 1 | 1 | 1 |
| SDL | 0 | 0 | 0 | 0 | 1 | 0 | 1 | 0 | 1 | 1 | 1 | 1 | 1 | 1 | 1 | 1 |
| SEN | 0 | 0 | 0 | 0 | 1 | 0 | 1 | 0 | 1 | 1 | 1 | 1 | 1 | 1 | 1 | 1 |

M3, M3, M6, M6

F I G. 70

SEN→SDL(S1502)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/C) | | 1(A/B) | | 0(E/C) | | 1(A/B) | | 0(E/C) | | 1(A/B) | | 0(E/C) | | 1(A/B) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | 1 | 0 | 1 | 1 | 0 | 0 | 1 | 0 | 0 | 0 | 1 | 0 | 0 | 0 | 0 | 0 |
| LDL | 1 | 0 (M3) | 1 | 0 (M3) | 0 (M6) | 1 | 0 (M6) | 0 | 1 | 1 | 0 | 1 | 1 | 1 | 1 | 1 |
| SDL | 0 | 0 | 0 | 0 | 0 | 0 | 0 | 0 | 1 (M5) | 0 | 1 (M5) | 0 | 1 | 1 | 1 | 1 |
| SEN | 0 | 0 | 0 | 0 | 0 | 0 | 0 | 0 | 1 (M5) | 0 | 1 (M5) | 0 | 1 | 1 | 1 | 1 |

F I G. 71

~SDL & LDL→LDL(S1503)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/C) | | 1(A/B) | | 0(E/C) | | 1(A/B) | | 0(E/C) | | 1(A/B) | | 0(E/C) | | 1(A/B) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | 1 | 0 | 1 | 1 | 0 | 1 | 1 | 0 | 0 | 0 | 0 | 0 | 0 | 0 | 0 | 0 |
| LDL | 1 | 0 | 0 | 1 | 0 | 0 | 0 | 1 | 0 | 1 | 0 | 1 | 0 | 0 | 0 | 0 |
| SDL | 0 | 0 | 0 | 0 | 0 | 0 | 0 | 0 | 0 | 1 | 0 | 0 | 1 | 1 | 1 | 1 |
| SEN | 0 | 0 | 0 | 0 | 0 | 0 | 0 | 0 | 0 | 1 | 0 | 0 | 1 | 1 | 1 | 1 |

FIG. 72

SEN→SDL(S1602)

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| | 0(E/C) | | 1(A/B) | | 0(E/C) | | 1(A/B) | | 0(E/C) | | 1(A/B) | | 0(E/C) | | 1(A/B) | |
| Effect | SMALL | LARGE | SMALL | LARGE | SMALL | LARGE | SMALL | LARGE | SMALL | LARGE | SMALL | LARGE | SMALL | LARGE | SMALL | LARGE |
| XDL | 1 | 0 | 1 | 1 | 0 | 0 | 1 | 0 | 1 | 0 | 0 | 0 | 1 | 0 | 0 | 0 |
| LDL | 1 | 0 | 1 | 0 | 0 | 0 | 0 | 0 | 0 | 0 | 1 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 0 | 0 | 0 | 0 | 0 | 0 | 0 | 0 | 1 | 1 | 1 | 1 |

| UDL(MTn+1) | E(MTn) | | | | A(MTn) | | | | B(MTn) | | | | C(MTn) | | | |
|---|---|---|---|---|---|---|---|---|---|---|---|---|---|---|---|---|
| Effect | 0(E/C) | | 1(A/B) | | 0(E/C) | | 1(A/B) | | 0(E/C) | | 1(A/B) | | 0(E/C) | | 1(A/B) | |
| | SMALL | LARGE | SMALL | LARGE | SMALL | LARGE | SMALL | LARGE | SMALL | LARGE | SMALL | LARGE | SMALL | LARGE | SMALL | LARGE |
| XDL | 1 | 0 | 1 | 1 | 0 | 1 | 1 | 0 | 0 | 1 | 1 | 0 | 1 | 1 | 1 | 1 |
| LDL | 1 | 0 | 0 | 0 | 0 | 0 | 0 | 0 | 0 | 0 | 0 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 0 | 0 | 0 | 0 | 0 | 0 | 0 | 0 | 0 | 0 | 0 | 0 |

SDL | XDL→XDL(S1604)

F I G. 76

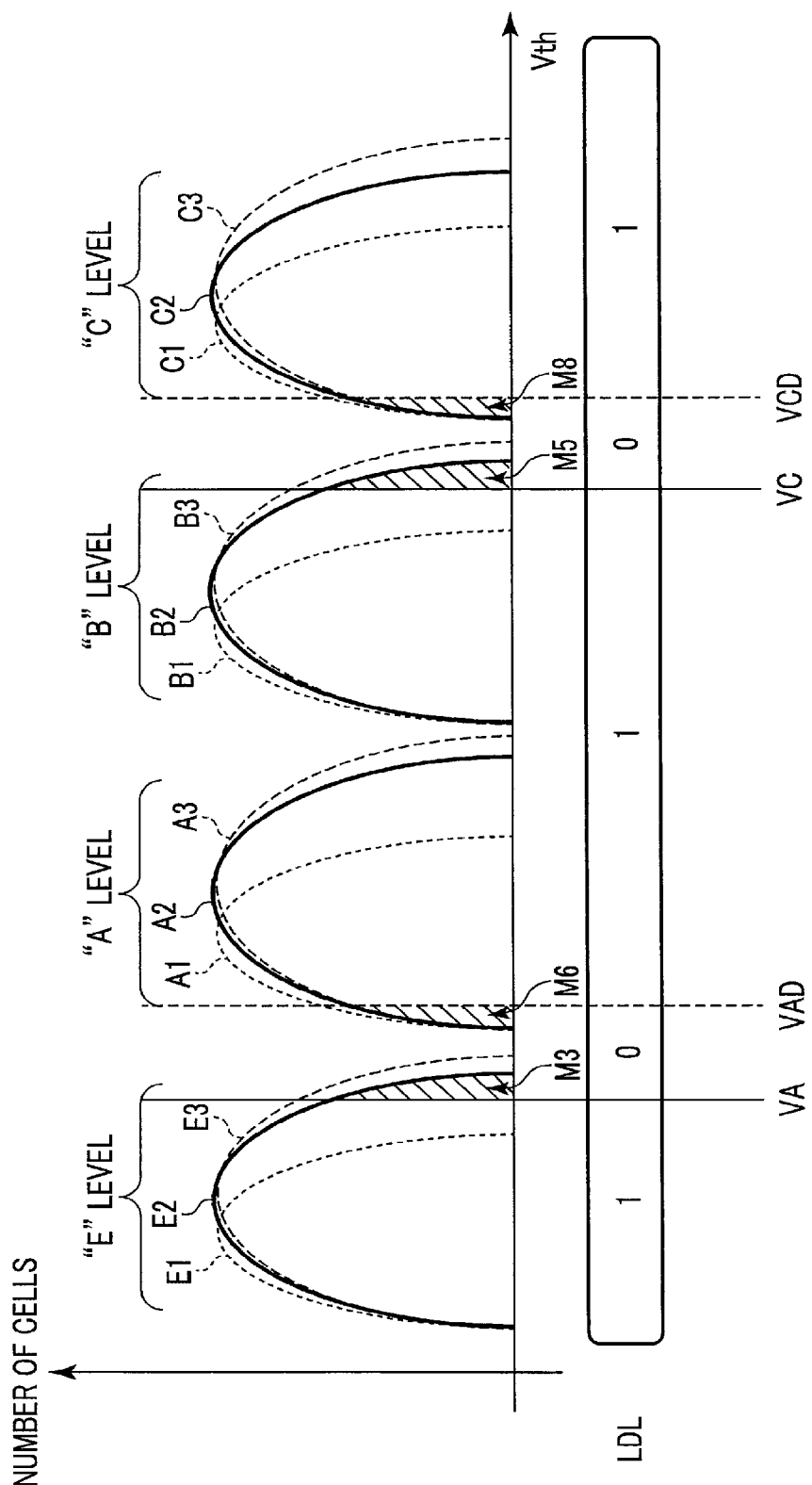
F I G. 77

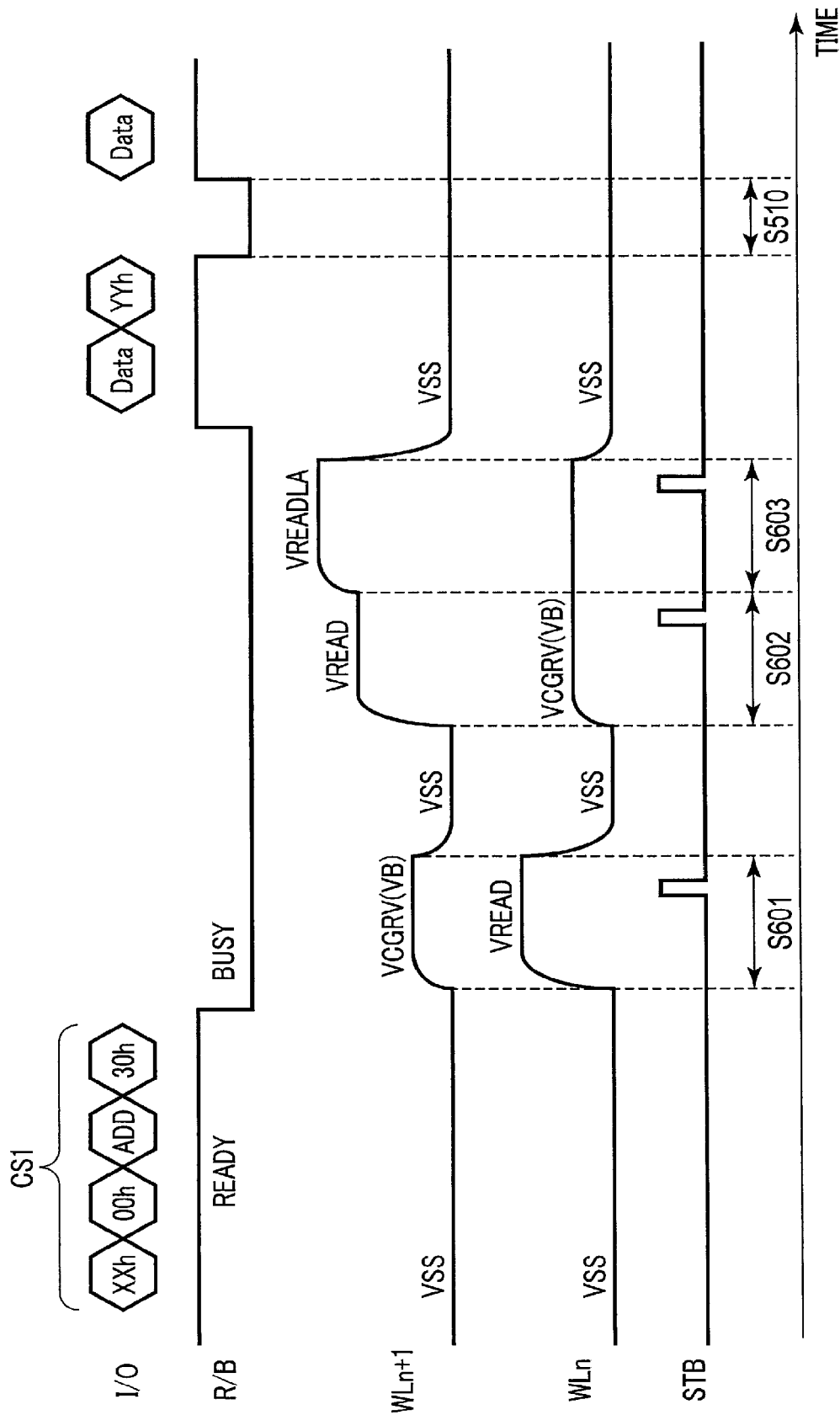
F I G. 78

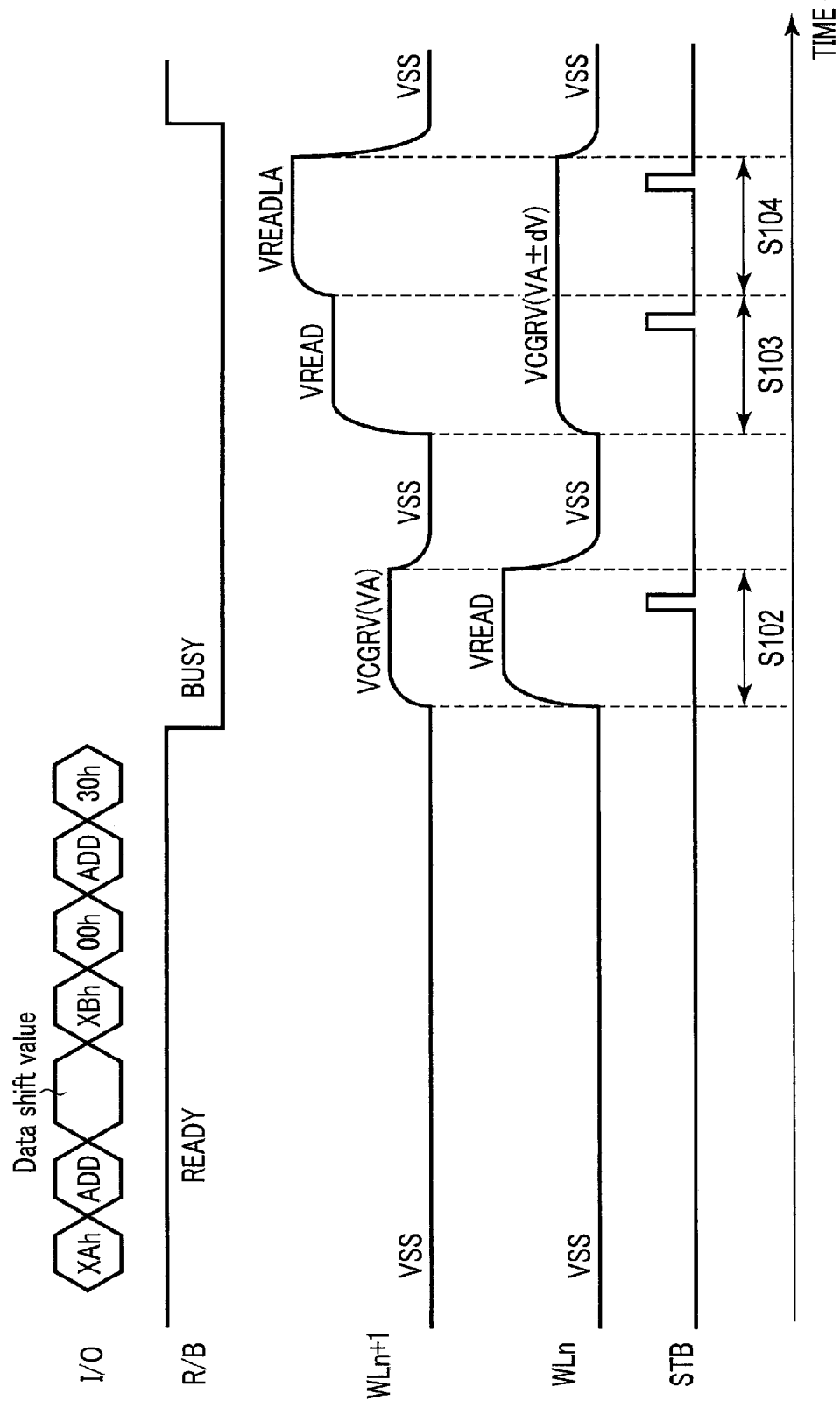
F I G. 80

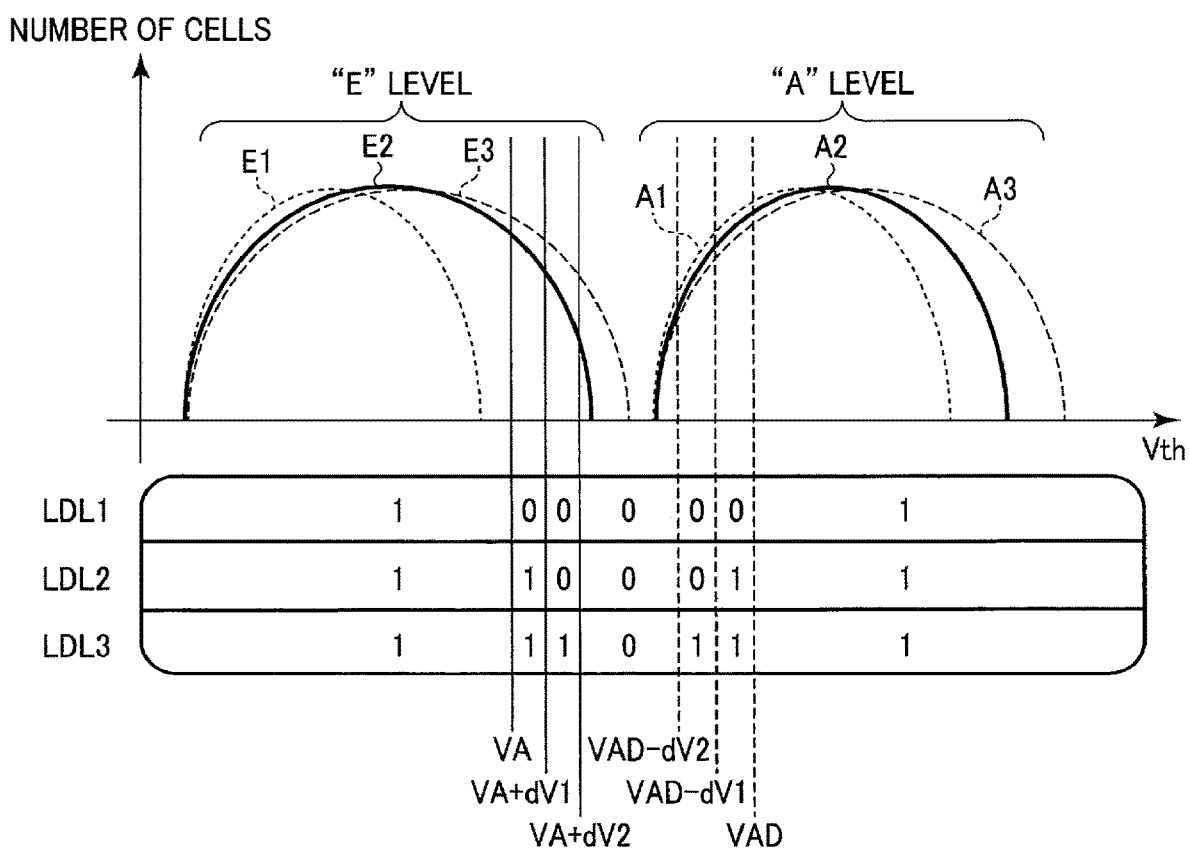
F I G. 81

MEMORY DEVICE

CROSS-REFERENCE TO RELATED APPLICATIONS

This application is a Continuation Application of PCT Application No. PCT/JP2016/078045, filed Sep. 23, 2016, the entire contents of all of which are incorporated herein by reference.

FIELD

Embodiments relate to a memory device.

BACKGROUND

As a memory device, a NAND flash memory is known.

BRIEF DESCRIPTION OF THE DRAWINGS

FIG. 3 is a circuit diagram of a block and a sense circuit.
FIG. 4 is a circuit diagram of a sense amplifier.
FIG. 5 is a diagram showing data that may be held in memory cell transistors and threshold distributions thereof.
FIG. 11 is a circuit diagram of the NAND string in a second read operation, and shows the voltage of each line.
FIG. 12 is a diagram showing a flow of data in the second operation.
FIG. 13 is a flowchart showing a third operation.
FIG. 18 is a diagram showing a shift example of threshold distributions of memory cell transistors.
FIG. 19 is a diagram showing a shift example of the threshold distributions of memory cell transistors.
FIG. 20 is a diagram showing a shift example of the threshold distributions of memory cell transistors.
FIG. 21 is a diagram showing data stored in latch circuits in the second operation.
FIG. 22 is a diagram showing data stored in the latch circuits in the second operation.
FIG. 23 is a diagram showing data stored in the latch circuits in the third operation.
FIG. 24 is a diagram showing data stored in the latch circuits in the third operation.
FIG. 25 is a diagram showing data stored in the latch circuits in the third operation.
FIG. 29 is a flowchart showing a read operation of a memory system according to a second embodiment.
FIG. 30 is a flowchart showing a lower page read operation.
FIG. 31 is a flowchart showing a fourth operation.
FIG. 34 is a diagram showing a flow of data in the fifth operation.
FIG. 35 is a flowchart showing a sixth operation.
FIG. 39 is a flowchart showing an upper page read operation.
FIG. 40 is a flowchart showing a seventh operation.
FIG. 41 is a diagram showing a flow of data in the seventh operation.
FIG. 42 is a flowchart showing an eighth operation.
FIG. 43 is a diagram showing a flow of data in the eighth operation.
FIG. 44 is a flowchart showing a ninth operation.
FIG. 45 is a diagram showing a flow of data in the ninth operation.
FIG. 46 is a diagram showing a flow of data in the ninth operation.
FIG. 47 is a flowchart showing a tenth operation.
FIG. 48 is a diagram showing a flow of data in the tenth operation.
FIG. 49 is a flowchart showing an eleventh operation.
FIG. 50 is a diagram showing a flow of data in the eleventh operation.
FIG. 51 is a diagram showing a flow of data in the eleventh operation.
FIG. 52 is a diagram showing a flow of data in the eleventh operation.
FIG. 57 is a diagram showing a shift example of threshold distributions of memory cell transistors.
FIG. 58 is a diagram showing a shift example of the threshold distributions of memory cell transistors.
FIG. 59 is a diagram showing a shift example of the threshold distributions of memory cell transistors.
FIG. 60 is a diagram showing data stored in the latch circuits in the fifth operation.
FIG. 61 is a diagram showing data stored in the latch circuits in the fifth operation.
FIG. 62 is a diagram showing data stored in the latch circuits in the sixth operation.
FIG. 63 is a diagram showing data stored in the latch circuits in the sixth operation.

FIG. 64 is a diagram showing data stored in the latch circuits in the sixth operation.

FIG. 66 is a diagram showing data stored in the latch circuits in the eighth operation.

FIG. 67 is a diagram showing data stored in the latch circuits in the eighth operation.

FIG. 68 is a diagram showing data stored in the latch circuits in the ninth operation.

FIG. 69 is a diagram showing data stored in the latch circuits in the ninth operation.

FIG. 70 is a diagram showing data stored in the latch circuits in the ninth operation.

FIG. 71 is a diagram showing data stored in the latch circuits in the eleventh operation.

FIG. 72 is a diagram showing data stored in the latch circuits in the eleventh operation.

FIG. 74 is a diagram showing data stored in the latch circuits in the twelfth operation.

FIG. 75 is a diagram showing data stored in the latch circuits in the twelfth operation.

FIG. 76 is a diagram showing data stored in the latch circuits in the twelfth operation.

FIG. 77 is a diagram showing the relationship between the threshold distributions of memory cell transistors and data stored in a latch circuit.

FIG. 78 is a command sequence showing a read operation of the memory system according to the second embodiment.

FIG. 80 is a command sequence showing a read operation of a memory system according to a modification.

FIG. 81 is a diagram showing the relationship between threshold distributions of memory cell transistors and data stored in a latch circuit.

DETAILED DESCRIPTION

Figure 1:
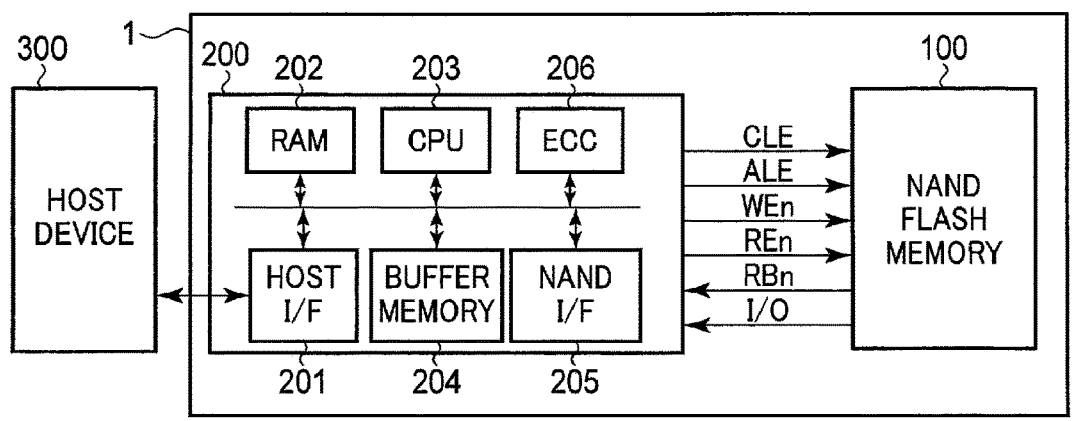
FIG. 1 is a block diagram of a memory system according to a first embodiment.

In general, according to one embodiment, a memory device includes a first memory cell, and a second memory cell adjacent to the first memory cell; and a sequencer configured to, when data is read from the first memory cell: perform a first read operation on the second memory cell; perform a second read operation on the first memory cell; perform a third read operation on the first memory cell by applying a voltage different from that applied in the second read operation to a gate of the second memory cell; and generate first data stored in the first memory cell and second data for correcting the first data, based on results of the first to third read operations.

Hereinafter, embodiments will be described with reference to the drawings. In the description, common parts are assigned with common reference numerals throughout the drawings.

<1> First Embodiment

A semiconductor memory device according to the first embodiment will be described. Hereinafter, a three-dimensionally stacked type NAND flash memory, in which memory cell transistors are stacked above a semiconductor substrate, will be described as an example of the semiconductor memory device.

<1-1> Configuration

<1-1-1> Configuration of Memory System

First, a configuration of a memory system including the semiconductor memory device according to the present embodiment will be described with reference to FIG. 1.

As shown in FIG. 1, a memory system 1 includes a NAND flash memory 100 and a memory controller 200. The memory controller 200 and the NAND flash memory 100 may constitute one semiconductor device, for example, by a combination thereof. The semiconductor device includes, for example, a memory card, such as an SD™ card, and a solid state drive (SSD). The memory system 1 may also include a host device 300.

The NAND flash memory 100 includes a plurality of memory cell transistors, and nonvolatilely stores data. Details of the configuration of the NAND flash memory 100 will be described later.

The memory controller 200 instructs the NAND flash memory 100 to perform a read, write, or erase operation in response to an instruction from the host device 300.

The memory controller 200 includes a host interface circuit (host I/F) 201, an embedded memory (random access memory (RAM)) 202, a processor (central processing unit (CPU)) 203, a buffer memory 204, a NAND interface circuit (NAND I/F) 205, and an ECC circuit (error correction circuit or ECC) 206.

The host interface circuit 201 is coupled to the host device 300 via a controller bus, and controls communication between the memory controller 200 and the host device 300. The host interface circuit 201 transfers instructions and data received from the host device 300 to the CPU 203 and the buffer memory 204, respectively. In response to an instruction from the CPU 203, the host interface circuit 201 transfers data in the buffer memory 204 to the host device 300.

The NAND interface circuit 205 is coupled to the NAND flash memory 100 via a NAND bus. The NAND interface circuit 205 controls communication between the NAND flash memory 100 and the memory controller 200. The NAND interface circuit 205 transfers an instruction received from the CPU 203 to the NAND flash memory 100. At the time of writing data, the NAND interface circuit 205 transfers write data in the buffer memory 204 to the NAND flash memory 100. At the time of reading data, the NAND interface circuit 205 transfers data read from the NAND flash memory 100 to the buffer memory 204.

The NAND bus performs signal transmission/reception compliant with a NAND interface. The signal includes, for example, a command latch enable signal CLE, an address latch enable signal ALE, a write enable signal WEn, a read enable signal REn, a ready/busy signal RBn, and an input/output signal I/O.

Signals CLE and ALE are signals for notifying the NAND flash memory 100 that the input/output signal I/O to the NAND flash memory 100 is a command and an address, respectively. Signal WEn is asserted at the low level, and is used for taking an input signal I/O into the NAND flash memory 100. The term "asserted" means that the signal (or logic) is in a valid (active) state, and the opposite term "negated" means that the signal (or logic) is in an invalid (inactive) state. Signal REn is also asserted at the low level, and is used for reading an output signal I/O from the NAND flash memory 100. The ready/busy signal RBn indicates whether the NAND flash memory 100 is in a ready state (a state where an instruction from the memory controller 200 can be received) or in a busy state (a state where an instruction from the memory controller 200 cannot be received), and the low level indicates the busy state. The input/output signal I/O is, for example, an 8-bit signal. The input/output signal I/O is an entity of data transmitted and received between the NAND flash memory 100 and the memory controller 200, and is a command, an address, write data, read data, or the like.

The CPU 203 controls the overall operation of the memory controller 200. For example, upon receipt of a write instruction from the host device 300, the CPU 203 issues a write instruction based on the NAND interface circuit 205. Similar processing is performed at the time of reading or erasing. The CPU 203 executes various processes, such as wear leveling, for managing the NAND flash memory 100. The CPU 203 also executes various arithmetic operations. For example, the CPU 203 executes data encryption processing, randomization processing, and the like. As described above, even when the host device 300 is included in the memory system 1, the CPU 203 controls the overall operation of the memory system 1.

The ECC circuit 206 executes error correction (error checking and correcting (ECC)) processing on data. That is, the ECC circuit 206 generates parity based on write data at the time of writing data. At the time of reading data, the ECC circuit 206 generates a syndrome from the parity to detect an error, and corrects the error. The CPU 203 may have the function of the ECC circuit 206.

As elements of the NAND flash memory are miniaturized, intervals between threshold distributions become narrow. For this reason, erroneous data may be read at the time of reading data, and the reliability of data may decrease. To address this issue, it is conceivable to adopt an error correction method using, for example, a low density parity check (LDPC) code in the ECC circuit 206.

In this error correction method using the LDPC code, in addition to the value (hard value or hard bit data) read in a normal read operation, another value (soft value or soft bit data) is required.

In the present embodiment, normal read data and soft bit data can be generated by first to third operations to be described later. The ECC circuit 206 can perform an error correction operation by using soft bit data. Soft bit data is information indicating the position of the threshold voltage value of a memory cell transistor MT (for example, whether the threshold voltage value is in a middle part of the threshold distribution of a certain level, in a right part of the distribution, or in a left part of the distribution, etc.). In other words, soft bit data is information indicating "reliability" of read data.

The embedded memory 202 is, for example, a semiconductor memory, such as a DRAM, and is used as a work area of the CPU 203. The embedded memory 202 stores firmware for managing the NAND flash memory 100, various management tables, and the like.

<1-1-2> Configuration of NAND Flash Memory

Next, a configuration of the NAND flash memory 100 will be described with reference to FIG. 2.

Figure 2:
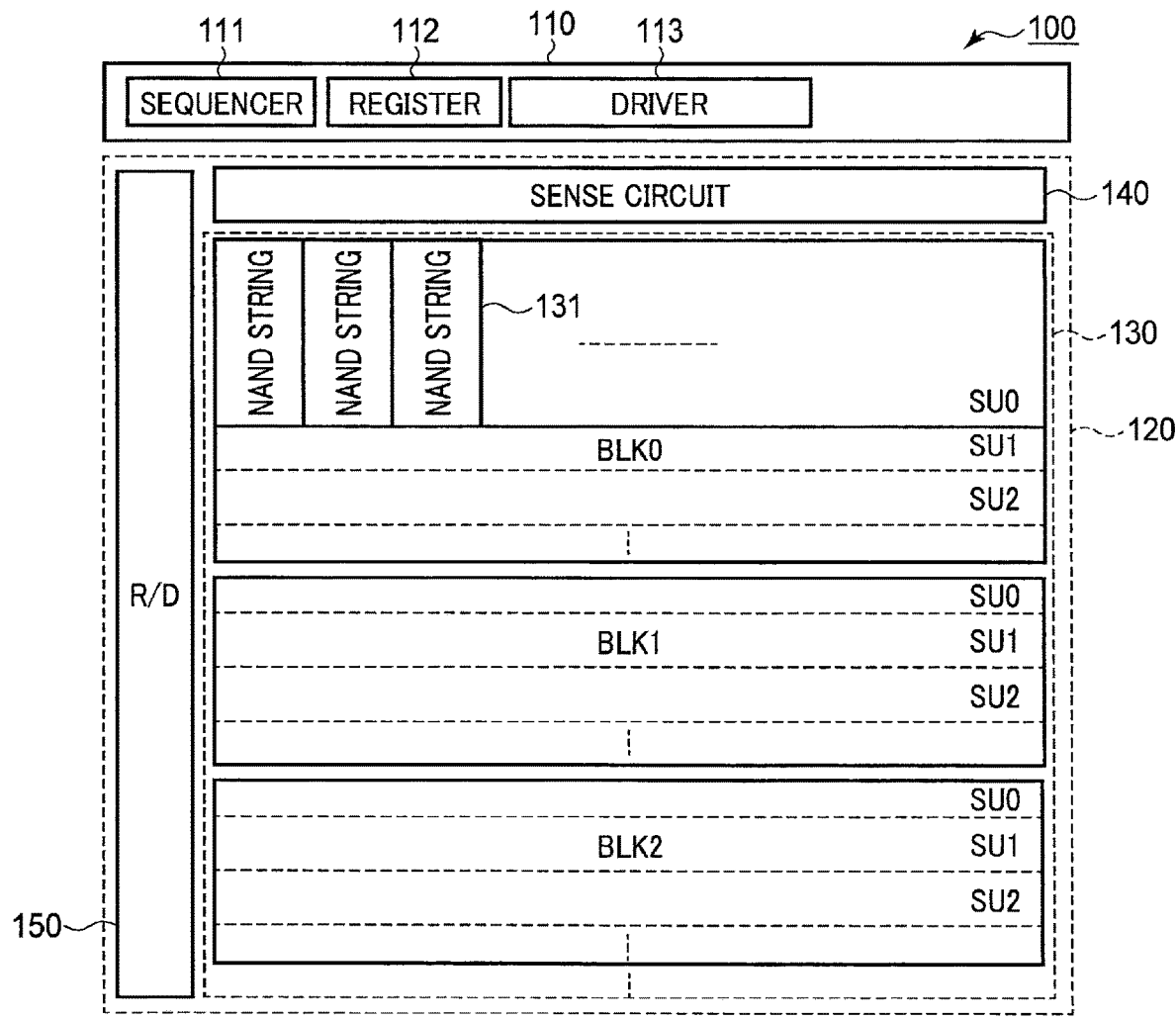
FIG. 2 is a block diagram of a NAND flash memory.

As shown in FIG. 2, the NAND flash memory 100 includes a peripheral circuit 110 and a core part 120.

The core part 120 includes a memory cell array 130, a sense circuit 140, and a row decoder (R/D) 150.

The memory cell array 130 includes a plurality of nonvolatile memory cell transistors, each of which is associated with a word line and a bit line. The memory cell array 130 includes a plurality of (three in the example of FIG. 2) blocks BLK (BLK0, BLK1, BLK2, . . . ), each of which is a set of a plurality of nonvolatile memory cell transistors.

The block BLK is, for example, a unit of erasing data, and data in the same block BLK is collectively erased.

Data can be erased in units of blocks BLK, or smaller units. The erasing method is described in, for example, U.S. patent application Ser. No. 13/235,389, entitled "NON-VOLATILE SEMICONDUCTOR MEMORY DEVICE", filed on Sep. 18, 2011. It is also described in U.S. patent application Ser. No. 12/694,690, entitled "NON-VOLATILE SEMICONDUCTOR STORAGE DEVICE", filed on Jan. 27, 2010. Furthermore, it is described in U.S. patent application Ser. No. 13/483,610, entitled "NONVOLATILE SEMICONDUCTOR MEMORY DEVICE AND DATA ERASE METHOD THEREOF", filed on May 30, 2012. The entire contents of those patent applications are incorporated herein by reference.

The blocks BLK each include a plurality of (three in the example of FIG. 2) string units SU (SU0, SU1, SU2, . . . ), each of which is a set of NAND strings 131, each including memory cell transistors coupled in series. Of course, the number of blocks in the memory cell array 130 and the number of string units in one block BLK may be any number. The physical position of a block in the memory cell array 130 is indicated by a block address.

The row decoder 150 selects a word line of the block corresponding to the block address.

The sense circuit 140 includes a plurality of sense amplifier units SAU. The sense amplifier units SAU sense data read from memory cell transistors out to bit lines at the time of reading data.

The peripheral circuit 110 includes a sequencer 111, a register 112, and a driver 113.

The sequencer 111 controls the overall operation of the NAND flash memory 100.

The register 112 stores various signals. For example, the register 112 stores the status of a data writing or erasing operation, thereby notifying the controller whether or not the operation has been normally completed. The register 112 can also store various tables.

The driver 113 supplies voltages necessary for data writing, reading, or erasing to the row decoder 150, the sense circuit 140, and a source line driver (not shown).

<1-1-3> Configuration of Block BLK

Next, a configuration of the block BLK will be described with reference to FIG. 3.

As shown in FIG. 3, the block BLK includes a plurality of NAND strings 131. The NAND strings 131 each include a plurality of (eight in the example of FIG. 3) memory cell transistors MT (MT0 to MT7) and select transistors ST1 and ST2. The memory cell transistor MT includes a control gate and a charge storage layer, and nonvolatilely stores data. The memory cell transistors MT are coupled in series between the source of select transistor ST1 and the drain of select transistor ST2.

The gates of select transistors ST1 and ST2 in the same block are coupled in common to select gate lines SGD and SGS, respectively. Similarly, the control gates of the memory cell transistors MT0 to MT7 in the same block are coupled in common to the word lines WL0 to WL7, respectively.

The drains of select transistors ST1 of the NAND strings 131 in the same column in the memory cell array 130 are coupled in common to a bit line BL (BL0 to BL(L-1), where L is a natural number equal to or larger than 2). Namely, the NAND strings 131 in the same column of a plurality of blocks BLK are coupled in common to a bit line BL. Moreover, the sources of a plurality of select transistors ST2 are coupled in common to a source line SL.

In this example, one memory cell transistor MT can store, for example, 1-bit data. A set of bits stored in the memory cells coupled to the same word line is called a page. That is, one page is allocated to one word line WL, and a block BLK which includes eight word lines WL has a capacity of eight pages. In other words, a "page" may also be defined as a part of a memory space formed by memory cells coupled to the same word line. Data may be written or read in units of pages (this reading method is called page-by-page reading).

The memory cell array 130 may have a configuration in which memory cell transistors are three-dimensionally stacked above the semiconductor substrate. Such a configuration is described, for example, in U.S. patent application Ser. No. 12/407,403, entitled "THREE-DIMENSIONAL STACKED NONVOLATILE SEMICONDUCTOR MEMORY", filed on Mar. 19, 2009. It is also described in U.S. patent application Ser. No. 12/406,524, entitled "THREE-DIMENSIONAL STACKED NONVOLATILE SEMICONDUCTOR MEMORY", filed on Mar. 18, 2009, U.S. patent application Ser. No. 12/679,991, entitled "NON-VOLATILE SEMICONDUCTOR MEMORY DEVICE AND MANUFACTURING METHOD THEREOF", filed on Mar. 25, 2010, and U.S. patent application Ser. No. 12/532,030, entitled "SEMICONDUCTOR MEMORY and MANUFACTURING METHOD THEREOF", filed on Mar. 23, 2009. The entire contents of those patent applications are incorporated herein by reference.

<1-1-4> Configuration of Sense Circuit

<1-1-4-1> Overview of Sense Circuit

Next, a configuration of the sense circuit 140 will be described with reference to FIG. 3.

As shown in FIG. 3, the sense circuit 140 includes sense amplifier units SAU (SAU0 to SAU(L-1)) provided for respective bit lines BL.

The sense amplifier units SAU each include a sense amplifier SA, an arithmetic operation section OP and, for example, four latch circuits SDL, LDL, UDL, and XDL.

The sense amplifier SA senses data read out to the corresponding bit line BL, and applies a voltage to the bit line BL in accordance with write data. That is, the sense amplifier SA is a module that directly controls the bit line BL. Control signal STB is provided to the sense amplifier SA, for example, by the sequencer 111. The sense amplifier SA determines read data ("0" or "1") at the time when signal STB is asserted, and transfers it to one of the latch circuits SDL, LDL, UDL, and XDL.

The latch circuits SDL, LDL, UDL, and XDL temporarily store read data and write data. The arithmetic operation section OP performs various logical operations, such as a NOT operation, an OR operation, an AND operation, and an exclusive OR (XOR) operation, on data stored in the latch circuits SDL, LDL, UDL, and XDL. The sequencer 111 may perform various logical operations on data stored in the latch circuits SDL, LDL, UDL, and XDL. The sequencer 111 and arithmetic operation section OP may be collectively used as a sequencer.

The sense amplifier SA, the latch circuits SDL, LDL, UDL, and XDL, and the arithmetic operation section OP are coupled to one another by a bus so that data can be transmitted and received therebetween.

Data input and output at the sense circuit 140 are performed via latch circuit XDL. That is, data received from the memory controller 200 is transferred to latch circuit SDL, LDL, UDL, or the sense amplifier SA via latch circuit XDL. Data of latch circuit SDL, LDL, UDL or the sense amplifier SA is transmitted to the memory controller 200 via latch circuit XDL. Latch circuit XDL functions as a cache memory of the NAND flash memory 100. Therefore, even if latch circuits SDL, LDL, and UDL are in use, the NAND flash memory 100 can be in the ready state as long as latch circuit XDL is available.

<1-1-4-2> Configuration of Sense Amplifier SA

A configuration of the sense amplifier SA will be described with reference to FIG. 4.

As shown in FIG. 4, the sense amplifier SA includes a sense part 16 and a coupling part 15.

The coupling part 15 couples the sense part 16 to the corresponding bit line BL, and controls the potential of the bit line BL. Specifically, the coupling part 15 includes n-channel MOS transistors 15a and 15b. Transistor 15a has a gate to which signal BLS is applied, and a source coupled to the corresponding bit line BL. Transistor 15b has a source coupled to the drain of transistor 15a, a gate to which signal BLC is applied, and a drain coupled to node SCOM. Transistor 15b is used for clamping the corresponding bit line BL to a potential corresponding to signal BLC.

The sense part 16 senses data read out to the bit line BL. The sense part 16 includes n-channel MOS transistors 16a to 16g, a p-channel MOS transistor 16h, and a capacitor element 16i.

Transistor 16h has a gate coupled to node INV_S, a drain coupled to node SSRC, and a source supplied with a power supply voltage VDD. Transistor 16h is used for charging the bit line BL and the capacitor element 16i. Transistor 16a has a gate supplied with signal BLX, a drain coupled to node SSRC, and a source coupled to node SCOM. Transistor 16a is used for precharging the bit line BL. Transistor 16c has a gate supplied with signal HLL, a drain coupled to node SSRC, and a source coupled to node SEN. Transistor 16c is used for charging the capacitor element 16i. Transistor 16b has a gate supplied with signal XXL, a drain coupled to node SEN, and a source coupled to node SCOM. Transistor 16b is used for discharging node SEN at the time of data sensing. Transistor 16g has a gate coupled to node INV_S, a drain coupled to node SCOM, and a source coupled to node SRCGND. Transistor 16g is used for keeping the bit line BL at a certain potential.

The capacitor element 16i is charged at the time of precharging the bit line BL, and has one electrode coupled to node SEN and the other electrode supplied with signal CLK.

Transistor 16d has a gate supplied with signal BLQ, a source coupled to node SEN, and a drain coupled to node LBUS. Node LBUS is a signal path for coupling the sense part 16 to the latch circuits. Transistor 16e has a gate supplied with signal STB, and a drain coupled to node LBUS. Transistor 16e is used for determining the time when data is sensed, and for storing read data in a latch circuit.

Transistor 16f has a gate coupled to node SEN, a drain coupled to the source of transistor 16e, and a source grounded. Transistor 16f is used for sensing whether read data is "0" or "1".

Node INV_S is a node in a latch circuit, and may have a level corresponding to the stored data of the latch circuit. For example, at the time of reading data, when the selected memory cell is turned on, and node SEN is sufficiently lowered, node INV_S is brought to the "H" level. On the other hand, when the selected memory cell is in the OFF state, and node SEN keeps a certain potential, node INV_S is at the "L" level.

In the above configuration, at the time when signal STB is asserted, transistor 16f senses read data based on the potential of node SEN, whereas transistor 16e transfers the read data to a latch circuit. Various control signals including signal STB are provided by, for example, the sequencer 111.

Various configurations can be applied to the sense amplifier SA, for example, the one described in U.S. patent application Ser. No. 13/052,148, entitled "THRESHOLD DETECTING METHOD AND VERIFY METHOD OF MEMORY CELL", filed on Mar. 21, 2011. The entire contents of this patent application are incorporated herein by reference.

<1-1-5> Threshold Distributions of Memory Cell Transistors

Data that may be held in memory cell transistors MT, and threshold distributions of memory cell transistors MT according to the present embodiment will be described with reference to FIG. 5.

As shown in FIG. 5, memory cell transistor MT can each store, for example, 1-bit data in accordance with its threshold.

The 1-bit data is, for example, "1" and "0" in ascending order of threshold.

The threshold of a memory cell that stores "1" data is in an "E" level. The "E" level is a level of thresholds of a state where charge in the charge storage layer is drawn out and data is erased, which are each a positive or negative value (for example, smaller than voltage VA).

"0" is a threshold of a state where charge is injected into the charge storage layer and data is written. The threshold value of a memory cell that stores "0" data is in an "A" level, which is higher than the "E" level (for example, voltage VA or higher).

<1-2> Data Read Operation

Next, a read operation according to the present embodiment will be described. Here, an operation of reading normal read data and soft bit data will be described.

<1-2-1> Flow of Read Operation

A rough flow of the read operation of the memory system 1 of the present embodiment will be described with reference to FIG. 8.

[Step S101]

Upon receipt of a read instruction from the host device 300, the memory controller 200 issues a read request to the NAND flash memory 100.

[Step S102]

Upon receipt of the read request from the memory controller 200, the NAND flash memory 100 executes a first operation. The first operation is an operation for obtaining data for a third operation to be described later. Details of the first operation will be described later.

[Step S103]

Upon completion of the first operation, the NAND flash memory 100 executes a second operation. The second operation is an operation for obtaining data for the third operation to be described later. Details of the second operation will be described later.

[Step S104]

Upon completion of the second operation, the NAND flash memory 100 executes the third operation. Details of the third operation will be described later. By this third operation, normal read data and soft bit data are stored in a latch circuit in the sense circuit 140.

[Step S105]

The NAND flash memory 100 outputs normal read data based on the results of the first to third operations.

[Step S106]

Upon receipt of the normal read data, the ECC circuit 206 performs an error correction operation.

[Step S107]

The memory controller 200 determines whether or not error correction of the received data by the ECC circuit 206 has been completed.

[Step S108]

When determining that the error correction of the received data has been completed (YES in step S107), the memory controller 200 determines whether or not the read instruction has been completed. When determining that the read instruction has been completed (YES in step S108), the memory controller 200 completes the read operation. When determining that the read instruction has not been completed (NO in step S108), the memory controller 200 executes step S101 again.

[Step S109]

When determining that the error correction of the received data has not been completed (NO in step S107), the memory controller 200 issues a request to read soft bit data to the NAND flash memory 100.

[Step S110]

The NAND flash memory 100 transfers the soft bit data read in step S104 to a predetermined latch circuit. Details of the transfer operation will be described later.

[Step S111]

The NAND flash memory 100 outputs the soft bit data.

[Step S112]

Upon receipt of the soft bit data, the ECC circuit 206 performs an error correction operation using an LPDC code.

[Step S113]

The memory controller 200 determines whether or not the error correction using the soft bit data has been completed.

[Step S114]

When determining that the error correction using the soft bit data has not been completed (NO in step S113), the memory controller 200 issues "fail" to the host device 300.

[Step S115]

When determining that the error correction using the soft bit data has been completed (YES in step S113), the memory controller 200 determines whether or not the read instruction has been completed. When determining that the read instruction has been completed (YES in step S115), the memory controller 200 completes the read operation. When determining that the read instruction has not been completed (NO in step S115), the memory controller 200 executes step S101 again.

<1-2-2> First Operation

The first operation of step S102 in FIG. 6 will be described with reference to FIG. 7.

[Step S201]

The sequencer 111 performs a first read operation on the memory cell array 130.

The first read operation will be described with reference to FIG. 8.

The first read operation is an operation of reading data from a memory cell transistor MTn+1 coupled to a word line (also referred to as a provisionally-selected word line) WLn+1 adjacent to a selected word line WLn on the drain side.

The threshold distributions may be shifted as the selected memory cell transistor MTn receives an inter-cell interference effect from an adjacent memory cell transistor MTn+1. The first read operation is a read operation for compensating for the inter-cell interference effect. Data read in the first read operation is used in the third operation to be described later in order to correct read data.

In this example, the case where word line WL2 is the selected word line WLn will be described.

Figure 8:
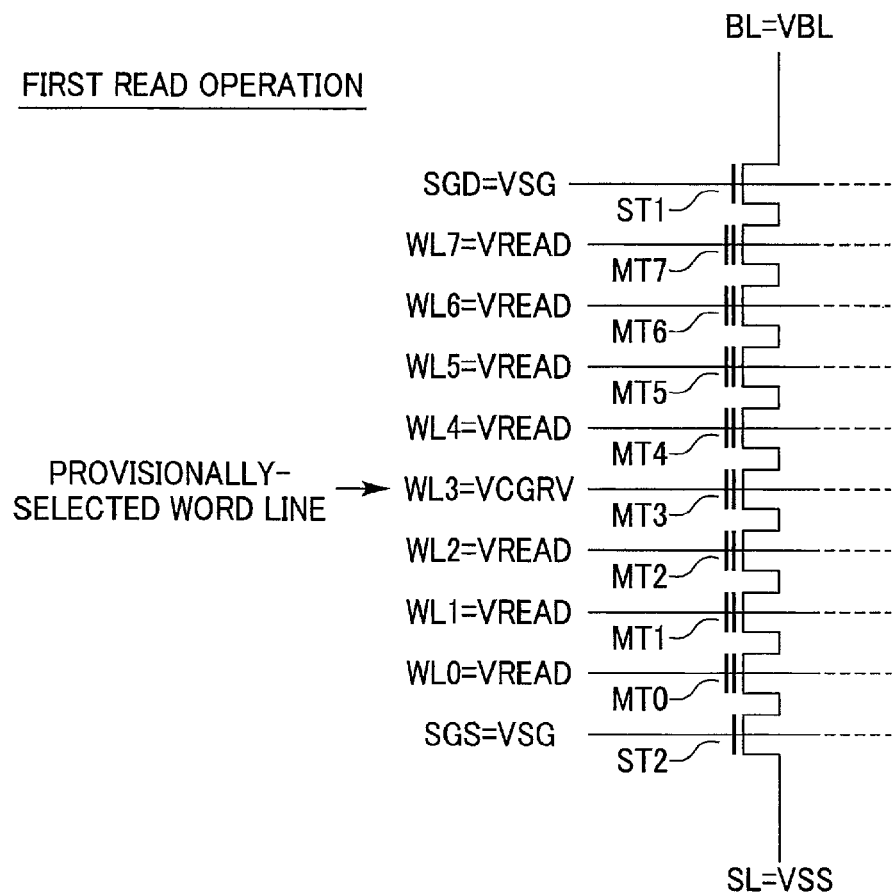
FIG. 8 is a circuit diagram of a NAND string in a first read operation, and shows the voltage of each line.

As shown in FIG. 8, in the first read operation, the sense amplifier SA supplies a current to the bit line BL to precharge it to, for example, voltage VBL. The row decoder 150 applies positive voltage VCGRV to a provisionally-selected word line WL3, and applies positive voltage VREAD to the other selected word lines WL0 to WL2 and WL4 to WL7. Voltage VCGRV changes in accordance with data to be read, and is, for example, voltage VA mentioned in connection with FIG. 5. Voltage VREAD is a voltage that turns on memory cell transistors MT regardless of stored data, and satisfies VCGRV<VREAD.

Then, the row decoder 150 applies positive voltage VSG to the selected select gate lines SGD and SGS.

As a result, the select transistors ST and memory cell transistors MT0 to MT2 and MT4 to MT7 are turned on, and memory cell transistor MT3 is turned on or off based on the relationship between the stored data and VCGRV.

Figure 9:
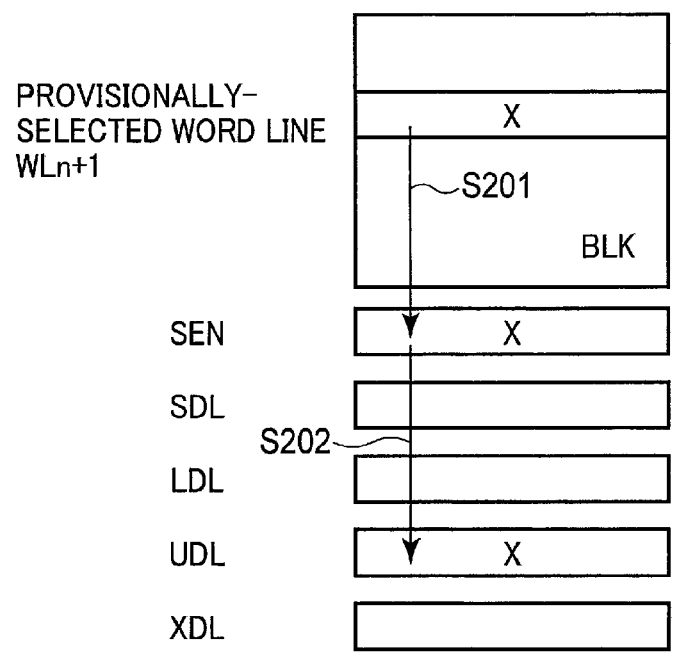
FIG. 9 is a diagram showing a flow of data in the first operation.

As shown in FIG. 9, in the first read operation, data (X) is read from the memory cell transistor MTn+1 coupled to word line WL3 out to the sense amplifier SA (node SEN). This data (X) is used for compensating for the inter-cell interference effect.

[Step S202]

When data (X) is read out to the sense amplifier unit SA (node SEN), the sequencer 111 supplies control signal STB to the sense amplifier SA. As shown in FIG. 9, the sense amplifier SA transfers read data (X) of node SEN to latch circuit UDL at the time when signal STB is asserted. As a result, read data (X) is stored in latch circuit UDL.

<1-2-3> Second Operation

The second operation of step S103 in FIG. 6 will be described with reference to FIG. 10.

[Step S301]

The sequencer 111 performs a second read operation on the memory cell array 130.

The second read operation will be described with reference to FIG. 11.

The second read operation is an operation of reading data from selected word line WL2, which is the original read target.

As shown in FIG. 11, in the second read operation, the sense amplifier SA precharges the bit line BL to, for example, voltage VBL. The row decoder 150 applies positive voltage VCGRV to the selected word line WL2, and applies positive voltage VREAD to the other unselected word lines WL0, WL1, and WL3 to WL7.

As shown in FIG. 12, in the second read operation, data (Y) is read from the selected memory cell transistor MT2 coupled to word line WL2 out to the sense amplifier SA (node SEN). This data (Y) is used when generating normal read data and soft bit data.

[Step S302]

When data (Y) is read out to the sense amplifier SA (node SEN) the sequencer 111 supplies control signal STB to the sense amplifier SA. As shown in FIG. 12, the sense amplifier SA transfers read data (Y) of node SEN to latch circuit LDL at the time when signal STB is asserted. Then, the arithmetic operation section OP inverts data (Y) of latch circuit LDL to generate data (~Y). Consequently, data (~Y) is stored in latch circuit LDL.

[Step S303]

As shown in FIG. 12, the sequencer 111 transfers data (~Y) stored in latch circuit LDL to latch circuit XDL. Consequently, data (~Y) is stored in latch circuit XDL.

<1-2-4> Third Operation

The third operation of step S104 in FIG. 6 will be described with reference to FIG. 13.

[Step S401]

The sequencer 111 performs a third read operation on the memory cell array 130.

The third read operation will be described with reference to FIG. 14.

The third read operation is an operation of reading data from word line WL2, which is the original read target.

Figure 14:
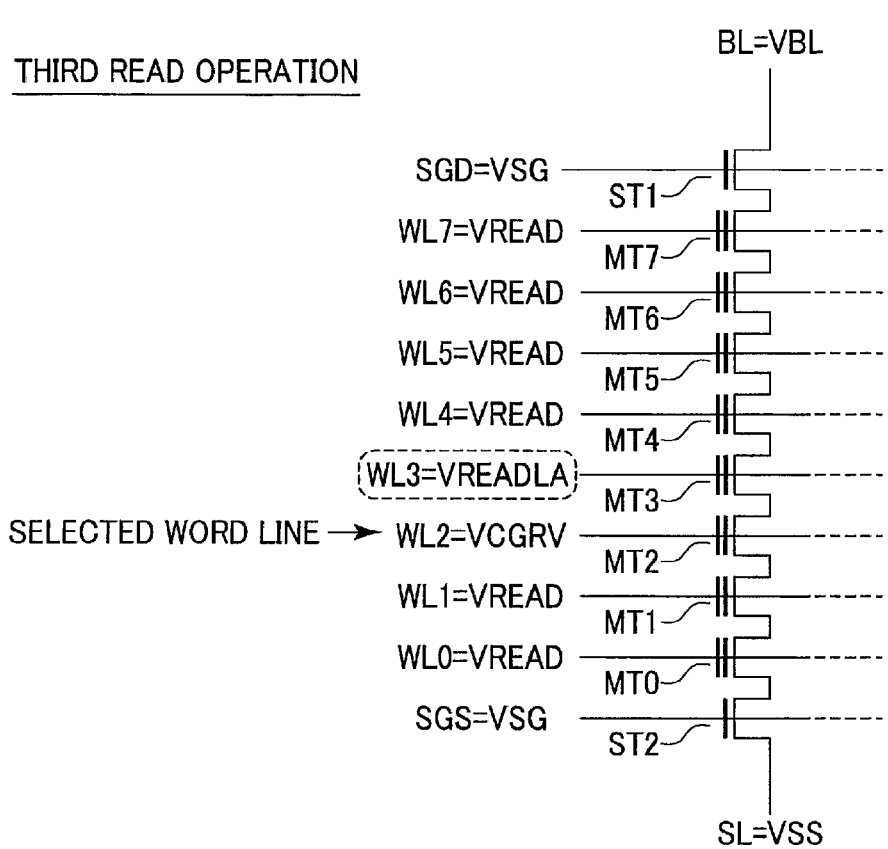
FIG. 14 is a circuit diagram of the NAND string in a third read operation, and shows the voltage of each line.

As shown in FIG. 14, in the third read operation, the sense amplifier SA precharges the bit line BL to, for example, voltage VBL. The row decoder 150 applies positive voltage VCGRV to the selected word line WL2, applies voltage VREADLA to the unselected word line WL3 adjacent to the selected word line WL2 on the drain side, and applies positive voltage VREAD to the other unselected word lines WL0, WL1, and WL4 to WL7.

The third read operation is different from the second read operation in that voltage VREADLA is applied to unselected word line WL3, which is the first read operation target.

Like voltage VREAD, voltage VREADLA is a voltage that turns on memory cell transistors MT regardless of stored data. Voltage VREADLA is a voltage for compensating for the influence of the threshold shift caused by the inter-cell interference effect to be described later, and has a different value from VREAD.

Figure 15:
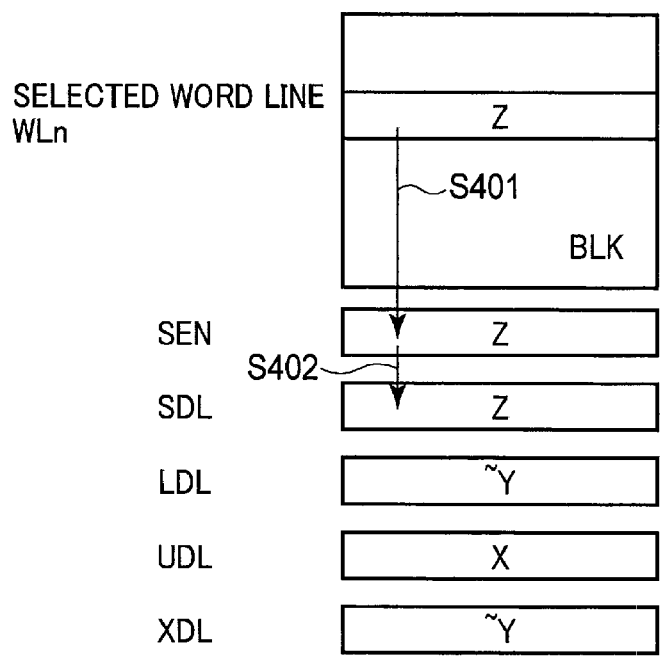
FIG. 15 is a diagram showing a flow of data in a third operation.

As shown in FIG. 15, in the third read operation, data (Z) is read from the selected memory cell transistor MT2 coupled to the selected word line WL2 out to the sense amplifier SA (node SEN). This data (Z) is used when generating normal read data and soft bit data.

[Step S402]

When data (Z) is read out to the sense amplifier SA (node SEN), the sequencer 111 supplies control signal STB to the sense amplifier SA. As shown in FIG. 15, the sense amplifier SA transfers read data (Z) of node SEN to latch circuit SDL at the time when signal STB is asserted. As a result, data (Z) is stored in latch circuit SDL.

[Step S403]

Figure 16:
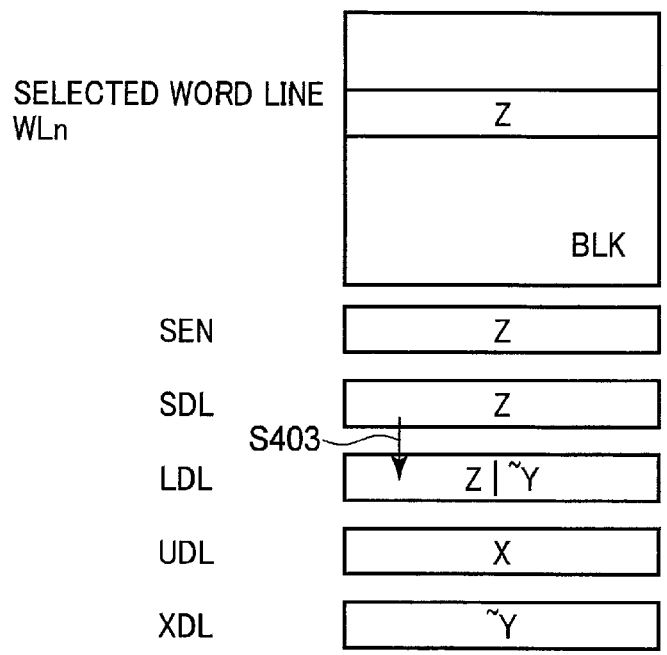
FIG. 16 is a diagram showing a flow of data in the third operation.

As shown in FIG. 16, the arithmetic operation section OP performs an OR operation (SDL|LDL) of the data (Z) stored in latch circuit SDL and the data (~Y) stored in latch circuit LDL to generate data (Z|~Y), and stores it in latch circuit LDL. In the present embodiment, data (Z|~Y) stored in latch circuit LDL is used as soft bit data.

[Step S404]

Figure 17:
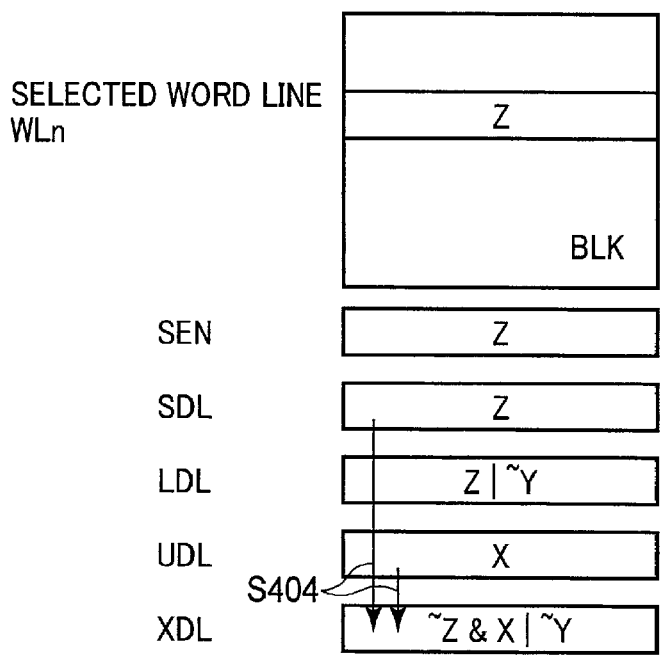
FIG. 17 is a diagram showing a flow of data in the third operation.

As shown in FIG. 17, the arithmetic operation section OP performs an AND operation (~SDL&UDL) of the inversion data (~Z) of the data (Z) stored in latch circuit SDL and the data (X) stored in latch circuit UDL. Subsequently, the arithmetic operation section OP performs an OR operation (~SDL&UDL|XDL) of the result (~Z&X) of the AND operation and the data (~Y) stored in latch circuit XDL to generate data (~Z&X|~Y), and stores it in latch circuit XDL. The data (~Z&X|~Y) stored in latch circuit XDL is data (normal read data) with allowance for the threshold shift caused by the inter-cell interference effect from the memory cell transistor MT coupled to word line WLn+1 adjacent to selected word line WLn.

<1-2-5> Data Transfer Operation

The data transfer operation of step S110 in FIG. 6 will be described.

Upon receipt of a request to read soft bit data from the memory controller 200, the sequencer 111 transfers the data (Z|~Y) stored in latch circuit LDL to latch circuit XDL.

<1-3> Soft Bit Data Generation Method
<1-3-1> Shift of Threshold Distributions of Selected Memory Cell Transistors Here, in order to facilitate understanding of the principle of generation of soft bit data, the shift of the threshold distributions of selected memory cell transistors MT will be described.

The shift of the threshold distributions of selected memory cell transistors MT will be described with reference to FIG. 18.

Distribution E1 shown in FIG. 18 is an ideal threshold distribution of "E-level".

Thresholds in distribution E1 may be shifted due to the inter-cell interference effect from an adjacent memory cell transistor. As shown in FIG. 18, distribution E2 is the threshold distribution of "E-level" in the case where thresholds are shifted due to the inter-cell interference effect from an adjacent memory cell transistor. Thresholds in distribution E2 are larger than those in distribution E1 due to the inter-cell interference effect from an adjacent memory cell transistor.

Thresholds in distribution E2 may be shifted due to application of voltage VREADLA to an adjacent word line WL in the third read operation. As shown in FIG. 18, distribution E3 is the threshold distribution of "E-level" expected in the case of the third read operation. In the case of distribution E3, the potential of voltage VCGRV applied to the selected word line WLn is increased in appearance by application of voltage VREADLA to word line WLn+1 adjacent to the selected word line WLn. Therefore, thresholds in distribution E3 are larger than those in distribution E2.

Distribution A1 shown in FIG. 18 is an ideal threshold distribution of "A-level".

Distribution A2 shown in FIG. 18 is the threshold distribution of "A-level" in the case where thresholds are shifted due to the inter-cell interference effect from an adjacent memory cell transistor. Thresholds in distribution A2 are larger than those in distribution A1 due to the inter-cell interference effect from an adjacent memory cell transistor.

Distribution A3 shown in FIG. 18 is the threshold distribution of "A-level" expected in the case of the third read operation. In the case of distribution A3, the threshold distribution is shifted rightward in appearance by application of voltage VREADLA to word line WLn+1 adjacent to the selected word line WLn. Therefore, thresholds in distribution A3 are larger than those in distribution A2.

As shown in FIG. 18, in the second read operation, voltage VCGRV (VA) is applied to the selected word line WLn. In the third read operation, the potential of voltage VCGRV applied to the selected word line WLn is increased to VAD (VA<VAD) by application of voltage VREADLA to word line WLn+1 adjacent to the selected word line WLn.

Meanwhile, the selected memory cell transistor MT may receive an inter-cell interference effect larger than expected from an adjacent memory cell transistor.

In such a case, as shown in FIG. 19, the shift amounts of distribution E2, distribution E3, distribution A2, and distribution A3 are larger than the expected shift amounts.

In the case shown in FIG. 19, distribution E2 may reach or exceed voltage VA in the third read operation. Such a case is treated as mistake (error) M1.

On the other hand, the selected memory cell transistor MT may receive an inter-cell interference effect smaller than expected from an adjacent memory cell transistor.

In such a case, as shown in FIG. 20, the shift amounts of distribution E2, distribution E3, distribution A2, and distribution A3 are smaller than the expected shift amounts.

In the case shown in FIG. 20, distribution A3 may reach or fall below voltage VAD in the third read operation. Such a case is treated as mistake M2.

<1-3-2> Operation Example of Latch Circuit

A specific example of data stored in the latch circuits will be described with reference to FIGS. 21 to 25.

FIG. 21 shows the relationship between data of the selected memory cell transistor MTn coupled to the selected word line WLn and data of the memory cell transistor MTn+1 coupled to word line WLn+1 adjacent to the selected word line WLn. FIG. 21 also shows the relationship between the magnitude of the inter-cell interference effect on the selected memory cell transistor MTn from memory cell transistor MTn+1 and data stored in the selected memory cell transistor MTn. Hereinafter, when simply referred to as "an inter-cell interference effect", an inter-cell interference effect means an inter-cell interference effect on the selected memory cell transistor MTn from memory cell transistor MTn+1.

Figure 6:
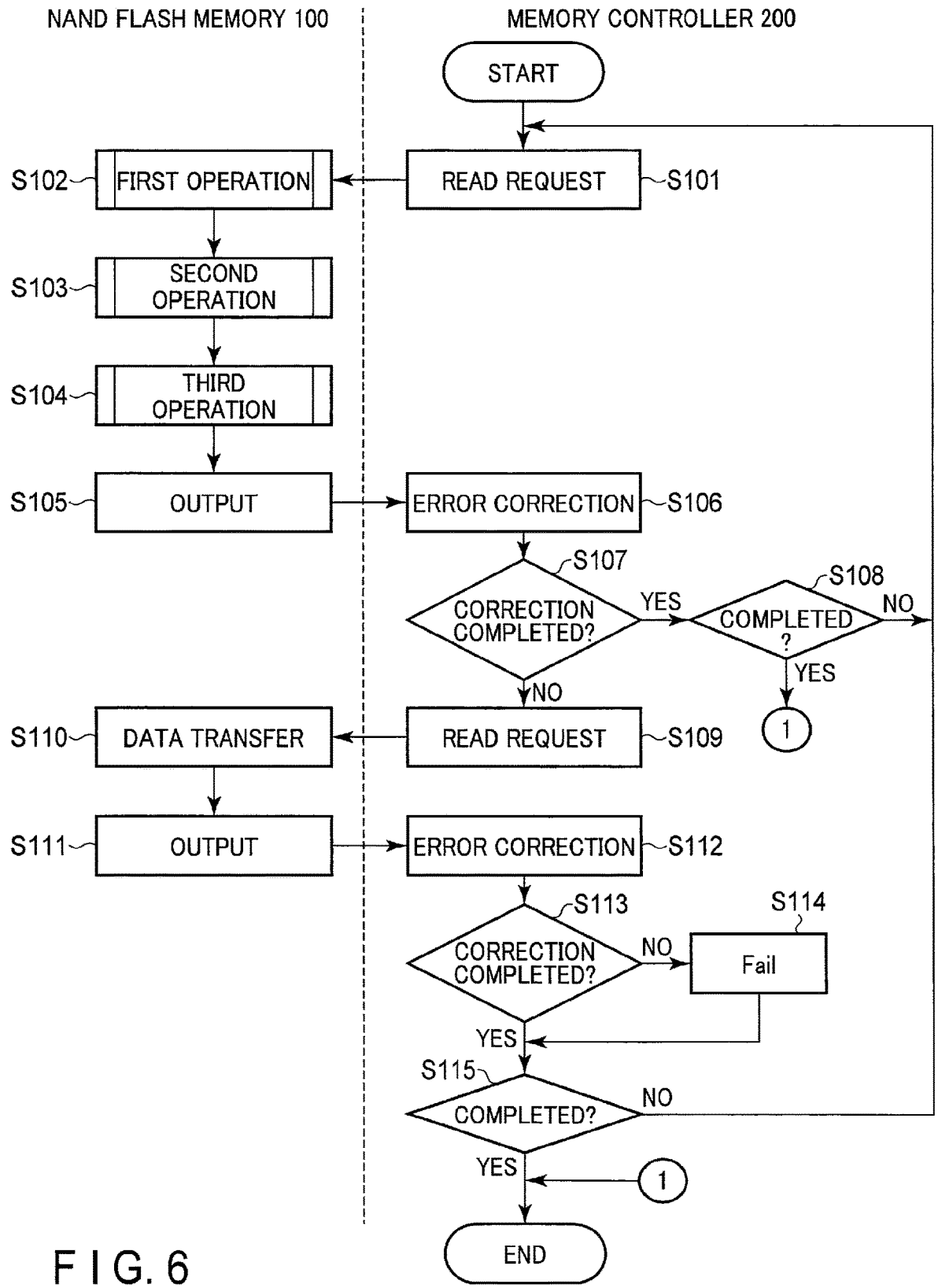
FIG. 6 is a flowchart showing a read operation of the memory system according to the first embodiment.
Figure 7:
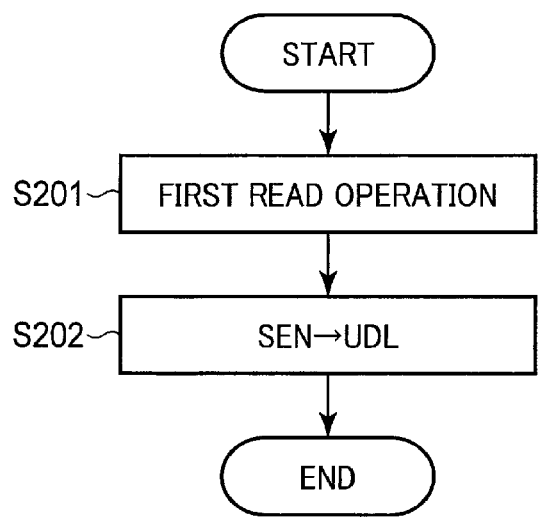
FIG. 7 is a flowchart showing a first operation.

FIG. 21 is a diagram showing the states after inversion data of memory cell transistor MTn+1 is stored in latch circuit UDL by step S102 in FIG. 6.

Here, the relationship between the data of the selected memory cell transistor MTn, the data of memory cell transistor MTn+1, and the inter-cell interference effect will be described, while focusing on part of FIG. 21.

For example, when memory cell transistor MTn+1 stores "E" ("0" is stored in UDL) and the inter-cell interference effect is small (see "small" of the Effect in the figure), the data read by the sense amplifier SA from the selected memory cell transistor MTn in which "E" is stored is "0".

Similarly, when memory cell transistor MTn+1 stores "A" ("1" is stored in UDL) and the inter-cell interference effect is small, the data read by the sense amplifier SA from the selected memory cell transistor MTn in which "E" is stored is "0".

In contrast, when cell transistor MTn+1 stores "E" and the inter-cell interference effect is large (see "large" of the Effect in the figure), the data read by the sense amplifier SA from the selected memory cell transistor MTn in which "E" is stored is "1". This is erroneous data corresponding to mistake M1 in FIG. 19.

When memory cell transistor MTn+1 stores "A" ("1" is stored in UDL) and the inter-cell interference effect is large, the data read by the sense amplifier SA from the selected memory cell transistor MTn in which "E" is stored is "1". This is erroneous data corresponding to mistake M1 in FIG. 19.

As described above, the data stored in the selected memory cell transistor MTn coupled to the selected word line WLn may be different from the read data, depending on the data stored in the memory cell transistor MTn+1 coupled to word line WLn+1 adjacent to the selected word line WLn.

Figure 10:
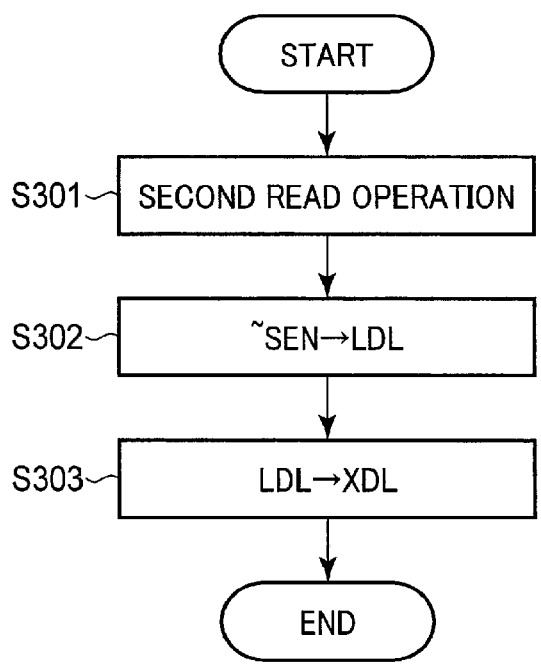
FIG. 10 is a flowchart showing a second operation.

As shown in FIG. 21, in step S302 in FIG. 10, inversion data of the sense amplifier SA (node SEN) is input to latch circuit LDL. Therefore, data of mistake M1 is stored as "0" data in latch circuit LDL.

Then, as shown in FIG. 22, in step S303 in FIG. 10, the data of latch circuit LDL is transferred to latch circuit XDL.

The data stored in the latch circuits in the third read operation will be described with reference to FIG. 23.

As shown in FIG. 23, for example, when memory cell transistor MTn+1 stores "E" ("0" is stored in UDL) and the inter-cell interference effect is small, the data read by the sense amplifier SA from the selected memory cell transistor MTn in which "A" is stored is "0". This is erroneous data corresponding to mistake M2 in FIG. 20.

Similarly, when memory cell transistor MTn+1 stores "A" ("1" is stored in UDL) and the inter-cell interference effect is small, the data read by the sense amplifier SA from the selected memory cell transistor MTn in which "A" is stored is "0". This is erroneous data corresponding to mistake M2 in FIG. 20.

In contrast, when memory cell transistor MTn+1 stores "E" and the inter-cell interference effect is large, the data read by the sense amplifier SA from the selected memory cell transistor MTn in which "A" is stored is "1".

When memory cell transistor MTn+1 stores "A" ("1" is stored in UDL) and the inter-cell interference effect is large, the data read by the sense amplifier SA from the selected memory cell transistor MTn in which "A" is stored is "1".

As shown in FIG. 23, in step S402 in FIG. 13, the data of the sense amplifier SA (node SEN) is input to latch circuit SDL. Therefore, data of mistake M2 is stored as "0" data in latch circuit SDL.

As shown in FIG. 24, in step S403 in FIG. 13, an OR operation (SDL|LDL) is performed, and the operation result is stored in latch circuit LDL. Data of mistake M1 and mistake M2 is stored as "0" data in latch circuit LDL.

As shown in FIG. 25, in step S404 in FIG. 13, a logical operation (~SDL&UDL|XDL) is performed, and the operation result is stored in latch circuit XDL. The data stored in latch circuit XDL is output as normal read data.

As shown in FIG. 25, read data is stored in latch circuit XDL, and soft bit data is stored in latch circuit LDL.

Figure 26:
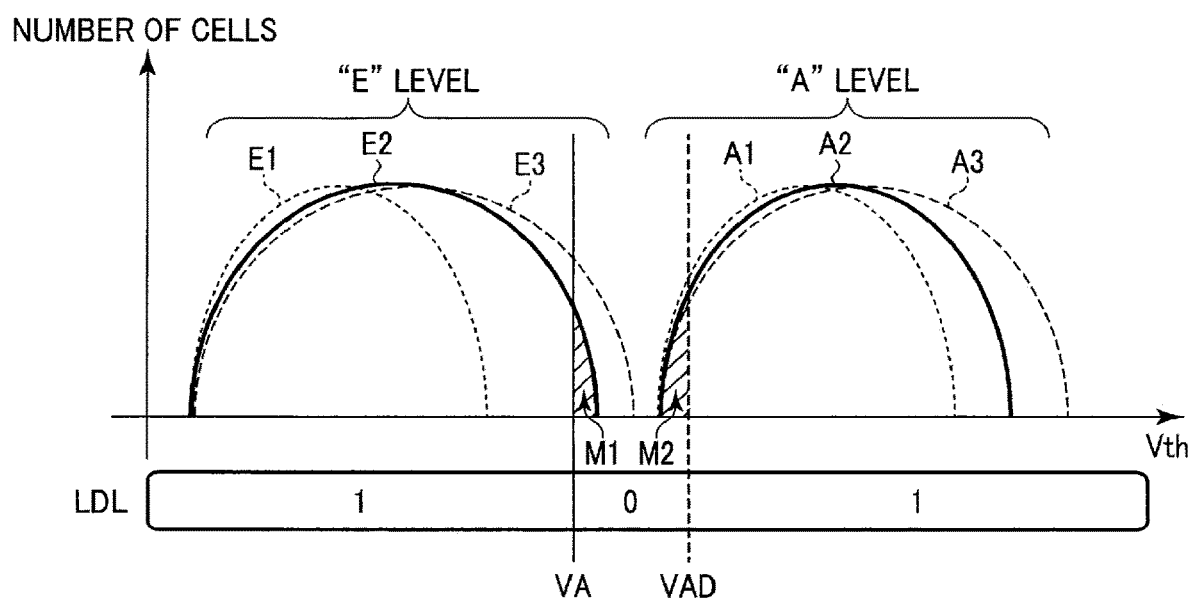
FIG. 26 is a diagram showing the relationship between the threshold distributions of memory cell transistors and data stored in a latch circuit.

As shown in FIG. 26, according to the present embodiment, when mistake M1 occurs or when mistake M2 occurs, "0" data is stored in latch circuit LDL. That is, in the present embodiment, even when different types of mistakes (mistake M1 and mistake M2) occur, a certain value ("0" data) is stored in latch circuit LDL. That is, the memory system 1 can obtain soft bit data without newly performing a read operation for reading soft bit data. As a result, a read time for the soft bit can be saved when performing ECC.

<1-4> Command Sequence

Figure 27:
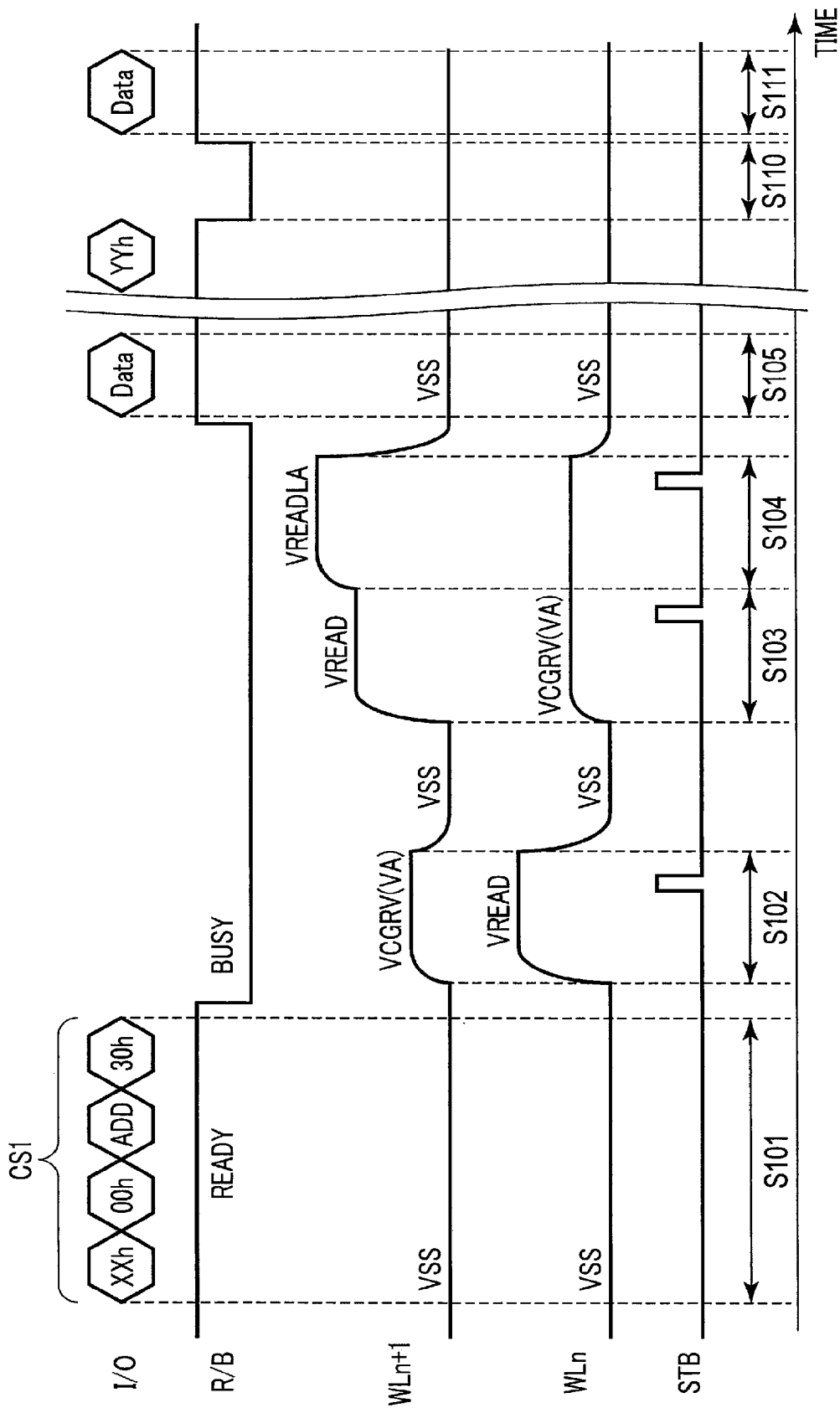
FIG. 27 is a command sequence showing the read operation of the memory system according to the first embodiment.

A command sequence in the read operation of the memory system 1 according to the present embodiment will be described with reference to FIG. 27.

For the read operation, the memory controller 200 according to the present embodiment issues a prefix command (for example, "XXh") to perform a read operation to the NAND flash memory 100. Subsequently, the memory controller 200 issues a command (for example, "00h") and an address (including a column address, a block address, and a page address) to the NAND flash memory 100. After that, the memory controller 200 issues a command (for example, "30h") to the NAND flash memory 100.

When command "30h" is set in the register 112, the NAND flash memory 100 starts an operation to read data from the memory cell array 130, and enters the busy state.

Then, the NAND flash memory 100 executes steps S102 to S105 in FIG. 6.

Thereafter, when the NAND flash memory 100 enters the ready state, data read from the memory cell array 130 is transmitted to the memory controller 200.

When executing a read request in step S109 in FIG. 6, the memory controller 200 issues a command (for example, "YYh") to the NAND flash memory 100.

When command "YYh" is set in the register 112, the NAND flash memory 100 performs the operations of steps S110 and S111 in FIG. 6.

<1-5> Advantage

According to the above-described embodiment, normal read data and soft bit data can be obtained through a series of read operations by performing arithmetic operations on the results of the first to third read operations using latch circuits.

When reading soft bit data, a method of reading soft bit data by applying voltages VA− and VA+ to the selected word line WL in addition to the normal read operation (comparative example) is conceivable. That is, in the case of the comparative example, the NAND flash memory needs to perform a read operation for reading soft bit data in step S110 in FIG. 6 of the above-described embodiment.

However, in the memory system according to the present embodiment, soft bit data is generated by performing the above-described first to third read operations. More specifically, in the present embodiment, normal read data and soft bit data are derived by utilizing the shift of the threshold distributions caused by the inter-cell interference effect and the shift of threshold distributions caused by the third read operation. In other words, in the present embodiment, two types of data are read through a series of read operations.

That is, in the present embodiment, soft bit data has already been read when step S110 of FIG. 6 is performed. The transfer operation of step S110 in FIG. 6 is performed at a higher speed than the normal read operation. Therefore, the NAND type flash memory according to the present embodiment can output soft bit data faster than the NAND type flash memory according to the comparative example.

<2> Second Embodiment

Next, the second embodiment will be described. In the second embodiment, a case where the memory cell transistors MT can store 2-bit data will be described. The basic configuration and basic operation of the memory system according to the second embodiment are similar to those of the memory system according to the above-described first embodiment. Thus, descriptions of matters described in the first embodiment and matters easily inferable from the first embodiment will be omitted.

<2-1> Threshold Distributions of Memory Cell Transistors

Data that may be held in the memory cell transistors MT, and threshold distributions of the memory cell transistors MT according to the second embodiment will be described with reference to FIG. 28.

In this example, one memory cell transistor MT can hold, for example, 2-bit data. This 2-bit data will be referred to as a lower bit and an upper bit. The set of lower bits held by the memory cells coupled to the same word line is called a lower page, and the set of upper bits is called an upper page.

Figure 28:
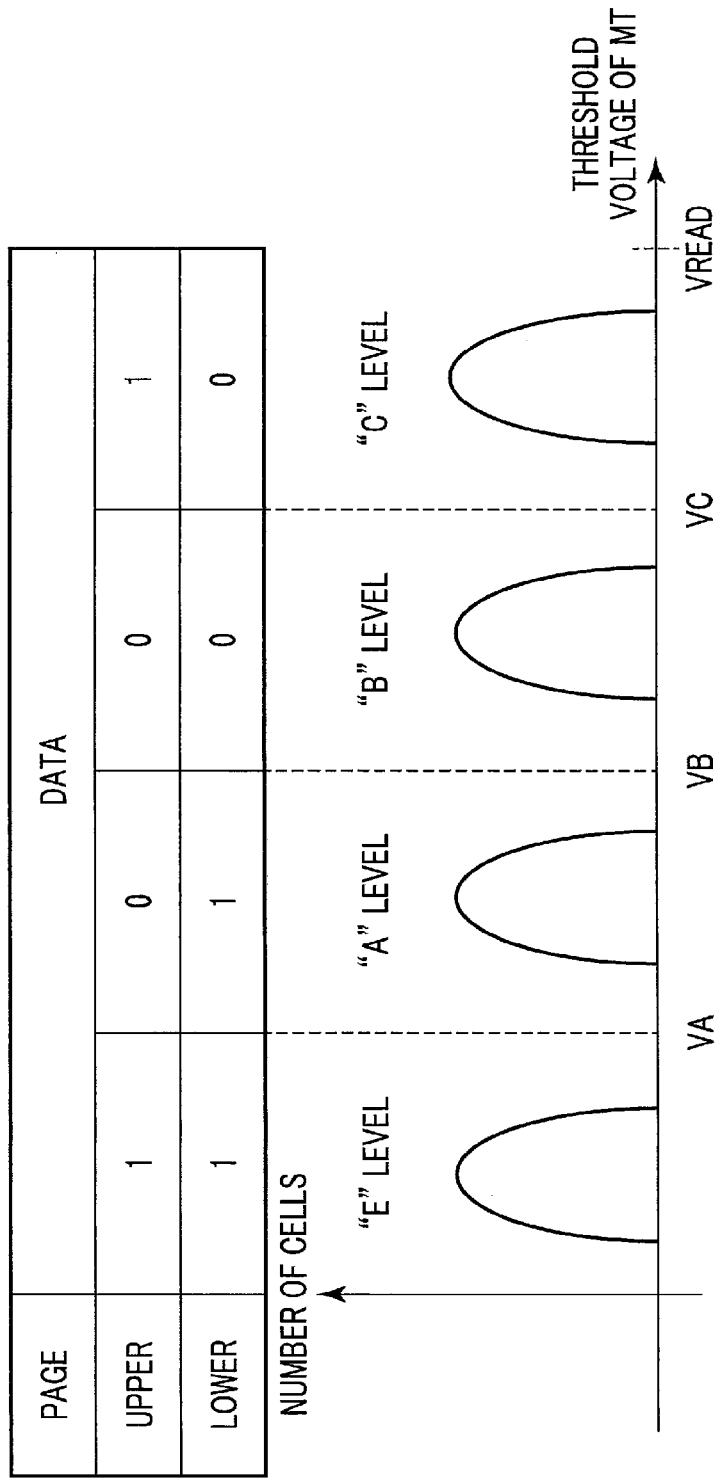
FIG. 28 is a diagram showing data that may be held in memory transistors and threshold distributions thereof.

As shown in FIG. 28, each memory cell transistor MT can hold, for example, 2-bit data in accordance with its threshold value. The 2-bit data is, for example, "11", "01", "00", and "10" in ascending order of threshold.

The threshold of a memory cell holding "11" data is in an "E" level. The "E" level is a level of thresholds of a state where charge in the charge storage layer is drawn out and data is erased, which are each a positive or negative value (for example, smaller than voltage VA).

"01", "00", and "10" are thresholds of a state where charge is injected into the charge storage layer and data is written. The threshold value of a memory cell that holds "01" data is in an "A" level, which is higher than the "E" level (for example, voltage VA or higher, and lower than VB, VA<VB). The threshold value of a memory cell that holds "00" data is in a "B" level, which is higher than the "A" level (for example, voltage VB or higher, and lower than VC, VB<VC). The threshold value of a memory cell that holds "10" data is in a "C" level, which is higher than the "B" level (for example, voltage VC or higher).

Of course, the relationship between 2-bit data and thresholds is not limited to the above and, for example, "11" data may correspond to the "C" level, and the relationship can be selected as appropriate.

By applying voltage VB to the selected word line WLn, lower-bit data can be read. By applying voltages VA and VC to the selected word line WLn, upper-bit data can be read.

<2-2> Data Read Operation

Next, a read operation according to the present embodiment will be described. Here, an operation to read normal read data and soft bit data will be described.

<2-2-1> Flow of Read Operation

A rough flow of the read operation of the memory system 1 of the present embodiment will be described with reference to FIG. 29.

[Step S501]

The memory controller 200 performs the same operation as that of step S101.

[Step S502]

The NAND flash memory 100 determines whether or not the received read request is a lower page read operation.

[Step S503]

When determining that the received read request is a lower page read operation (YES in step S502), the NAND flash memory 100 performs a lower page read operation. Details of the lower page read operation will be described later.

[Step S504]

When determining that the received read request is not a lower page read operation (NO in step S502), the NAND flash memory 100 performs an upper page read operation. Details of the upper page read operation will be described later.

[Steps S505 to S515]

The memory system 1 performs the same operations as those of steps S105 to S115.

<2-2-2> Lower Page Read Operation

<2-2-2-1> Flow of Lower Page Read Operation

A rough flow of the lower page read operation of the memory system 1 of the present embodiment will be described with reference to FIG. 30.

[Step S601]

Upon receipt of a read request from the memory controller 200, the NAND flash memory 100 executes a fourth operation. The fourth operation is an operation for obtaining data for a sixth operation to be described later. Details of the fourth operation will be described later.

[Step S602]

Upon completion of the fourth operation, the NAND flash memory 100 executes a fifth operation. The fifth operation is an operation for obtaining data for the sixth operation to be described later. Details of the fifth operation will be described later.

[Step S603]

Upon completion of the fifth operation, the NAND flash memory 100 executes the sixth operation. Details of the sixth operation will be described later. By this sixth operation, normal read data and soft bit data are stored in a latch circuit in the sense circuit 140.

<2-2-2-2> Fourth Operation

The fourth operation of step S601 in FIG. 30 will be described with reference to FIG. 31.

[Step S701]

The sequencer 111 performs a first read operation on the lower page of the memory cell array 130. The first read operation is the same as the operation described with reference to FIG. 8 except that voltage VCGRV (VB) is applied to the provisionally-selected word line WLn+1. In this example, the case where word line WL2 is the selected word line WLn and word line WL3 is the provisionally-selected word line WLn+1 will be described.

Figure 32:
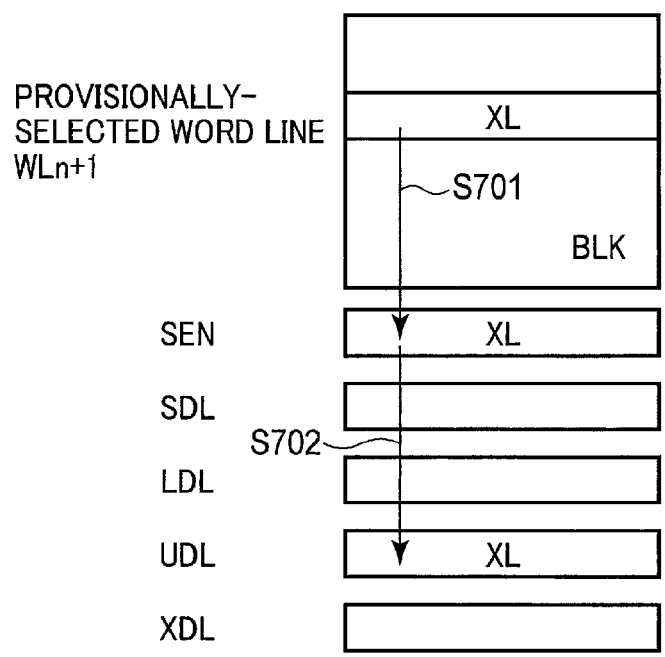
FIG. 32 is a diagram showing a flow of data in the fourth operation.

As shown in FIG. 32, in the first read operation, the lower-page (lower-bit) data (XL) is read from the memory cell transistor MTn+1 coupled to the provisionally-selected word line WL3 out to the sense amplifier SA (node SEN). This data (XL) is used for compensating for the inter-cell interference effect.

[Step S702]

As shown in FIG. 32, read data (XL) is stored in latch circuit UDL as in step S202.

<2-2-2-3> Fifth Operation

The fifth operation of step S602 in FIG. 30 will be described with reference to FIG. 33.

[Step S801]

The sequencer 111 performs a second read operation on the lower page of the memory cell array 130. The second read operation is the same as the operation described with reference to FIG. 11 except that voltage VCGRV (VB) is applied to the selected word line WLn.

As shown in FIG. 34, in the second read operation, lower-page (lower-bit) data (YL) is read from the selected memory cell transistor MT2 coupled to word line WL2 out to the sense amplifier SA (node SEN). This data (YL) is used when generating normal read data and soft bit data.

[Step S802]

As shown in FIG. 34, data (~YL) is stored in latch circuit LDL as in step S302.

[Step S803]

As shown in FIG. 34, data (~YL) is stored in latch circuit XDL as in step S303.

<2-2-2-4> Sixth Operation

The sixth operation of step S603 in FIG. 30 will be described with reference to FIG. 35.

[Step S901]

The sequencer 111 performs a third read operation on the lower page of the memory cell array 130. The third read operation is the same as the operation described with reference to FIG. 14 except that voltage VCGRV (VB) is applied to the selected word line WLn.

Figure 36:
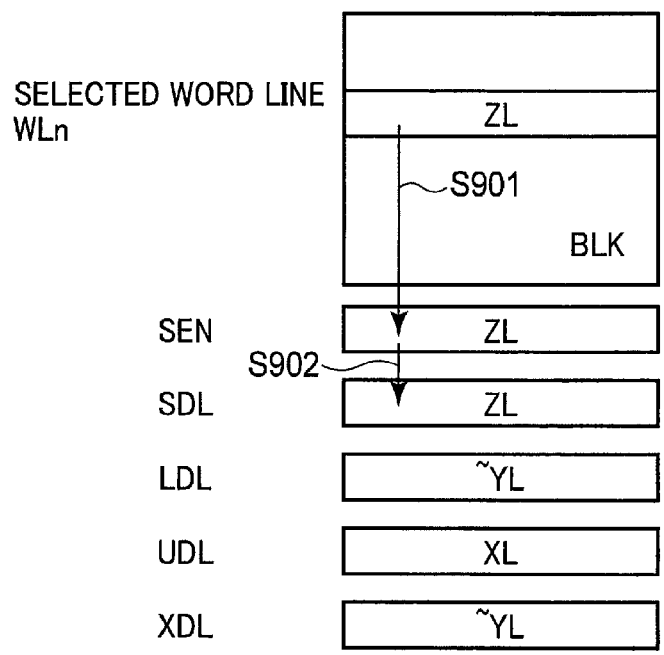
FIG. 36 is a diagram showing a flow of data in the sixth operation.

As shown in FIG. 36, in the third read operation, lower-page (lower-bit) data (ZL) is read from the selected memory cell transistor MT2 coupled to the selected word line WL2 out to the sense amplifier SA (node SEN). This data (ZL) is used when generating normal read data and soft bit data.

[Step S902]

As shown in FIG. 36, data (ZL) is stored in latch circuit SDL as in step S402.

[Step S903]

Figure 37:
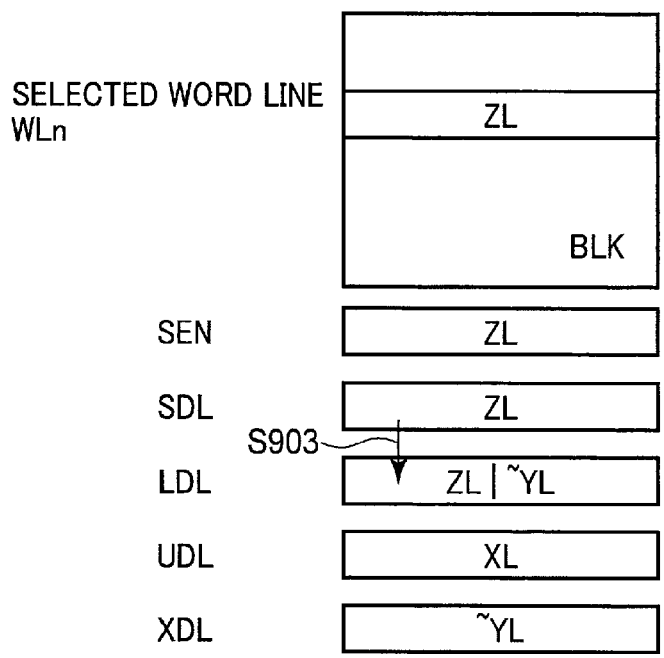
FIG. 37 is a diagram showing a flow of data in the sixth operation.

As shown in FIG. 37, data (ZL|~YL) is stored in latch circuit LDL as in step S403. In the present embodiment, data (ZL|~YL) stored in latch circuit LDL is used as soft bit data.

[Step S904]

Figure 38:
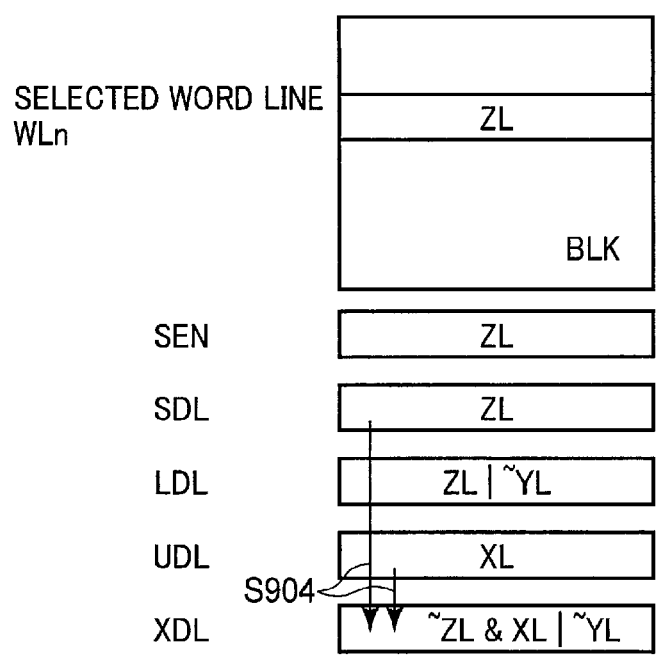
FIG. 38 is a diagram showing a flow of data in the sixth operation

As shown in FIG. 38, data (~ZL&XL|~YL) is stored in latch circuit XDL as in step S404. The data (~ZL&XL|~YL) stored in latch circuit XDL is data (normal read data) with allowance for the threshold shift caused by the inter-cell interference effect from the memory cell transistor MT coupled to word line WLn+1 adjacent to selected word line WLn.

<2-2-3> Upper Page Read Operation
<2-2-3-1> Flow of Upper Page Read Operation A rough flow of the upper page read operation of the memory system 1 of the present embodiment will be described with reference to FIG. 39.

[Step S1001]

Upon receipt of a read request from the memory controller 200, the NAND flash memory 100 executes a seventh operation. The seventh operation is an operation for obtaining data for a twelfth operation to be described later. Details of the seventh operation will be described later.

[Step S1002]

Upon completion of the seventh operation, the NAND flash memory 100 executes an eighth operation. The eighth operation is an operation for obtaining data for the twelfth operation to be described later. Details of the eighth operation will be described later.

[Step S1003]

Upon completion of the eighth operation, the NAND flash memory 100 executes a ninth operation. The ninth operation is an operation for obtaining data for the twelfth operation to be described later. Details of the ninth operation will be described later.

[Step S1004]

Upon completion of the ninth operation, the NAND flash memory 100 executes a tenth operation. The tenth operation is an operation for obtaining data for the twelfth operation to be described later. Details of the tenth operation will be described later.

[Step S1005]

Upon completion of the tenth operation, the NAND flash memory 100 executes an eleventh operation. The eleventh operation is an operation for obtaining data for the twelfth operation to be described later. Details of the eleventh operation will be described later.

[Step S1006]

Upon completion of the eleventh operation, the NAND flash memory 100 executes the twelfth operation. Details of the twelfth operation will be described later. By this twelfth operation, normal read data and soft bit data are stored in a latch circuit in the sense circuit 140.

<2-2-3-2> Seventh Operation

The seventh operation of step S1001 in FIG. 39 will be described with reference to FIG. 40.

[Step S1101]

The sequencer 111 performs a first read operation on the upper page of the memory cell array 130. The first read operation is the same as the operation described with reference to FIG. 8 except that voltage VCGRV (VA) is applied to provisionally-selected word line WLn+1. In this example, the case where word line WL2 is the selected word line WLn and word line WL3 is the provisionally-selected word line WLn+1 will be described.

As shown in FIG. 41, in the first read operation, upper-page (upper-bit) data (XU1) is read from the memory cell transistor MTn+1 coupled to the provisionally-selected word line WL3 out to the sense amplifier SA (node SEN). This data (XU1) is used for compensating for the inter-cell interference effect.

[Step S1002]

As shown in FIG. 41, read data (XU1) is stored in latch circuit UDL as in step S202.

<2-2-3-3> Eighth Operation

The eighth operation of step S1002 of FIG. 39 will be described with reference to FIG. 42.

[Step S1201]

The sequencer 111 performs a second read operation on the upper page of the memory cell array 130. The second read operation is the same as the operation described with reference to FIG. 11 except that voltage VCGRV (VA) is applied to the selected word line WLn.

As shown in FIG. 43, in the second read operation, upper-page (upper-bit) data (YU1) is read from the selected memory cell transistor MT2 coupled to word line WL2 out to the sense amplifier SA (node SEN). This data (YU1) is used when generating normal read data and soft bit data.

[Step S1202]

When data (YU1) is readout to the sense amplifier SA (node SEN), the sequencer 111 supplies control signal STB to the sense amplifier SA. As shown in FIG. 43, the sense amplifier SA transfers read data (YU1) of node SEN to latch circuit SDL at the time when signal STB is asserted. Data (YU1) is stored in latch circuit SDL.

[Step S1203]

As shown in FIG. 43, the sequencer 111 transfers data (YU1) stored in latch circuit SDL to latch circuit LDL. Then, the arithmetic operation section OP inverts data (YU1) stored in latch circuit LDL to generate data (~YU1). Consequently, data (~YU1) is stored in latch circuit LDL.

<2-2-3-4> Ninth Operation

The ninth operation of step S1003 in FIG. 39 will be described with reference to FIG. 44.

[Step S1301]

The sequencer 111 performs a third read operation on the upper page of the memory cell array 130. The third read operation is the same as the operation described with reference to FIG. 14 except that voltage VCGRV (VA) is applied to the selected word line WLn.

As shown in FIG. 45, in the third read operation, upper-page (upper-bit) data (ZU1) is read from the selected memory cell transistor MT2 coupled to the selected word line WL2 out to the sense amplifier SA (node SEN). This data (ZU1) is used when generating normal read data and soft bit data.

[Step S1302]

As shown in FIG. 45, data (ZU1) is stored in latch circuit SDL as in step S402.

[Step S1303]

As shown in FIG. 45, the arithmetic operation section OP performs an AND operation (~SDL&UDL) of the inversion data (~ZU1) of the data (ZU1) stored in latch circuit SDL and the data (XU1) stored in latch circuit UDL. Subsequently, the arithmetic operation section OP performs an OR operation (~SDL&UDL|LDL) of the result (~ZU1&XU1) of the AND operation and the data (~YU1) stored in latch circuit LDL to generate data (~ZU1&XU1|~YU1), and stores it in latch circuit XDL.

[Step S1303]

As shown in FIG. 46, the arithmetic operation section OP performs an OR operation (SDL|LDL) of the data (ZU1) stored in latch circuit SDL and the data (~YU1) stored in latch circuit LDL to generate data (ZU1|~YU1), and stores it in latch circuit LDL.

<2-2-3-5> Tenth Operation

The tenth operation of step S1004 in FIG. 39 will be described with reference to FIG. 47.

[Step S1401]

The sequencer 111 performs a first read operation on the upper page of the memory cell array 130. The first read operation is the same as the operation described with reference to FIG. 8 except that voltage VCGRV (VC) is applied to provisionally-selected word line WLn+1.

As shown in FIG. 48, in the first read operation, upper-page (upper-bit) data (XU2) is read from the memory cell transistor MTn+1 coupled to the provisionally-selected word line WL3 out to the sense amplifier SA (node SEN). This data (XU2) is used for compensating for the inter-cell interference effect.

[Step S1402]

As shown in FIG. 48, read data (XU2) is stored in latch circuit UDL as in step S202.

<2-2-3-6> Eleventh Operation

The eleventh operation of step S1005 in FIG. 39 will be described with reference to FIG. 49.

[Step S1501]

The sequencer 111 performs a second read operation on the upper page of the memory cell array 130. The second read operation is the same as the operation described with reference to FIG. 11 except that voltage VCGRV (VC) is applied to the selected word line WLn.

As shown in FIG. 50, in the second read operation, upper-page (upper-bit) data (YU2) is read from the selected memory cell transistor MT2 coupled to word line WL2 out to the sense amplifier SA (node SEN). This data (YU2) is used when generating normal read data and soft bit data.

[Step S1502]

As shown in FIG. 50, data (YU2) is stored in latch circuit SDL as in step S1202.

[Step S1503]

As shown in FIG. 51, the arithmetic operation section OP performs an AND operation (~SDL&LDL) of the inversion data (~YU2) of the data (YU2) stored in latch circuit SDL and the data (ZU1|~YU1) stored in latch circuit LDL. The arithmetic operation section OP stores the result (~YU2&(ZU1|~YU1)) of the AND operation in latch circuit LDL.

[Step S1504]

As shown in FIG. 52, the arithmetic operation section OP performs an AND operation (~SDL&UDL) of the data (YU2) stored in latch circuit SDL and the inversion data (~XU2) of the data (XU2) stored in latch circuit UDL. Subsequently, the arithmetic operation section OP performs an OR operation (SDL&~UDL|XDL) of the result (YU2&~XU2) of the AND operation and the data (~ZU1&XU1|~YU1) stored in latch circuit XDL to generate data ((YU2&~XU2)|(~ZU1&XU1|~YU1)), and stores it in latch circuit XDL.

<2-2-3-7> Twelfth Operation

The twelfth operation of step S1006 in FIG. 39 will be described with reference to FIG. 53.

[Step S1601]

The sequencer 111 performs a third read operation on the upper page of the memory cell array 130. The third read operation is the same as the operation described with reference to FIG. 14 except that voltage VCGRV (VC) is applied to the selected word line WLn.

Figure 54:
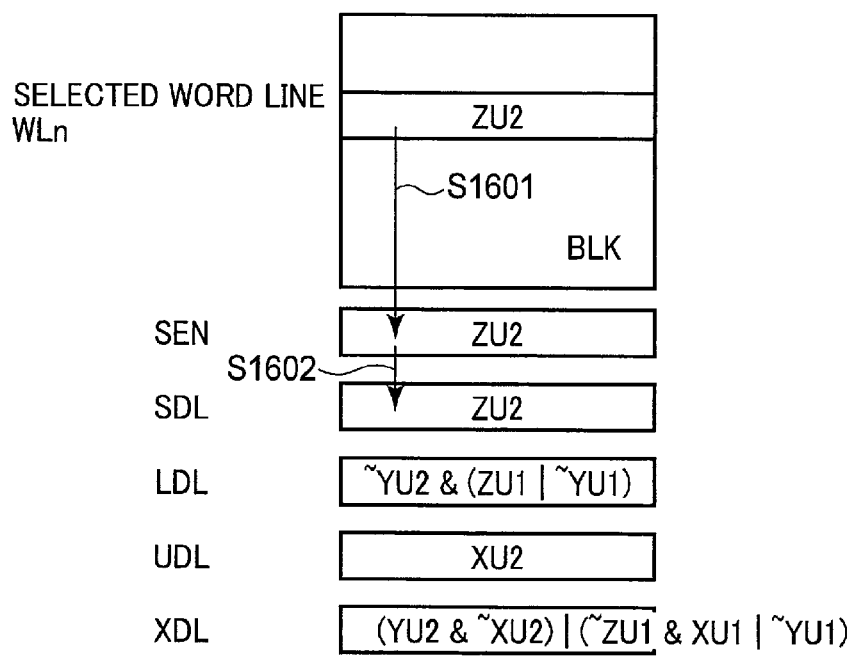
FIG. 54 is a diagram showing a flow of data in the twelfth operation.

As shown in FIG. 54, in the third read operation, upper-page (upper-bit) data (ZU2) is read from the selected memory cell transistor MT2 coupled to the selected word line WL2 out to the sense amplifier SA (node SEN). This data (ZU2) is used when generating normal read data and soft bit data.

[Step S1602]

As shown in FIG. 54, data (ZU2) is stored in latch circuit SDL as in step S402.

[Step S1603]

Figure 55:
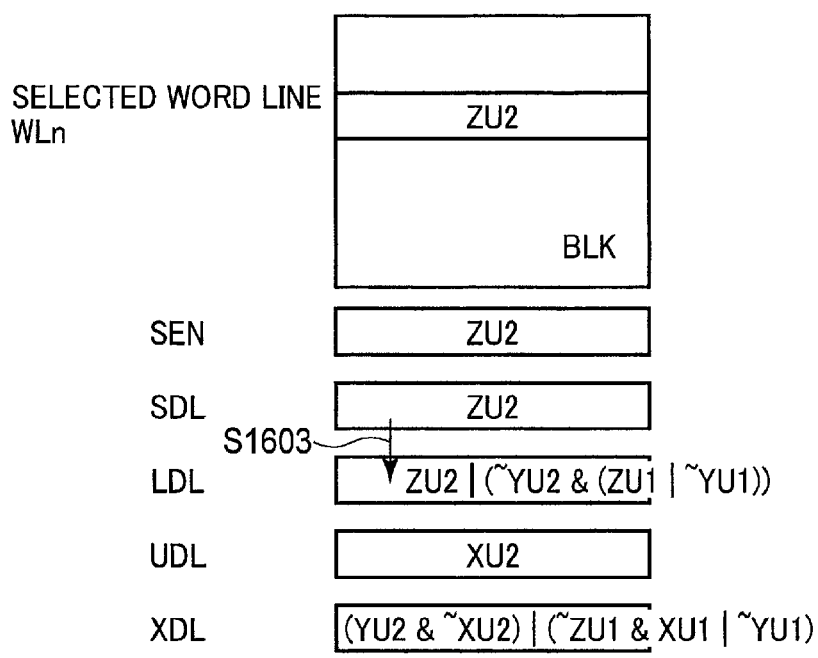
FIG. 55 is a diagram showing a flow of data in the twelfth operation.

As shown in FIG. 55, the arithmetic operation section OP performs an OR operation (SDL|LDL) of the data (ZU2) stored in latch circuit SDL and the data (~YU2&(ZU1|~YU1)) stored in latch circuit LDL. The arithmetic operation section OP stores the result (ZU2|(~YU2&(ZU1|~YU1))) of the OR operation in latch circuit LDL. In the present embodiment, data (ZU2|(~YU2&(ZU1|~YU1))) stored in latch circuit LDL is used as soft bit data.

[Step S1604]

Figure 56:
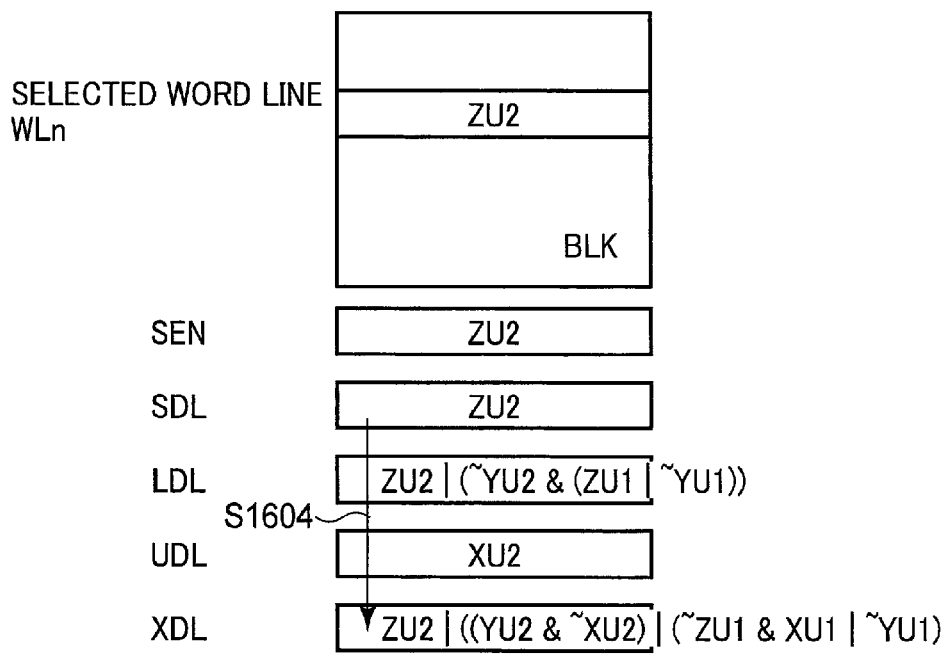
FIG. 56 is a diagram showing a flow of data in the twelfth operation.

As shown in FIG. 56, the arithmetic operation section OP performs an OR operation (SDL|XDL) of the data (ZU2) stored in latch circuit SDL and the data ((YU2&~XU2)|(~ZU1&XU1|~YU1)) stored in latch circuit XDL. Subsequently, the arithmetic operation section OP stores the result (ZU2|((YU2&~XU2)|(~ZU1&XU1|~YU1))) of the OR operation in latch circuit XDL. The data (ZU2|((YU2&~XU2)|(~ZU1&XU1|~YU1))) stored in latch circuit XDL is data (normal read data) with allowance for the threshold shift caused by the inter-cell interference effect from the memory cell transistor MT coupled to word line WLn+1 adjacent to selected word line WLn.

<2-3> Soft Bit Data Generation Method

<2-3-1> Shift of Threshold Distributions of Selected Memory Cell Transistors

Here, in order to facilitate understanding of the principle of generation of soft bit data, the shift of the threshold distributions of selected memory cell transistors MT will be described.

The shift of the threshold distributions of selected memory cell transistors MT will be described with reference to FIG. 57.

Distributions E1 to E3 and A1 to A3 shown in FIG. 57 are the same as the distributions described with reference to FIG. 18.

Distribution B1 shown in FIG. 57 is an ideal threshold distribution of "B-level".

Thresholds in distribution B1 may be shifted due to the inter-cell interference effect from an adjacent memory cell transistor. As shown in FIG. 57, distribution B2 is the threshold distribution of "B-level" in the case where thresholds are shifted due to the inter-cell interference effect from an adjacent memory cell transistor. Thresholds in distribution B2 are larger than those in distribution B1 due to the inter-cell interference effect from an adjacent memory cell transistor.

Thresholds in distribution B2 may be shifted due to application of voltage VREADLA to an adjacent word line WL in the third read operation. As shown in FIG. 57, distribution B3 is the threshold distribution of "B-level" expected in the case of the third read operation. In the case of distribution B3, the potential of voltage VCGRV applied to the selected word line WLn is increased in appearance by application of voltage VREADLA to word line WLn+1 adjacent to the selected word line WLn. Therefore, thresholds in distribution B3 are larger than those in distribution B2.

Distribution C1 shown in FIG. 57 is an ideal threshold distribution of "C-level".

Distribution C2 shown in FIG. 57 is the threshold distribution of "C-level" in the case where thresholds are shifted due to the inter-cell interference effect from an adjacent memory cell transistor. Thresholds in distribution C2 are larger than those in distribution C1 due to the inter-cell interference effect from an adjacent memory cell transistor.

Distribution C3 shown in FIG. 57 is the threshold distribution of "C-level" expected in the case of the third read operation. In the case of distribution C3, the threshold distribution is shifted rightward in appearance by application of voltage VREADLA to word line WLn+1 adjacent to the selected word line WLn. Therefore, thresholds in distribution C3 are larger than those in distribution C2.

As shown in FIG. 57, in the second read operation, voltage VCGRV (VA, VB, VC) is applied to the selected word line WLn. In the third read operation, the potential of voltage VCGRV applied to the selected word line WLn is increased in appearance to VAD (VA<VAD), VBD (VB<VBD), VCD (VC<VCD) by application of voltage VREADLA to word line WLn+1 adjacent to the selected word line WLn.

Meanwhile, the selected memory cell transistor MT may receive an inter-cell interference effect larger than expected from an adjacent memory cell transistor.

In such a case, as shown in FIG. 58, the shift amounts of distributions E2, E3, A2, A3, B2, B3, C2, and C3 are larger than the expected shift amounts.

In the case shown in FIG. 58, distribution E2 may reach or exceed voltage VA in the third read operation. Such a case is treated as mistake M3. Furthermore, distribution A2 may reach or exceed voltage VB in the third read operation. Such a case is treated as mistake M4. Similarly, distribution B2 may reach or exceed voltage VC in the third read operation. Such a case is treated as mistake M5.

On the other hand, the selected memory cell transistor MT may receive an inter-cell interference effect smaller than expected from an adjacent memory cell transistor.

In such a case, as shown in FIG. 59, the shift amounts of distributions E2, E3, A2, A3, B2, B3, C2, and C3 are smaller than the expected shift amounts.

In the case shown in FIG. 59, distribution A3 may reach or fall below voltage VAD in the third read operation. Such a case is treated as mistake M6. Furthermore, distribution B3 may reach or fall below voltage VBD in the third read operation. Such a case is treated as mistake M7. Similarly, distribution C3 may reach or fall below voltage VCD in the third read operation. Such a case is treated as mistake M8.

<2-3-2> Operation Example of Latch Circuits Regarding Lower Page

A specific example of the operation of the latch circuits relating to the fourth to sixth operations will be described with reference to FIGS. 60 to 64.

FIG. 60 is a diagram showing the states after inversion data of memory cell transistor MTn+1 is stored in latch circuit UDL by step S702 in FIG. 31.

Here, the relationship between the data of the selected memory cell transistor MTn, the data of memory cell transistor MTn+1, and the inter-cell interference effect will be described, while focusing on part of FIG. 60.

For example, when memory cell transistor MTn+1 stores "E" or "A" ("0" is stored in UDL) and the inter-cell interference effect is small, the data read by the sense amplifier SA from the selected memory cell transistor MTn in which "A" is stored is "0".

Similarly, when memory cell transistor MTn+1 stores "B" or "C" ("1" is stored in UDL) and the inter-cell interference effect is small, the data read by the sense amplifier SA from the selected memory cell transistor MTn in which "A" is stored is "0".

In contrast, when cell transistor MTn+1 stores "E" or "A" and the inter-cell interference effect is large, the data read by the sense amplifier SA from the selected memory cell transistor MTn in which "A" is stored is "1". This is erroneous data corresponding to M4 in FIG. 58.

When memory cell transistor MTn+1 stores "B" or "C" ("1" is stored in UDL) and the inter-cell interference effect is large, the data read by the sense amplifier SA from the selected memory cell transistor MTn in which "A" is stored is "1". This is erroneous data corresponding to mistake M4 in FIG. 58.

Figure 33:
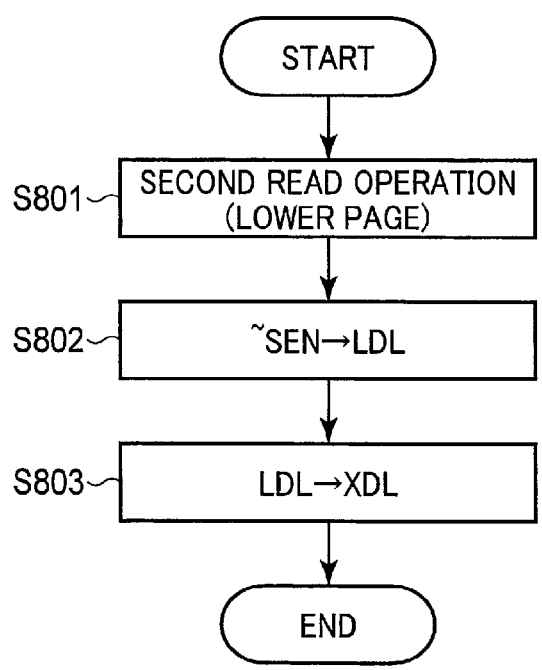
FIG. 33 is a flowchart showing a fifth operation.

As shown in FIG. 60, in step S802 in FIG. 33, inversion data of the sense amplifier SA (node SEN) is input to latch circuit LDL. Therefore, data of mistake M4 is stored as "0" data in latch circuit LDL.

Then, as shown in FIG. 61, in step S803 in FIG. 33, the data of latch circuit LDL is transferred to latch circuit XDL.

The data stored in the latch circuits in the third read operation will be described with reference to FIG. 62.

Figure 62:
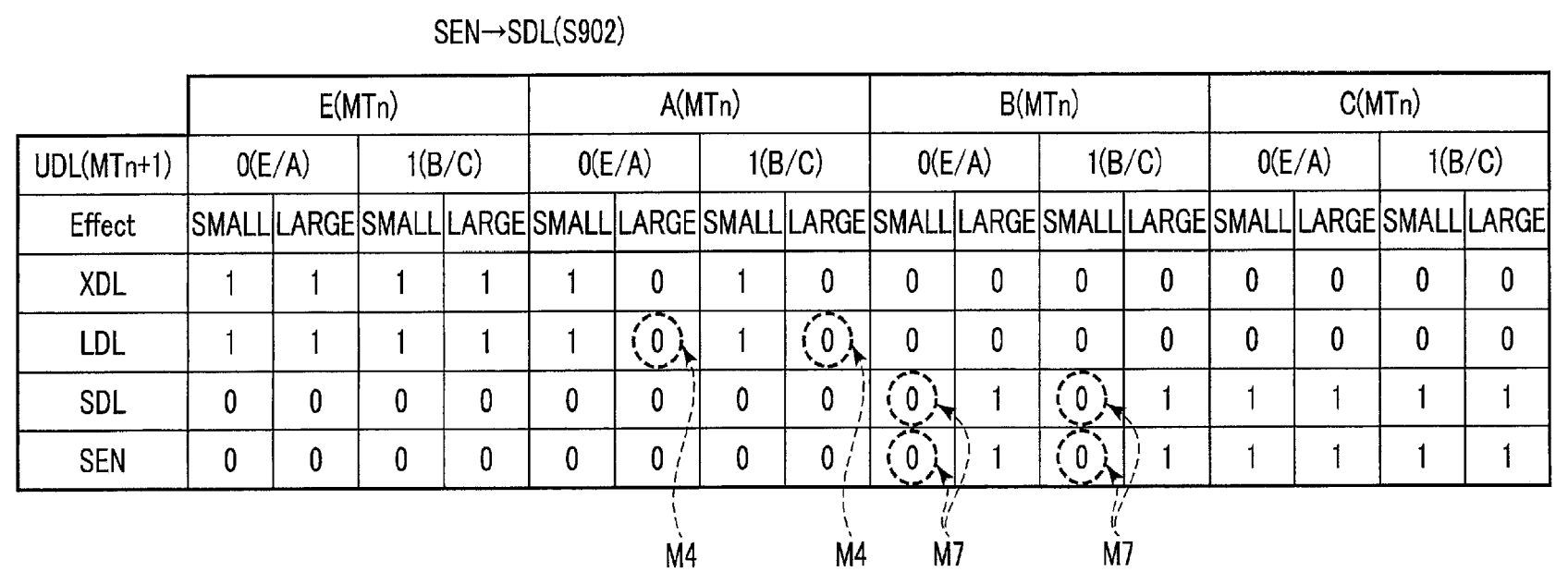

As shown in FIG. 62, for example, when memory cell transistor MTn+1 stores "E" or "A" ("0" is stored in UDL) and the inter-cell interference effect is small, the data read by the sense amplifier SA from the selected memory cell transistor MTn in which "B" is stored is "0". This is erroneous data corresponding to mistake M7 in FIG. 59.

Similarly, when memory cell transistor MTn+1 stores "B" or "C" ("1" is stored in UDL) and the inter-cell interference effect is small, the data read by the sense amplifier SA from the selected memory cell transistor MTn in which "B" is stored is "0". This is erroneous data corresponding to mistake M7 in FIG. 59.

In contrast, when memory cell transistor MTn+1 stores "E" or "A" and the inter-cell interference effect is large, the data read by the sense amplifier SA from the selected memory cell transistor MTn in which "B" is stored is "1".

When memory cell transistor MTn+1 stores "B" or "C" ("1" is stored in UDL) and the inter-cell interference effect is large, the data read by the sense amplifier SA from the selected memory cell transistor MTn in which "B" is stored is "1".

As shown in FIG. 62, in step S902 in FIG. 35, inversion data of the sense amplifier SA (node SEN) is input to latch circuit SDL. Therefore, data of mistake M7 is stored as "0" data in latch circuit SDL.

As shown in FIG. 63, in step S903 in FIG. 35, an OR operation (SDL|LDL) is performed, and the operation result is stored in latch circuit LDL. The data of mistake M4 and mistake M7 is stored as "0" data in latch circuit LDL.

As shown in FIG. 64, in step S904 in FIG. 35, a logical operation (~SDL&UDL|XDL) is performed, and the operation result is stored in latch circuit XDL. The data stored in latch circuit XDL is output as normal read data.

As shown in FIG. 64, read data is stored in latch circuit XDL, and soft bit data is stored in latch circuit LDL.

Figure 65:
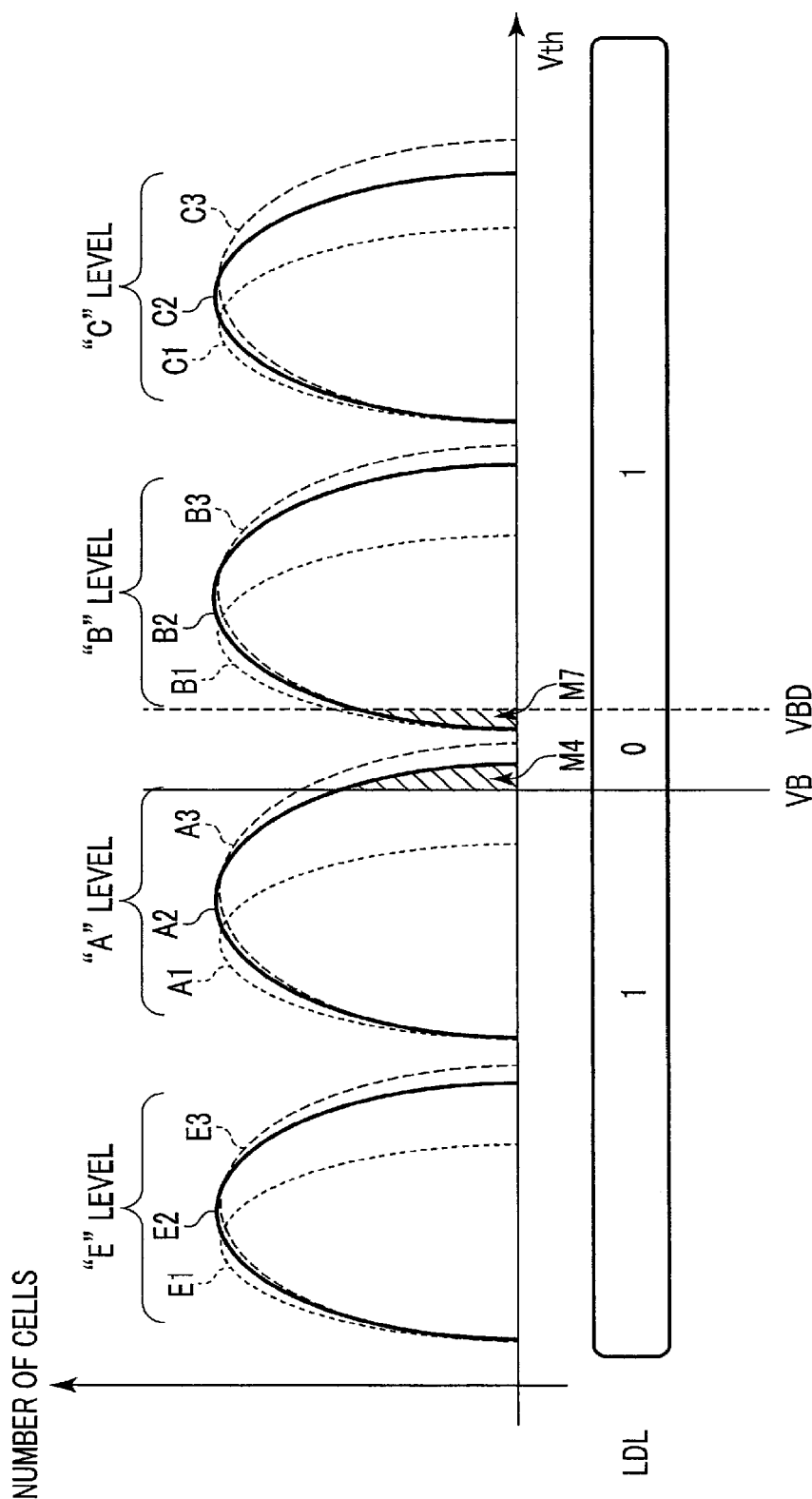
FIG. 65 is a diagram showing the relationship between the threshold distributions of memory cell transistors and data stored in a latch circuit.

As shown in FIG. 65, according to the present embodiment, when mistake M4 occurs or when mistake M7 occurs, "0" data is stored in latch circuit LDL. That is, in the present embodiment, even when different types of mistakes (mistake M4 and mistake M7) occur, a certain value ("0" data) is stored in latch circuit LDL. That is, the memory system 1 can obtain soft bit data without newly performing a read operation for reading soft bit data. As a result, a read time for the soft bit can be saved when performing ECC.

<2-3-3> Operation Example of Latch Circuits Regarding Upper Page

A specific example of the operation of the latch circuits relating to the seventh to ninth operations will be described with reference to FIGS. 66 to 70.

FIG. 66 is a diagram showing the states after inversion data of memory cell transistor MTn+1 is stored in latch circuit UDL in step S1102 of FIG. 40.

Here, the relationship between the data of the selected memory cell transistor MTn, the data of memory cell transistor MTn+1, and the inter-cell interference effect will be described, while focusing on part of FIG. 66.

For example, when memory cell transistor MTn+1 stores "E" or "C" ("0" is stored in UDL) and the inter-cell interference effect is small, the data read by the sense amplifier SA from the selected memory cell transistor MTn in which "E" is stored is "0".

Similarly, when memory cell transistor MTn+1 stores "A" or "B" ("1" is stored in UDL) and the inter-cell interference effect is small, the data read by the sense amplifier SA from the selected memory cell transistor MTn in which "E" is stored is "0".

In contrast, when cell transistor MTn+1 stores "E" or "C" and the inter-cell interference effect is large, the data read by the sense amplifier SA from the selected memory cell transistor MTn in which "E" is stored is "1". This is erroneous data corresponding to mistake M3 in FIG. 58.

When memory cell transistor MTn+1 stores "A" or "B" ("1" is stored in UDL) and the inter-cell interference effect is large, the data read by the sense amplifier SA from the selected memory cell transistor MTn in which "E" is stored is "1". This is erroneous data corresponding to mistake M3 in FIG. 58.

As shown in FIG. 66, in step S1202 in FIG. 42, the data of the sense amplifier SA (node SEN) is input to latch circuit SDL. Therefore, data of mistake M3 is stored as "0" data in latch circuit SDL.

Figure 67:
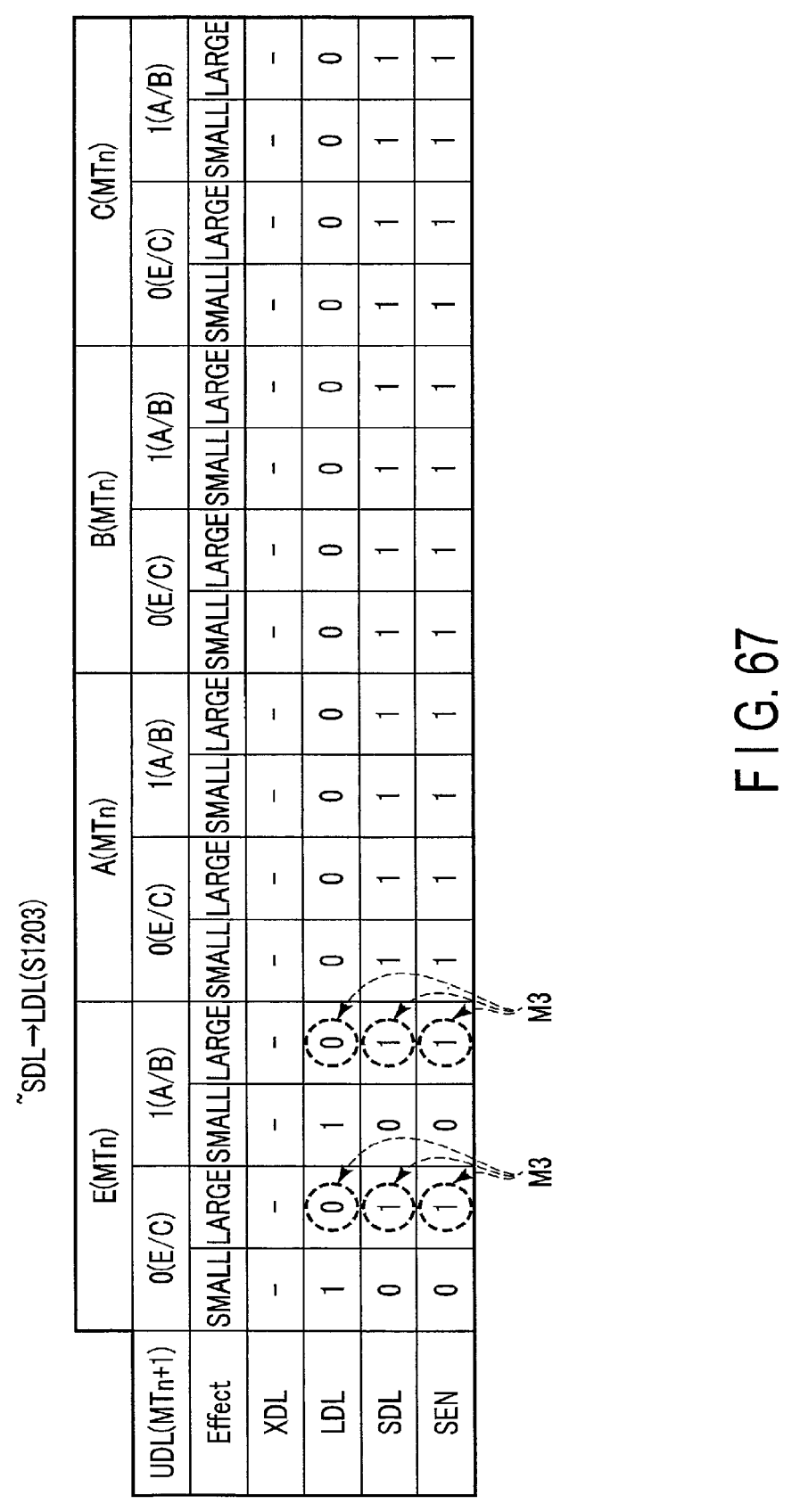

Then, as shown in FIG. 67, in step S1203 in FIG. 42, the inversion data of latch circuit SDL is input to latch circuit LDL. Therefore, data of mistake M3 is stored as "0" data in latch circuit LDL.

The data stored in the latch circuits in the third read operation will be described with reference to FIG. 68.

As shown in FIG. 68, for example, when memory cell transistor MTn+1 stores "E" or "C" ("0" is stored in UDL) and the inter-cell interference effect is small, the data read by the sense amplifier SA from the selected memory cell transistor MTn in which "A" is stored is "0". This is erroneous data corresponding to mistake M6 in FIG. 59.

Similarly, when memory cell transistor MTn+1 stores "A" or "B" ("1" is stored in UDL) and the inter-cell interference effect is small, the data read by the sense amplifier SA from the selected memory cell transistor MTn in which "A" is stored is "0". This is erroneous data corresponding to mistake M6 in FIG. 59.

In contrast, when memory cell transistor MTn+1 stores "E" or "C" and the inter-cell interference effect is large, the data read by the sense amplifier SA from the selected memory cell transistor MTn in which "A" is stored is "1".

When memory cell transistor MTn+1 stores "A" or "B" ("1" is stored in UDL) and the inter-cell interference effect is large, the data read by the sense amplifier SA from the selected memory cell transistor MTn in which "A" is stored is "1".

As shown in FIG. 68, in step S1302 in FIG. 44, the data of the sense amplifier SA (node SEN) is input to latch circuit SDL. Therefore, data of mistake M6 is stored as "0" data in latch circuit SDL.

As shown in FIG. 69, in step S1303 in FIG. 44, a logical operation (~SDL&UDL|LDL) is performed, and the operation result is stored in latch circuit XDL.

As shown in FIG. 70, in step S1304 in FIG. 44, an OR operation (LDL|SDL) is performed, and the operation result is stored in latch circuit LDL. The data of mistake M3 and mistake M6 is stored as "0" data in latch circuit LDL.

A specific example of the operation of the latch circuits relating to the tenth to twelfth operations will be described with reference to FIGS. 71 to 76.

FIG. 71 is a diagram showing the states after inversion data of memory cell transistor MTn+1 is stored in latch circuit UDL by step S1402 in FIG. 47.

Here, the relationship between the data of the selected memory cell transistor MTn, the data of memory cell transistor MTn+1, and the inter-cell interference effect will be described, while focusing on part of FIG. 71.

For example, when memory cell transistor MTn+1 stores "E" or "C" ("0" is stored in UDL) and the inter-cell interference effect is small, the data read by the sense amplifier SA from the selected memory cell transistor MTn in which "B" is stored is "0".

Similarly, when memory cell transistor MTn+1 stores "A" or "B" ("1" is stored in UDL) and the inter-cell interference effect is small, the data read by the sense amplifier SA from the selected memory cell transistor MTn in which "B" is stored is "0".

In contrast, when cell transistor MTn+1 stores "E" or "C" and the inter-cell interference effect is large, the data read by the sense amplifier SA from the selected memory cell transistor MTn in which "B" is stored is "1". This is erroneous data corresponding to mistake M5 in FIG. 58.

When memory cell transistor MTn+1 stores "A" or "B" ("1" is stored in UDL) and the inter-cell interference effect is large, the data read by the sense amplifier SA from the selected memory cell transistor MTn in which "B" is stored is "1". This is erroneous data corresponding to mistake M5 in FIG. 58.

As shown in FIG. 71, in step S1502 in FIG. 49, the data of the sense amplifier SA (node SEN) is input to latch circuit SDL. Therefore, data of mistake M5 is stored as "0" data in latch circuit SDL.

As shown in FIG. 72, in step S1503 in FIG. 49, a logical operation (~SDL&LDL) is performed, and the operation result is stored in latch circuit LDL. By this arithmetic operation, data of mistake M5 is stored as "0" data in latch circuit LDL.

Figure 73:
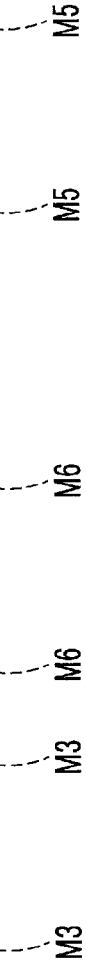
FIG. 73 is a diagram showing data stored in the latch circuits in the eleventh operation.

As shown in FIG. 73, in step S1504 in FIG. 49, a logical operation (SDL&~UDL|XDL) is performed, and the operation result is stored in latch circuit XDL.

The data stored in the latch circuits in the third read operation will be described with reference to FIG. 74.

As shown in FIG. 74, for example, when memory cell transistor MTn+1 stores "E" or "C" ("0" is stored in UDL) and the inter-cell interference effect is small, the data read by the sense amplifier SA from the selected memory cell transistor MTn in which "C" is stored is "0". This is erroneous data corresponding to M8 in FIG. 59.

Similarly, when memory cell transistor MTn+1 stores "A" or "B" ("1" is stored in UDL) and the inter-cell interference effect is small, the data read by the sense amplifier SA from the selected memory cell transistor MTn in which "C" is stored is "0". This is erroneous data corresponding to M8 in FIG. 59.

In contrast, when memory cell transistor MTn+1 stores "E" or "C" and the inter-cell interference effect is large, the data read by the sense amplifier SA from the selected memory cell transistor MTn in which "C" is stored is "1".

When memory cell transistor MTn+1 stores "A" or "B" ("1" is stored in UDL) and the inter-cell interference effect is large, the data read by the sense amplifier SA from the selected memory cell transistor MTn in which "C" is stored is "1".

Figure 53:
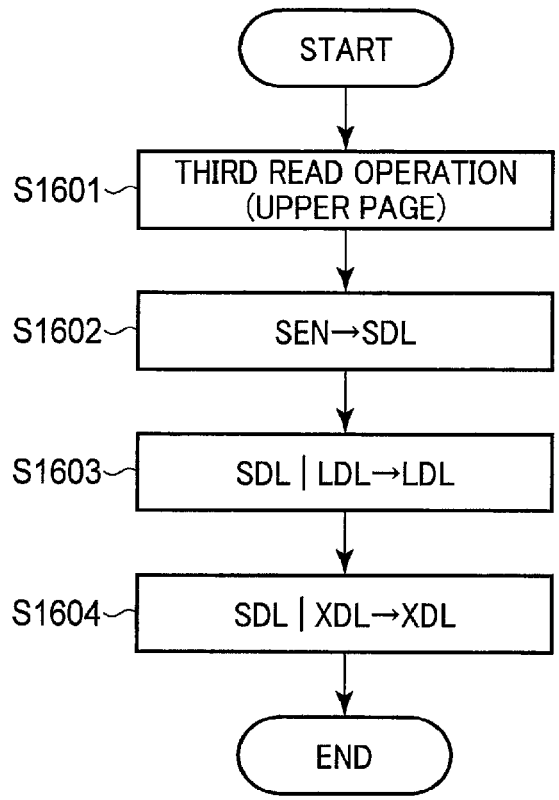
FIG. 53 is a flowchart showing a twelfth operation.

As shown in FIG. 74, in step S1602 in FIG. 53, the data of the sense amplifier SA (node SEN) is input to latch circuit SDL. Therefore, data of mistake M8 is stored as "0" data in latch circuit SDL.

Figure 75:
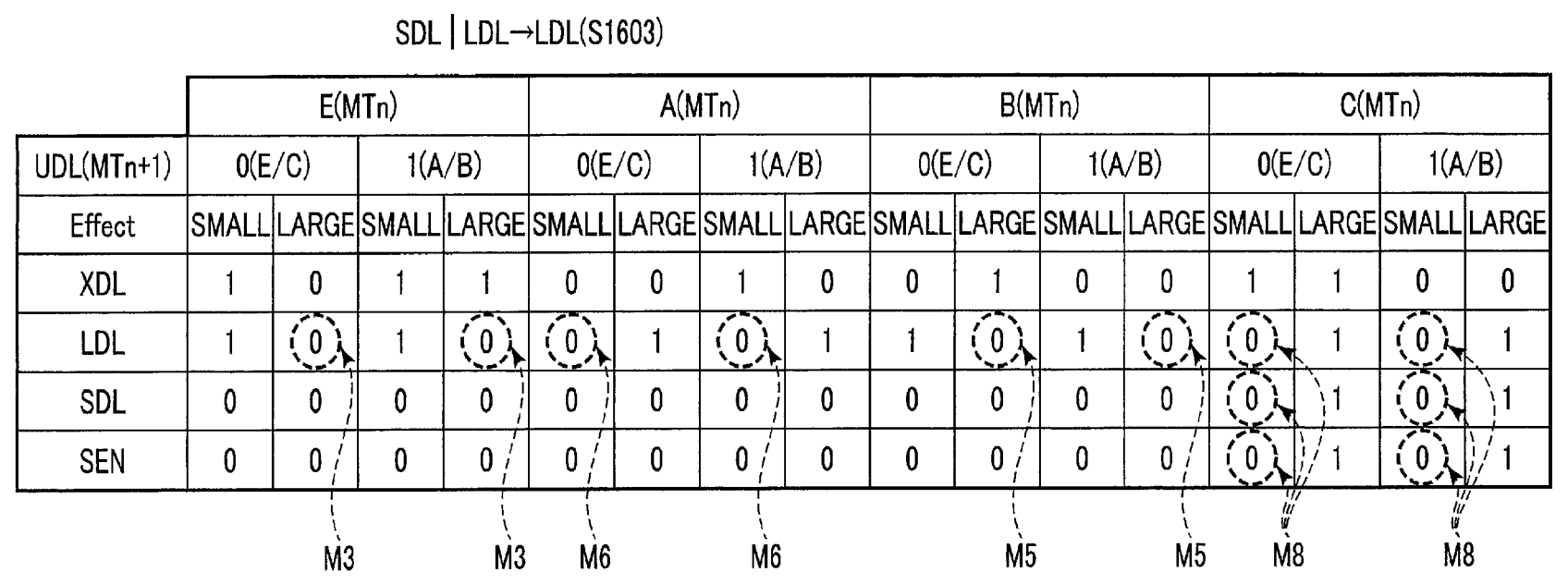

As shown in FIG. 75, in step S1604 in FIG. 53, an OR operation (LDL|SDL) is performed, and the operation result is stored in latch circuit LDL. The data of mistake M3, mistake M5, mistake M6, and mistake M8 is stored as "0" data in latch circuit LDL.

As shown in FIG. 76, in step S1604 in FIG. 53, an OR operation (SDL|XDL) is performed, and the operation result is stored in latch circuit XDL. The data stored in latch circuit XDL is normal read data.

As shown in FIG. 77, according to the present embodiment, when at least one of mistake M3, mistake M5, mistake M6, and mistake M8 occurs, "0" data is stored in latch circuit LDL. That is, in the present embodiment, even when different types of mistakes (mistake M3, mistake M5, mistake M6, and mistake M8) occur, a certain value ("0" data) is stored in latch circuit LDL. That is, the memory system 1 can obtain soft bit data without newly performing a read operation for reading soft bit data. As a result, a read time for the soft bit can be saved when performing ECC.

<2-4> Command Sequence

<2-4-1> Command Sequence Relating to Lower Page

A command sequence in the lower page read operation of the memory system 1 according to the present embodiment will be described with reference to FIG. 78.

The basic flow is the same as that of the operation described with reference to FIG. 27, but they are different in the contents of the address, and the voltage VCGRV applied to the selected word line WLn.

For the read operation, the memory controller 200 according to the present embodiment issues a command set CS1 to the NAND flash memory 100.

When command "30h" is set in the register 112, the NAND flash memory 100 starts an operation to read data from the memory cell array 130, and enters the busy state.

Then, the NAND flash memory 100 executes steps S502 to S505 in FIG. 29, and steps S601 to S603 in FIG. 30.

Thereafter, when the NAND flash memory 100 enters the ready state, data read from the memory cell array 130 is transmitted to the memory controller 200.

When executing a read request in step S509 in FIG. 29, the memory controller 200 issues a command (for example, "YYh") to the NAND flash memory 100.

When command "YYh" is set in the register 112, the NAND flash memory 100 performs the operations of steps S510 and S511 in FIG. 29.

<2-4-2> Command Sequence Relating to Upper Page

Figure 79:
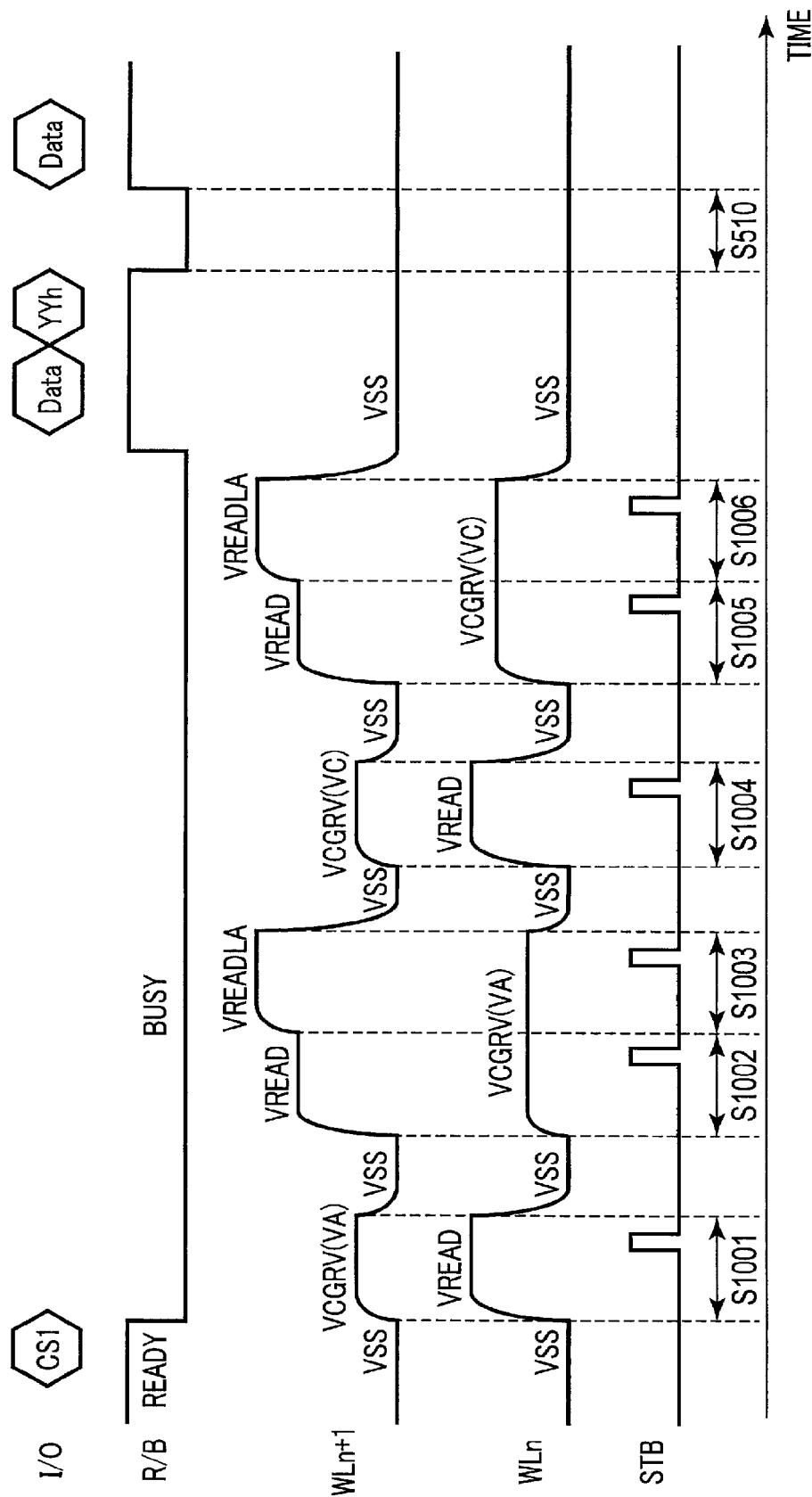
FIG. 79 is a command sequence showing a read operation of the memory system according to the second embodiment.

A command sequence in the upper page read operation of the memory system 1 according to the present embodiment will be described with reference to FIG. 79.

The basic flow is the same as that of the operation described with reference to FIG. 27, but they are different in the contents of the address, and the voltage VCGRV applied to the selected word line WLn.

For the read operation, the memory controller 200 according to the present embodiment issues a command set CS1 to the NAND flash memory 100.

When command "30h" is set in the register 112, the NAND flash memory 100 starts an operation to read data from the memory cell array 130, and enters the busy state.

Then, the NAND flash memory 100 executes steps S502 to S505 in FIG. 29, and steps S1001 to S1003 in FIG. 39.

Thereafter, when the NAND flash memory 100 enters the ready state, data read from the memory cell array 130 is transmitted to the memory controller 200.

<2-5> Advantage

According to the above-described embodiment, normal read data relating to the lower page and soft bit data relating to the lower page can be obtained by a series of read operations by performing arithmetic operations on the results of the fourth to sixth read operations by using latch circuits. Similarly, according to the above-described embodiment, normal read data relating to the upper page and soft bit data relating to the upper page can be obtained by a series of read operations by performing arithmetic operations on the results of the seventh to twelfth read operations by using latch circuits. Therefore, the second embodiment can provide the same advantage as the above-described first embodiment.

<3> Modification

In the second read operation in the second operation, the fifth operation, the eighth operation, and the eleventh operation, or in the third read operation in the third operation, the sixth operation, the ninth operation, and the twelfth operation, the voltage VCGRV applied to the selected word line WLn can be changed as appropriate.

A method for changing voltage VCGRV will be described with reference to FIG. 80. FIG. 80 shows the case where the method is applied to the first embodiment.

As shown in FIG. 80, for the read operation, the memory controller 200 according to the modification issues a prefix command (for example, "XAh") to perform a read operation to the NAND flash memory 100. Subsequently, the memory controller 200 issues an address (including a column address, a block address, and a page address) and data indicating a shift value of voltage VCGRV to the NAND flash memory 100. Then, the memory controller 200 issues a command (for example, "XBh"), a command (for example, "00h"), and an address (including a column address, a block address, and a page address) to the NAND flash memory 100. After that, the memory controller 200 issues a command (for example, "30h") to the NAND flash memory 100.

When command "30h" is set in the register 112, the NAND flash memory 100 starts an operation to read data from the memory cell array 130, and enters the busy state.

Then, the NAND flash memory 100 executes steps S102 to S105 in FIG. 6. The NAND flash memory 100 changes voltage VCGRV to be applied to the selected word line WLn in steps S103 to S104 on the basis of the received shift value of voltage VCGRV.

A specific example of this modification will be described with reference to FIG. 81.

LDL1 in FIG. 81 shows values of soft bit data of when voltage VCGRV (VA) is not changed. Similarly, LDL2 in FIG. 81 shows values of soft bit data of when voltage VCGRV (VA) is changed by voltage dV1. Furthermore, LDL3 in FIG. 81 shows values of soft bit data of when voltage VCGRV (VA) is changed by voltage dV2 (dV2>dV1).

As shown in FIG. 81, when voltage VCGRV (VA) is not changed, the operation is the same as the one described in the first embodiment.

As shown in FIG. 81, when voltage VCGRV (VA) is changed by voltage dV1, the voltage applied to the selected word line WLn in the second read operation is voltage VA+dV1. Furthermore, the voltage applied to the selected word line WLn in the third read operation is voltage VA−dV1. However, since the voltage applied to the word line WLn+1 is voltage VREADLA, the voltage substantially applied to the selected word line WLn is voltage VAD−dV1. "E" data equal to or higher than voltage VA+dV1 or "A" data below voltage VAD−dV1 is a mistake, and is stored as "0" in latch circuit LDL.

As shown in FIG. 81, when voltage VCGRV (VA) is changed by voltage dV2, the voltage applied to the selected word line WLn in the second read operation is voltage VA+dV2. Furthermore, the voltage applied to the selected word line WLn in the third read operation is voltage VA−dV2. However, since the voltage applied to the word line WLn+1 is voltage VREADLA, the voltage substantially applied to the selected word line WLn is voltage VAD−dV2. "E" data equal to or higher than voltage VA+dV2 or "A" data below voltage VAD−dV2 corresponds to a mistake and is stored as "0" in latch circuit LDL.

As described above, voltage VCGRV can be finely changed.

This modification can be applied to the second embodiment in a similar manner.

According to the above-described embodiments, the sense amplifier unit includes four latch circuits; however, the number of latch circuits in the sense amplifier unit is not limited to four, and may be five or more.

Moreover, according to the above-described embodiments, soft bit data is stored in latch circuit LDL; however, the configuration is not limited to this, and can be changed as appropriate.

Furthermore, in each embodiment relating to the present invention, (1) Regarding the read operation, the voltage applied to a selected word line in an A level read operation is, for example, in the range from 0V to 0.55V. The range of the voltage is not limited to this, and may be any one of the range from 0.1V to 0.24V, the range from 0.21V to 0.31V, the range from 0.31V to 0.4V, the range from 0.4V to 0.5V, or the range from 0.5V to 0.55V.

The voltage applied to a selected word line in a B level read operation is, for example, in the range from 1.5V to 2.3V. The range of the voltage is not limited to these, and may be any one of the range from 1.65V to 1.8V, the range from 1.8V to 1.95V, the range from 1.95V to 2.1V, or the range from 2.1V to 2.3V.

The voltage applied to a selected word line in a C level read operation is, for example, in the range from 3.0V to 4.0V. The voltage is not limited to this range, and may be any one of between 3.0V and 3.2V, between 3.2V and 3.4V, between 3.4V and 3.5V, between 3.5V and 3.6V, and between 3.6V and 4.0V.

The read operation time (tR) may be, for example, in the range from 25 µs to 38 µs, the range from 38 µs to 70 µs, or the range from 70 µs to 80 µs.

(2) The write operation includes the program operation and the verify operation as described above. In the write operation, The voltage first applied to a selected word line in the program operation is, for example, in the range from 13.7V to 14.3V. The range of the voltage is not limited to this, and may be either the range from 13.7V to 14.0V or the range from 14.0V to 14.6V.

The voltage first applied to a selected word line when writing an odd-numbered word line may differ from the voltage first applied to a selected word line when writing an even-numbered word line.

When the incremental step pulse program (ISPP) method is used for the program operation, the voltage may be stepped up by approximately 0.5V, for example.

The voltage applied to a non-selected word line is, for example, in the range from 6.0V to 7.3V. The range of the voltage is not limited to this, and may be the range from 7.3V to 8.4V, or not greater than 6.0V.

The applied pass voltage may be changed depending on whether the non-selected word line is an odd-number word line or an even-number word line.

The time (tProg) for the write operation may be, for example, in the range from 1700 µs to 1800 µs, the range from 1800 µs to 1900 µs, or the range from 1900 µs to 2000 µs.

(3) In the erase operation, the voltage first applied to a well which is formed in an upper part of the semiconductor substrate and above which the memory cell is provided is, for example, in the range from 12V to 13.6V. The range of the voltage is not limited to this, and may be, for example, in the range from 13.6V to 14.8V, the range from 14.8V to 19.0V, the range from 19.0V to 19.8V, or the range from 19.8V to 21V.

The erase operation time (tErase) may be, for example, in the range from 3000 µs to 4000 µs, the range from 4000 µs to 5000 µs, or the range from 4000 µs to 9000 µs.

(4) The structure of the memory cell includes a charge storage layer provided on the semiconductor substrate (silicon substrate) via a tunnel insulation film having a thickness in the range from 4 to 10 nm. The charge storage layer may have a stacked structure of an insulation film of SiN or SiON having a thickness in the range from 2 to 3 nm and polysilicon having a thickness in the range from 3 to 8 nm. The polysilicon may include a metal such as Ru. An insulation film is provided on the charge storage layer. This insulation film includes a silicon dioxide film having a thickness in the range from 4 to 10 nm, which is interposed between a lower High-k film having a thickness in the range from 3 to 10 nm and a higher High-k film having a thickness in the range from 4 to 10 nm, for example. An example of the High-k film is HfO. The thickness of the silicon dioxide film may be greater than that of the High-k film. On the insulation film, a control electrode having a thickness in the range from 30 nm to 70 nm is formed via a material having a thickness in the range from 3 to 10 nm. The material for adjusting the work function is a metal-oxide film such as TaO and a metal-nitride film such as TaN. For example, W may be used for the control electrode.

In addition, an air gap may be formed between memory cells.

Embodiments of the present invention have been described above; however, the present invention is not limited to the above-described embodiments, and can be variously modified in practice without departing from the spirit of the invention. Furthermore, the above-described embodiments include inventions at various stages, and various inventions are extracted by appropriately combining the disclosed structural elements. For example, even if some structural elements are deleted from the disclosed structural elements, the resultant structure can be extracted as an invention as long as a predetermined effect can be obtained.

What is claimed is:

1. A memory device, comprising:
    a first memory cell, and a second memory cell adjacent to the first memory cell; and
    a sequencer configured to, when data is read from the first memory cell:
    perform a first read operation on the second memory cell;
    perform a second read operation on the first memory cell;
    perform a third read operation on the first memory cell by applying a voltage different from that applied in the second read operation to a gate of the second memory cell; and
    generate first data stored in the first memory cell and second data for correcting the first data, based on results of the first to third read operations.

2. The memory device according to claim 1, wherein the sequencer is further configured to:
in the first read operation, read third data from the second memory cell;
in the second read operation, invert data read from the first memory cell to generate fourth data;
in the third read operation, read fifth data from the first memory cell;
perform an OR operation of the fourth data and the fifth data to generate the second data; and
perform an AND operation of the third data and inversion data of the fifth data and perform an OR operation of the fourth data and a result of the AND operation to generate the first data.

3. The memory device according to claim 1, wherein the sequencer is further configured to:
in the first read operation, in which a first voltage is applied to the gate of the second memory cell, read third data from the second memory cell;
in the second read operation, in which the first voltage is applied to a gate of the first memory cell, read fourth data from the first memory cell;
generate fifth data obtained by inverting the fourth data;
in the third read operation, in which the first voltage is applied to the gate of the first memory cell, read sixth data from the first memory cell;
perform an AND operation of the third data and inversion data of the sixth data and perform an OR operation of the fifth data and a result of the AND operation to generate seventh data;
perform an OR operation of the fifth data and the sixth data to generate eighth data;
in the first read operation, in which a second voltage different from the first voltage is applied to the gate of the second memory cell, read ninth data from the second memory cell;
in the second read operation, in which the second voltage is applied to the gate of the first memory cell, read tenth data from the first memory cell;
perform an AND operation of the eighth data and inversion data of the tenth data to generate eleventh data;
perform an AND operation of the tenth data and inversion data of the ninth data and perform an OR operation of the seventh data and a result of the AND operation to generate twelfth data;
in the third read operation, in which the second voltage is applied to the gate of the first memory cell, read thirteenth data from the first memory cell;
perform an OR operation of the eleventh data and the thirteenth data to generate the first data; and
perform an OR operation of the twelfth data and the thirteenth data to generate the second data.

4. The memory device according to claim 1, wherein the sequencer is further configured to:
in the first read operation for reading data from the second memory cell, apply a first voltage to the gate of the second memory cell, and apply a second voltage larger than the first voltage to a gate of the first memory cell;
in the second read operation for reading data from the first memory cell, apply the second voltage to the gate of the second memory cell, and apply the first voltage to the gate of the first memory cell; and
in the third read operation for reading data from the first memory cell, apply a third voltage larger than the second voltage to the gate of the second memory cell, and apply the first voltage to the gate of the first memory cell.

5. The memory device according to claim 1, further comprising:
a storage section; and
a controller configured to control the storage section,
wherein the second memory cell, the first memory cell, and the sequencer are provided in the storage section.

6. The memory device according to claim 5, wherein the controller issues a read request to the storage section when reading the first data.

7. The memory device according to claim 6, wherein the storage section performs the first to third read operations to generate the first and second data based on the read request.

8. The memory device according to claim 7, wherein the controller further includes an error correction circuit configured to perform an error correction on the first data.

9. The memory device according to claim 8, wherein when the error correction on the first data is not completed, the error correction circuit issues a request to read the second data to the sequencer.

10. The memory device according to claim 9, wherein upon receipt of the request to read the second data, the storage section outputs the second data to the controller.

11. The memory device according to claim 10, wherein the error correction circuit performs an error correction on the first data based on the second data.

12. The memory device according to claim 11, wherein when the first and second memory cells are each configured to store multi-bit data, the storage section performs the first to third read operations for each bit, and generates the first and second data for each bit.

13. The memory device according to claim 5, wherein the storage section further includes:
a first latch circuit;
a second latch circuit;
a third latch circuit; and
a fourth latch circuit, and
the sequencer is further configured to:
in the first read operation, store third data read from the second memory cell in the first latch circuit;
in the second read operation, store fourth data obtained by inverting data read from the first memory cell in the second latch circuit;
store the fourth data stored in the second latch circuit in the third latch circuit;
in the third read operation, store fifth data read from the first memory cell in the fourth latch circuit;
perform an OR operation of the fourth data and the fifth data to generate the second data, and store the second data in the second latch circuit; and
perform an AND operation of the third data and inversion data of the fifth data and perform an OR operation of the fourth data and a result of the AND operation to generate the first data, and store the first data in the third latch circuit.

14. The memory device according to claim 13, wherein upon receipt of a request to read the second data, the storage section outputs the second data stored in the second latch circuit to the controller.

15. The memory device according to claim 5, wherein the storage section further includes:
a first latch circuit;
a second latch circuit;
a third latch circuit;
a fourth latch circuit, and
the sequencer is further configured to:
in the first read operation, in which a first voltage is applied to the gate of the second memory cell, store third data read from the second memory cell in the first latch circuit;
in the second read operation, in which the first voltage is applied to a gate of the first memory cell, store fourth data read from the first memory cell in the second latch circuit;
store fifth data obtained by inverting the fourth data stored in the second latch circuit in the third latch circuit;
in the third read operation, in which the first voltage is applied to the gate of the first memory cell, store sixth data read from the first memory cell in the second latch circuit;
perform an AND operation of the third data and inversion data of the sixth data, perform an OR operation of the fifth data and a result of the AND operation, and store seventh data which is a result of the AND operation in the fourth latch circuit;
perform an OR operation of the fifth data and the sixth data, and store eighth data which is a result of the OR operation in the third latch circuit;
in the first read operation, in which a second voltage different from the first voltage is applied to the gate of the second memory cell, store ninth data read from the second memory cell in the first latch circuit;
in the second read operation, in which the second voltage is applied to the gate of the first memory cell, store tenth data read from the first memory cell in the second latch circuit;
perform an AND operation of the eighth data and inversion data of the tenth data, and store eleventh data which is a result of the AND operation in the third latch circuit;
perform an AND operation of the tenth data and inversion data of the ninth data, perform an OR operation of the seventh data and a result of the AND operation, and store twelfth data which is a result of the OR operation in the fourth latch circuit;
in the third read operation, in which the second voltage is applied to the gate of the first memory cell, store thirteenth data read from the first memory cell in the second latch circuit;
perform an OR operation of the eleventh data and the thirteenth data, and store the first data which is a result of the OR operation in the third latch circuit; and
perform an OR operation of the twelfth data and the thirteenth data, and store the second data which is a result of the OR operation in the fourth latch circuit.

16. The memory device according to claim 15, wherein upon receipt of a request to read the second data, the storage section outputs the second data stored in the third latch circuit to the controller.

* * * * *